United States Patent [19]

Carlson et al.

[11] Patent Number: 4,953,005
[45] Date of Patent: Aug. 28, 1990

[54] PACKAGING SYSTEM FOR STACKING INTEGRATED CIRCUITS

[75] Inventors: Randolph S. Carlson; Charles P. Chase, both of Carson City, Nev.

[73] Assignee: XOC Devices, Inc., Carson City, Nev.

[21] Appl. No.: 182,098

[22] Filed: Apr. 15, 1988

Related U.S. Application Data

[63] Continuation-in-part of Ser. No. 39,632, Apr. 17, 1987, Pat. No. 4,862,249.

[51] Int. Cl.⁵ .................... H01L 23/12; H01L 23/04; H01L 23/14
[52] U.S. Cl. ........................ 357/80; 357/75; 357/74
[58] Field of Search ............... 357/80, 75, 74; 174/52.4

[56] References Cited

U.S. PATENT DOCUMENTS

| | | | |
|---|---|---|---|
| 3,988,196 | 10/1976 | Wanesky | 156/541 |
| 3,992,236 | 11/1976 | Wanesky | 156/83 |
| 3,999,105 | 12/1976 | Archey et al. | |
| 4,023,997 | 5/1977 | Wanesky | 156/631 |
| 4,218,701 | 8/1980 | Shirasaki | 357/70 |
| 4,288,841 | 9/1981 | Gogal | 357/75 |
| 4,330,790 | 5/1982 | Burns | 357/70 |
| 4,394,712 | 7/1983 | Anthony | 361/411 |
| 4,398,235 | 8/1983 | Lutz et al. | 361/393 |
| 4,437,109 | 3/1984 | Anthony et al. | 361/411 |
| 4,457,976 | 7/1984 | Faith, Jr. et al. | 428/457 |
| 4,499,655 | 2/1985 | Anthony | 357/68 |
| 4,500,905 | 2/1985 | Shibata | 357/56 |
| 4,525,921 | 7/1985 | Carson et al. | 250/578 |
| 4,547,795 | 10/1985 | Wulff | 357/80 |
| 4,551,629 | 11/1985 | Carson et al. | 29/577 |
| 4,554,575 | 11/1985 | Lucas | 357/80 |
| 4,600,611 | 7/1986 | Clark | 357/70 |
| 4,613,891 | 9/1986 | Ng et al. | 357/68 |
| 4,618,763 | 10/1986 | Schmitz | 250/211 |
| 4,622,433 | 11/1986 | Frampton | 174/52.4 |
| 4,631,573 | 12/1986 | Sutrina | 357/82 |
| 4,661,837 | 4/1987 | Sono | 357/74 |
| 4,672,418 | 6/1987 | Moran et al. | 357/80 |
| 4,698,663 | 10/1987 | Sugimoto et al. | |

FOREIGN PATENT DOCUMENTS

| | | | |
|---|---|---|---|
| 58-219757 | 12/1983 | Japan | 357/75 |
| 59-61154 | 4/1984 | Japan | 357/70 |
| 60-165748 | 8/1985 | Japan | 357/70 |
| 60-254762 | 12/1985 | Japan | 357/75 |
| 61-63048 | 4/1986 | Japan | 357/75 |
| 61-75558 | 4/1986 | Japan | 357/75 |

OTHER PUBLICATIONS

Hamilton et al., "Thermal Stress Resistant Solder Reflow Chip Joints,"*IBM Technical Disclosure Bulletin*, vol. 14, No. 1, Jun. 1971, pp. 257-258.

*Primary Examiner*—Rolf Hille
*Assistant Examiner*—S. V. Clark
*Attorney, Agent, or Firm*—Knobbe, Martens, Olson & Bear

[57] ABSTRACT

Integrated circuit dies are mounted to the interconnection leads on frames of tape automatic bonding (TAB) film. Thereafter, each frame of the TAB film with the attached integrated circuit die is affixed to an electrically insulating, thermally conductive plate to form a sandwich structure. A number of sandwich structures are bonded together to form a stack of sandwiches. The interconnection leads of each sandwich in the stack are selectively electrically connected to the interconnection leads of other sandwiches in the stack to form a system of electrically interconnected integrated circuits. The system is compact and has short interconnection paths between integrated circuits so that the propagation delays of signals between integrated circuits are minimized.

39 Claims, 16 Drawing Sheets

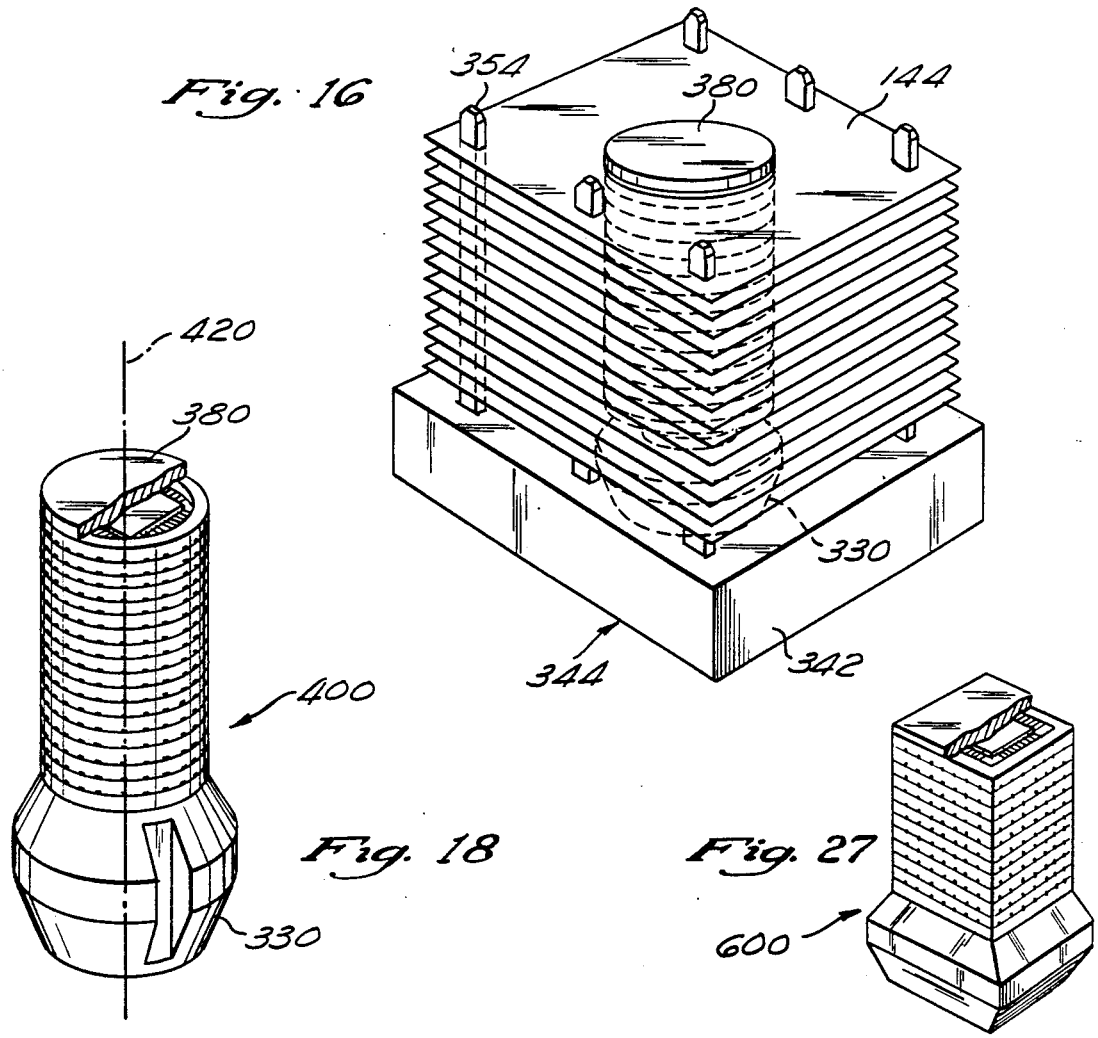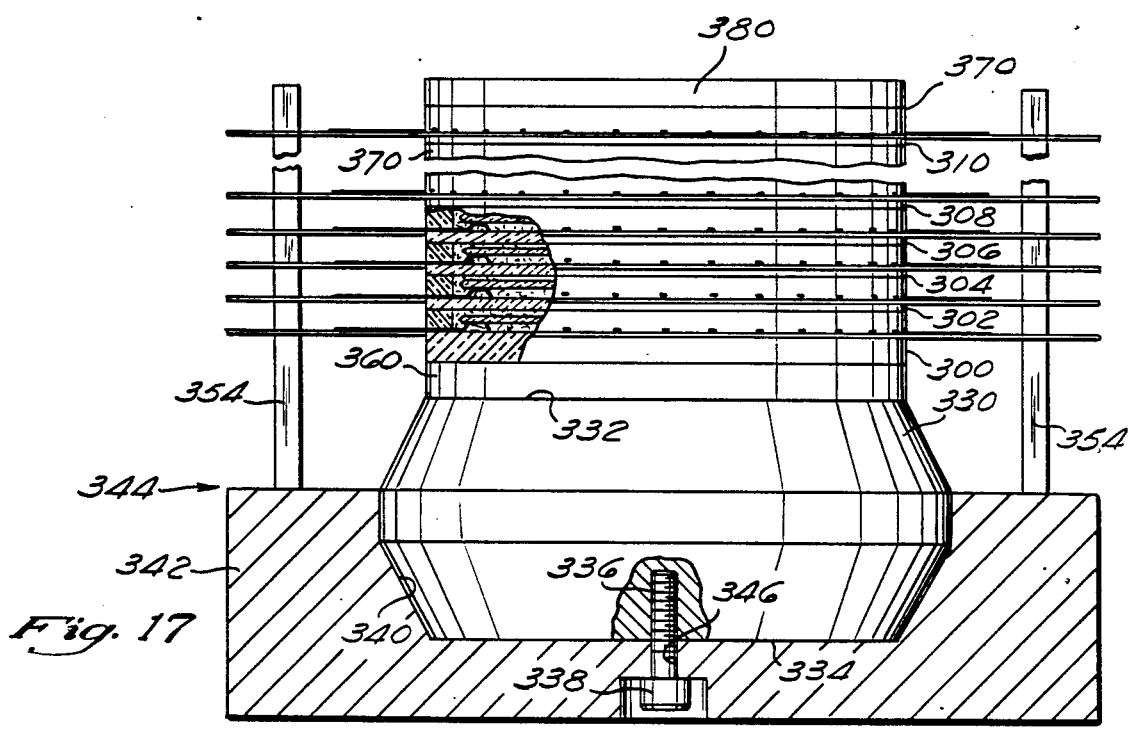

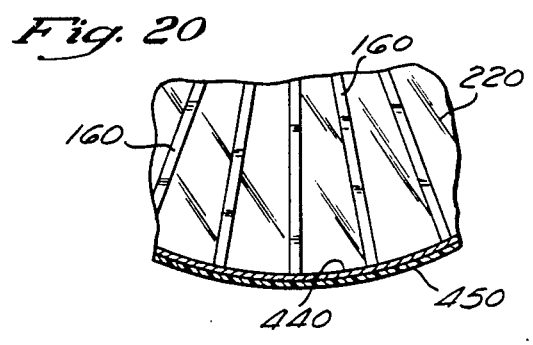
Fig. 20
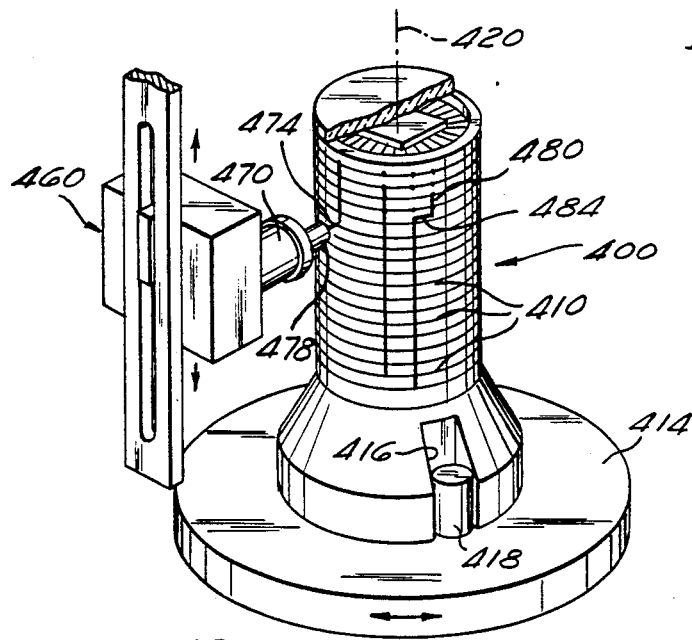
Fig. 19
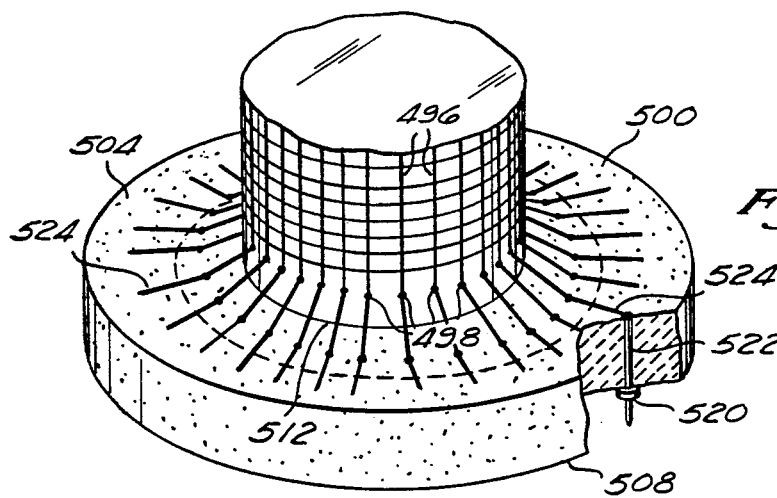
Fig. 22
Fig. 21
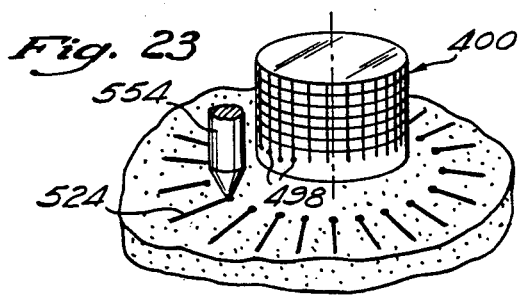
Fig. 23
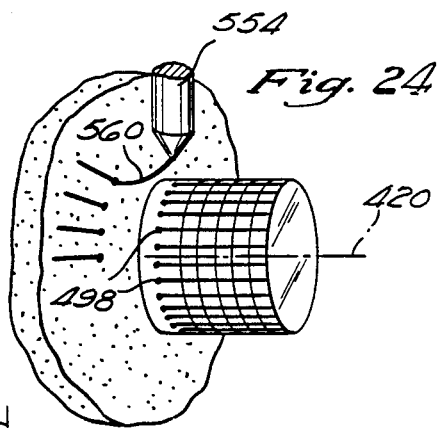
Fig. 24
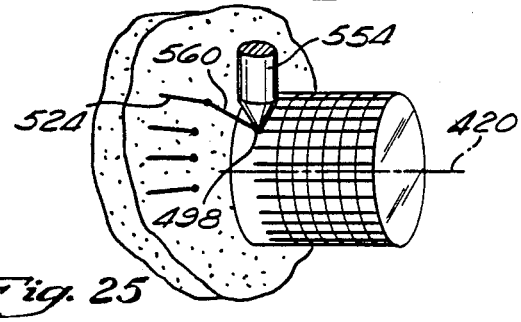
Fig. 25
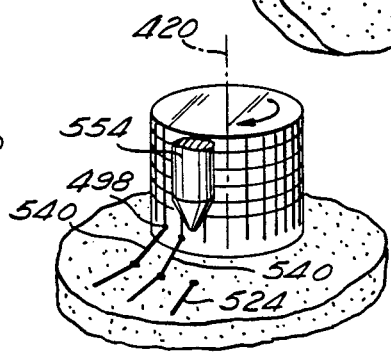
Fig. 26

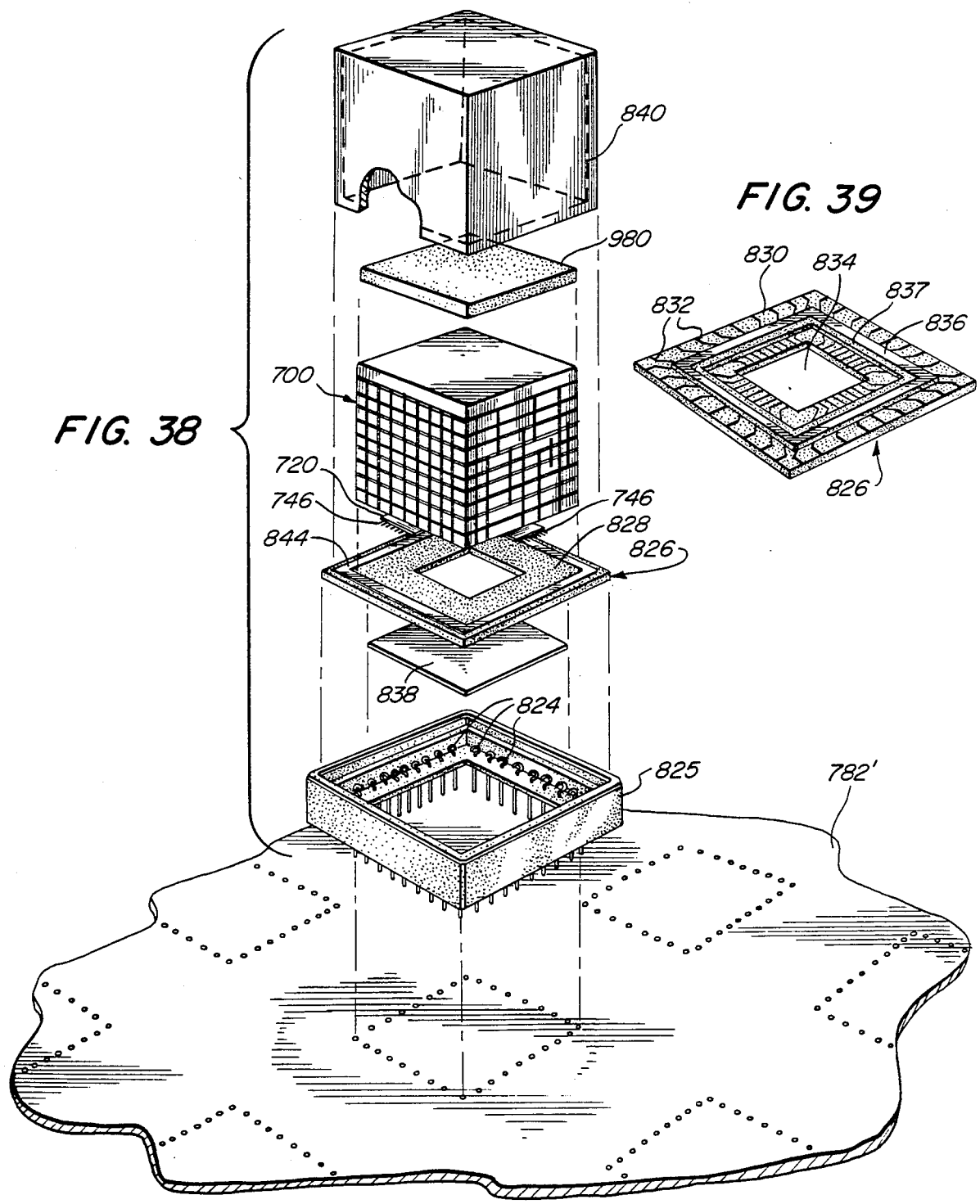

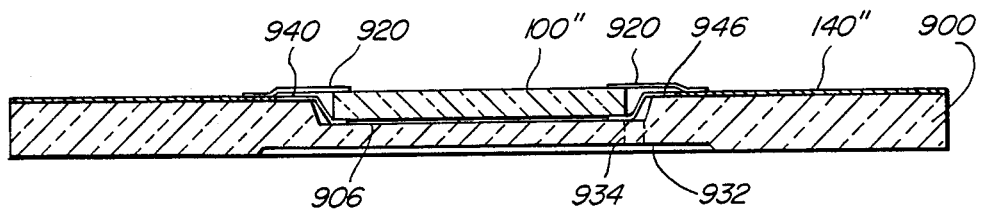
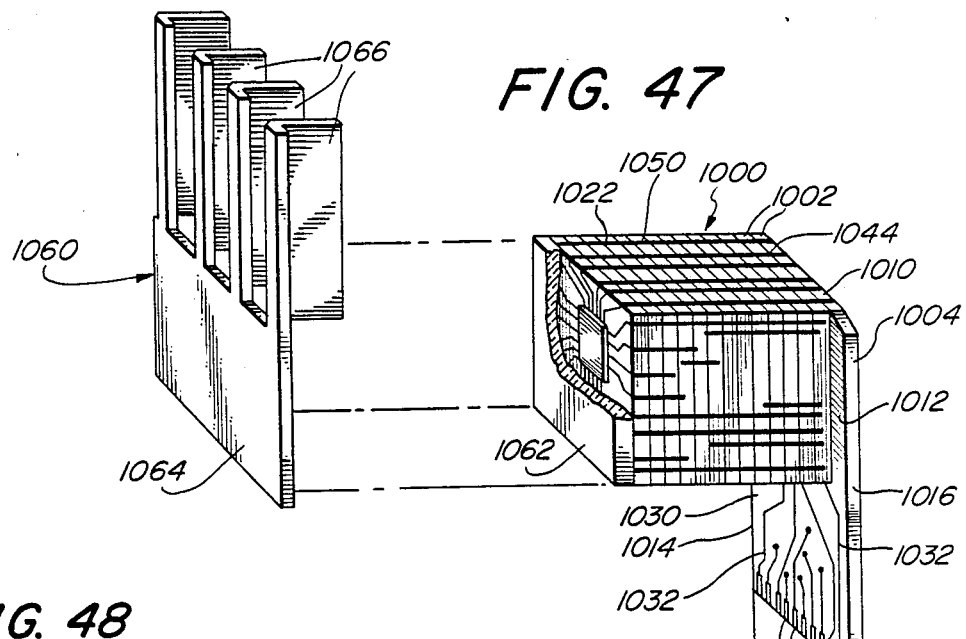
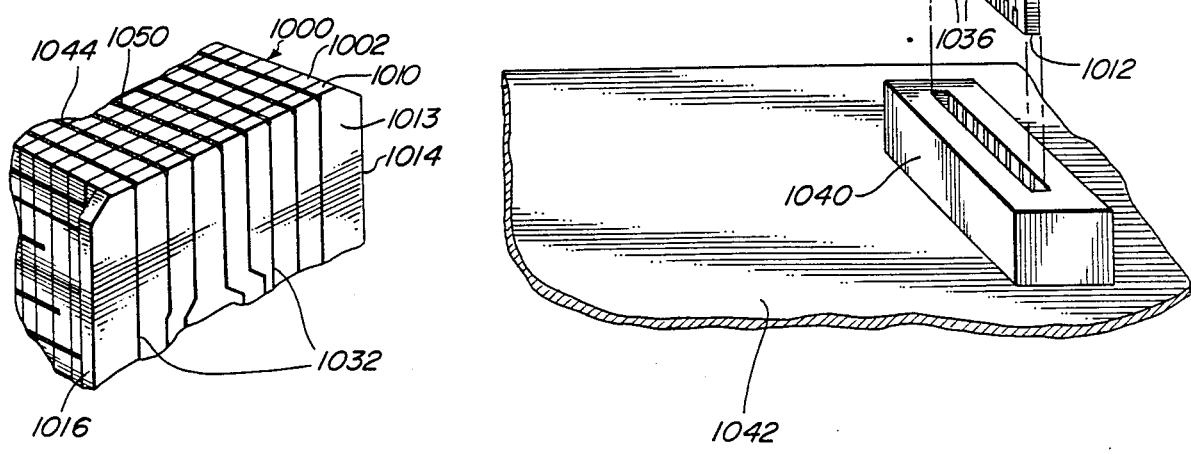

PACKAGING SYSTEM FOR STACKING INTEGRATED CIRCUITS

RELATED APPLICATION

This application is a continuation-in-part of U.S. patent application Ser. No. 039,632, filed on Apr. 17, 1987, now U.S. Pat No. 4,862,249 and assigned to the assignee of this application.

BACKGROUND OF THE INVENTION

1. Field of the Invention

The present invention is related to integrated circuits, and, in particular, is related to the packaging of integrated circuits so that a large quantity of integrated circuits can be physically located on the surface of a printed circuit board, or the like.

2. Description of the Related Art

The continuing advances in electronics technology, and in particular the technology related to integrated circuits, provide a steady improvement in the cost and performance of electronic circuits, particularly in the digital electronics and computer related fields. The complexity of integrated circuits has increased substantially in the years since such circuits were first developed and it is not unusual for a single integrated circuit to include all the circuit elements previously provided by a relatively large number of integrated circuits only a few years ago. Furthermore, the operational speeds of integrated circuits are also being improved both by using different technologies and by using smaller gates and shorter interconnections between gates to reduce propagation times.

Notwithstanding the increases in complexities and speeds of the integrated circuits, there continues to be a need to interconnect a large number of integrated circuits together to provide a complete system. For example, an exemplary computer system includes one or more processing elements (e.g., microprocessors), a plurality of memory circuits, device controller circuits, and input and output buffer circuits. These circuits are typically packaged in carriers, such as dual-in-line packages, flat packages, ceramic chip carriers, or the like. The carriers are typically interconnected on a printed circuit board, or the like. Although the speeds and circuit densities of the integrated circuits have increased substantially, much of the improvement is given up when conventional circuit packages on conventional planar circuit boards are used. The space required for the package material and the space required for the interconnection wiring between the integrated circuit carriers occupies a substantial portion of the board space. In addition, delays in the propagation of signals through the lengths of the interconnection wiring can be a significant portion of the signal propagation time. Thus, there are many disadvantages to the conventional combination of integrated circuit packages and printed circuit boards.

The foregoing problems have been recognized in some applications and attempts have been made to increase the packing density of integrated circuit elements. For example, there are hybrid circuit packages that include at least two integrated circuits in the same chip carrier. This technique continues to utilize the concept of mounting the integrated circuit dies in the same plane.

Other techniques have been developed wherein the integrated circuits are stacked vertically (i.e., normal to the plane of the active surfaces of the integrated circuit dies). For example, U.S. Pat. No. 4,398,235 illustrates the vertical stacking of dual-in-line packages. U.S. Pat. No. 4,288,891 illustrates a system of two integrated circuit dies in a double-cavity chip carrier that requires an interposed interconnection layer between the dies. U.S. Pat. No. 4,525,921 illustrates a system for packaging integrated circuit dies in the same package wherein the die is modified by etching a portion of the die to expose a portion of the metallization layer of the die. U.S. Pat. No. 3,999,105 illustrates a package for stacking semiconductor wafers.

A need continues to exist for a system of packaging a plurality of integrated circuits in a single package to achieve high packing density and using a minimum of printed circuit board space.

SUMMARY OF THE PRESENT INVENTION

One aspect of the present invention is an apparatus for interconnecting a plurality of integrated circuits. The apparatus is characterized by a stack having a top surface, a bottom surface and a sidewall. The stack comprises a plurality of stacked sandwiched structures. Each sandwiched structure of at least a portion of the plurality of sandwiches structures includes an integrated circuit die that has a plurality of bonding pads on one surface. The surface has an outer periphery, a first plurality of electrical conductors that are electrically and mechanically bonded to the bonding pads of the integrated circuit die and a first electrically insulating plate that is adhesively bonded to the integrated circuit die. The insulating plate is advantageously thermally conductive and, in preferred embodiments is sapphire. The first electrical insulating plate has an outer periphery with dimensions selected so that the outer periphery of the first electrically insulating plate extends beyond the outer periphery of the surface of the integrated circuit, and so that an exposed portion of each of the first plurality of electrical conductors extends beyond the outer periphery of the first electrically insulating plate. The stack further includes a second plurality of electrical conductors that electrically interconnect the exposed portions of the first plurality of electrical conductors of one of the stacked sandwiched structures with the exposed portions of the first plurality of electrical conductors of others of the stacked sandwiched structures. The first electrically insulating plate may be circular, rectangular or square.

In preferred embodiments of the apparatus, at least one of the sandwiched structures further includes a second electrically insulating plate having a centrally disposed cavity therein. The second electrically insulating plate is positioned on the first plurality of electrical conductors so that the first plurality of electrical conductors are positioned between the second electrically insulating plate and the first electrically insulating plate. Preferably, the integrated circuit die is positioned within the centrally disposed cavity of the second electrically insulating plate. Also preferably, the second electrically insulating plate is thermally conductive and, in preferred embodiments, comprises sapphire. The first and second electrically insulating plates are advantageously circular.

Preferably, the first plurality of electrical conductors of each of the sandwiched structures are formed as a pattern on a frame of tape automatic bonding (TAB) film. Each frame of the TAB film includes a plurality of sprocket holes that are used to align the plurality of sandwiched structures when the sandwiched structures are being stacked.

In preferred embodiments of the invention, the plurality of stacked sandwiched structures are bonded together with a light-curable adhesive, the sprocket holes serving to align the sandwiched structures until the adhesive is cured.

In preferred embodiments of the apparatus, the second plurality of electrical conductors that interconnect the exposed portions of the first plurality of electrical conductors of the sandwiched structures comprise a layer of metal that has portions of the metal removed to form the second plurality of electrical conductors.

According to the invention in another aspect, the second plurality of electrical conductors comprise a plurality of grooves formed in at least a portion of the sidewall of the stack. The grooves advantageously intersect and interconnect the exposed portions of the first plurality of the sandwiched structures. Preferably, the plurality of grooves comprise a layer of conductive material for selectively electrically interconnecting the exposed portions of the first plurality of the sandwiched structures. This conductive material may comprise gold wire, a ceramic paste, a gold paste or a superconductive material.

In a preferred embodiment, the plurality of grooves comprise a layer of nonconductive material, preferably an epoxy, for selectively insulating the exposed portions of the first plurality of the sandwiched structures. The plurality of grooves preferably form a trench within the exposed portions at the intersection of the exposed portions and of the plurality of grooves.

According to the present invention in another aspect, the exposed portions interconnected by the second plurality of electrical conductors comprise terminal conductors for interconnection with a connector of an external circuitry. The apparatus of the present invention further advantageously includes a third plurality of electrical conductors for electrically interconnecting the terminal conductors with the connector of the external circuitry. The third plurality of electrical conductors may comprise a plurality of wires bonded to the terminal conductors and the connector of the external circuitry.

The third plurality of electrical conductors may also be formed as a pattern on a frame of a TAB tape portion. This TAB tape portion preferably comprises a proximal region and a distal region. The proximal region preferentially comprises a fourth plurality of electrical conductors, whereas the distal region ideally comprises a fifth plurality of electrical conductors. The fourth and the fifth pluralities of electrical conductors are typically interconnected on the TAB tape portion. The proximal region is preferably positioned proximate to the bottom surface of the stack so that the fourth plurality of electrical conductors are in electrical contact with the terminal conductors, the fifth plurality of electrical conductors of the distal region further being in electrical contact with the connector of the external circuitry.

It is advantageous that the apparatus of the present invention comprises a third insulating plate having an aperture therein. The aperture has at least an inner edge. The third insulating plate is preferably positioned on the bottom surface of the stack so that the fourth plurality of electrical conductors are positioned between the bottom surface of the stack and the third insulating plate, the distal region being substantially folded around the inner edge of the aperture so that the fifth plurality of electrical conductors extend outwardly from the aperture. The fifth plurality of electrical conductors are preferably interconnected with the connector of the external circuitry by means of a pressure plate or by means of an interconnect plate.

In alternative preferred embodiments of the present invention, each sandwiched structure of at least a portion of the plurality of sandwiches structures comprises a plurality of integrated circuit dies, at least one of the plurality of integrated circuit dies in a sandwiched structure being electrically interconnected with another one of the plurality of integrated circuit dies in the sandwiched structure. Preferably, the first plurality of electrical conductors in the sandwiched structure are formed as a pattern on a frame of tape automatic bonding (TAB) film, with the TAB film being bonded to the plurality of integrated circuit dies.

The stack of the present invention is advantageously housed in a housing, preferably made of thermally conductive. Between the housing and the stack, it is preferable to interpose a member made of thermally conductive material for compensating for the thermal expansion differential between the housing and the stack.

According another aspect of the present invention, the second plurality of electrical conductors comprise the extremities of the exposed portions of the first plurality of electrical conductors. The extremities extend outwardly from and beyond at least a portion of the sidewall of the stack so that the extremities for one of the stacked sandwiched structures can be bent so as to overlap the extremities of an adjacent stacked sandwich structure in the stack, whereby the overlapped extremities establish an electrical connection between the sandwiched structure and the adjacent stacked sandwich structure.

The apparatus of the present invention may also comprise an extension plate secured to the bottom surface of the stack dimensioned so as to cover the bottom surface of the stack and to electrically interconnect the second plurality of electrical conductors with a connector of an external circuitry. It advantageously further comprises a heat sink mechanically coupled to at least one of the top and bottom surfaces of the stack.

According to the present invention in another aspect, there is disclosed an apparatus for packaging integrated circuits. The apparatus includes an integrated circuit die that has a plurality of bonding bonds on a first die surface. The apparatus is characterized by a first plurality of electrical conductors that are electrically connected to the bonding pads of the integrated circuit die so as to form a lead-to-lead connection. The apparatus is further characterized by a first plate of electrically insulating material, for example, sapphire, that has a first plate surface and a second plate surface, each having an outer periphery. The first plate surface is positioned proximate to the first die surface so that the plurality of electrical conductors are disposed between the first die surface and the first plate surface, with at least a portion of each of the electrical conductors exposed at the outer peripheries of the first and second plate surfaces. Preferably, the first plate surface is bonded to the first die surface. The first plate may be circular, square or rectangular and may comprise a metal plate coated with insulating material.

In certain embodiments of this aspect of the invention, the first plate surface has a raised central portion and an outer peripheral portion. The raised central portion is bonded to the first die surface with the outer peripheral portion proximate to but spaced apart from the plurality of electrical conductors.

In alternative embodiments of this aspect of the invention, the integrated circuit die has a second die surface that is opposite the first die surface, and the second die surface is positioned to be substantially parallel to the second plate surface. The second die surface is advantageously positioned to be substantially parallel to the second plate surface by grinding the second die surface.

In further alternative embodiments of this aspect of the invention, a second electrically insulating plate, preferably thermally conductive, is included. The second plate may advantageously be sapphire. It also has a cavity formed in it. It is positioned proximate to the first plate so that the plurality of electrical conductors is clamped between the first plate and the second plate and so that the integrated circuit die is positioned within the cavity of the second plate.

In certain preferred embodiments of the invention, the first and second plates are both circular. Preferably, the second plate has first and second substantially parallel surfaces and the first surface of the second plate is positioned in juxtaposition with the first surface of the first plate with the plurality of conductors therebetween. The second surface of the second plate positioned to be substantially parallel to the second surface of the first plate.

According to the invention in another aspect, the first plate has a first cavity formed in the first plate surface thereof. The integrated die is advantageously positioned within the first cavity of the first plate. The first plurality of electrical conductors may be bonded to the plurality of bonding pads or may be connected thereto by means of a second plurality of electrical conductors, preferably a plurality of compatible wires extending over the first cavity of the first plate. The capacitance of the lead-to-lead connection is thereby reduced as the medium surrounding the lead-to-lead connection, preferably air, is selected to have a low permittivity. The first plate may also comprise a second cavity formed in the second plate surface thereof and a vent hole for connecting the bottom surface of the first cavity to the second plate surface.

In particularly preferred embodiments of this aspect of the invention, the plurality of electrical conductors are mounted in a frame of tape automatic bonding (TAB) film. The frame of TAB film has a plurality of sprocket holes that provide alignment of the conductors with the bonding pads on the first die surface. The TAB film may comprise a plurality of layers.

In alternative embodiments of the present invention, the first plurality of electrical conductors may comprise a plurality of ceramic conductors positioned on the first plate, a plurality of metallic conductors sputtered on the first plate. The first plurality of electrical conductors may also comprise a polymeric conductive material or a superconductive material.

Another aspect of the present invention is a method of packaging integrated circuits. The method is characterized by the steps of connecting a first plurality of electrical conductors to a plurality of bonding pads on an integrated circuit die having first and second die surfaces; and mounting the integrated circuit die to a first plate of electrically insulating material having first and second plate surfaces, so that the first plate surface is proximate to the first die surface and so that at least a portion of the first plurality of electrical conductors is exposed at the periphery of the first plate.

The mounting step advantageously comprises the step of positioning the circuit die within a first cavity formed in the first surface of the first plate, the second die surface being substantially flush with the first surface of the first plate.

Preferably, the connecting step comprises the step of bonding a second plurality of electrical conductors between the bonding pads and the first plurality of electrical conductors and the step of interposing at least a portion of the first plurality of electrical conductors between the first surface of the first plate and the first die surface.

According to the present invention in another aspect, there is disclosed a method of manufacturing a system of integrated circuits. The method is characterized by the step of forming a plurality of integrated circuit sandwiches. The forming step for each integrated circuit sandwich of at least a portion of the plurality of integrated circuit sandwiches includes the steps of connecting a first plurality of electrical conductors to a plurality of bonding pads on a first surface of an integrated circuit die and mounting the integrated circuit die to a first plate of electrically insulating material, such as sapphire, to the integrated circuit die. The first plate has first and second plate surfaces and a periphery, and is mounted to the die so that the first plate surface is proximate to the first die surface and so that at least a portion of the first plurality of electrical conductors is exposed at the periphery of the first plate. The method further includes the step of aligning the plurality of integrated circuit sandwiches so that the exposed portions of the first plurality of electrical conductors of each sandwich are aligned and form a stack. The method is further characterized by the step of interconnecting the exposed portions of the first plurality of electrical conductors.

In accordance with the present invention to another aspect, the step of interconnecting comprises the step of forming a plurality of grooves in at least a portion of the sidewall of the stack in order to selectively interconnect the exposed portions of the first plurality of electrical conductors of the sandwiches and the step of filling the plurality of grooves with a conductive material.

Preferably, the method comprises the step of connecting the interconnected exposed portions of the first plurality of electrical conductors with a connector of an external circuitry. Advantageously, the connecting step comprises the steps of positioning a frame of tape automatic bonding tape portion having a proximal region and a distal region on a second electrically insulating plate having upper and lower surfaces and a central aperture, the proximal region comprising a second plurality of electrical conductors and the distal region comprising a third plurality of electrical conductors, the second and the third pluralities of electrical conductors being electrically interconnected on the TAB tape portion; the step of mounting the proximal region of the TAB tape portion between the bottom surface of the stack and the upper surface of the second insulating plate so that the second plurality of electrical conductors are in electrical contact with the interconnected exposed portions; and the step of bonding the third plurality of electrical conductors of the distal region to the connector of the external circuitry so that the third plurality of electrical conductors is in electrical contact with the connector of the external circuitry so as to form an external electrical connection, the third plurality of electrical conductors extending outwardly from the stack through the aperture of the second insulating plate.

According to the present invention in another aspect, the aligning step comprises the steps of stacking the integrated circuit sandwiches while maintaining the structures separated from another; and interposing bonding material between the integrated circuit sandwiches; encasing the stack in a housing hermetically sealed around the stack; and bonding the integrated circuit sandwiches in a vacuum. The method preferably further comprises the steps of removing portions of the exposed portions of the first plurality of electrical conductors that extend beyond the peripheries of the first plates of the sandwiches so that the exposed portions of the first plurality of electrical conductors substantially protrude from the peripheries of the first plate of the each sandwich; and bending the protruding exposed portion of the each sandwich so that the protruding exposed portion for each stacked sandwich overlaps the protruding exposed portion of an adjacent stacked sandwich, whereby the protruding exposed portions establish an electrical connection between the sandwiches.

BRIEF DESCRIPTION OF THE DRAWINGS

FIG. 7b is an enlarged cross-sectional view of a portion of the integrated circuit die/ TAB film/ insulating plate sandwich of FIG. 7a as defined by the dashed lines 7b in FIG. 7a.

FIG. 16 is a perspective view of one embodiment of a system of integrated circuit die/ TAB film/ insulating plate/ clamping ring sandwiches built in accordance with the present invention showing an alignment fixture used to precisely align the plural sandwiches until the bonding material has cured.

FIG. 17 is an elevation view of the system of FIG. 17 showing additional details of the construction of the system in partial cross-sectional views.

FIG. 18 is a perspective view of the system of FIGS. 16 and 17 showing the completed assembly of the plurality of sandwiches with the excess TAB film removed to the boundaries of the circular flat plates and clamping rings of each sandwich to form a cylinder of the sandwiches.

FIG. 19 is a perspective view of the sandwich cylinder of FIG. 18 to which a metallic layer and a layer of light-sensitive etchant-resistant material has been added, and showing a controlled light source for exposing the etchant-resistant material to form an interconnection pattern thereon.

FIG. 20 is a partial cross-sectional view of the system of FIG. 19 taken along the lines 20—20 in FIG. 19, showing additional details of the metallic layer and the etchant-resistant material prior to etching.

FIG. 21 is a perspective view of the system of FIGS. 18-20 showing an exemplary pattern of electrically conductive leads interconnecting the exposed ends of the TAB film conductors, and also showing a ceramic base plate for supporting the sandwich cylinder.

FIG. 22 is a partial enlarged view of the system of FIG. 21 showing additional details of the etched metallic conductors that interconnect the exposed ends of the TAB film conductors on the perimeter of the sandwich cylinder.

FIGS. 23–26 are partial perspective views of the present invention illustrating the steps of interconnecting the conductors on the sandwich cylinder with the conductors on the ceramic base plate.

FIG. 27 is a perspective view of an alternative embodiment comprising a stack of rectangular (e.g., square) sandwiches.

FIG. 38 is an exploded view in perspective of an alternative embodiment of the stack of integrated circuit die sandwiches of the present invention incorporating the interconnection sandwich structure of FIG. 33 in connection with a conventional circuit board and including a housing.

FIG. 39 is perspective view of the bottom side of the interconnect plate used in the embodiment of FIG. 38 to interconnect the interconnection fingers of the stack with the connector pins of an external circuit board assembly, showing the raised ceramic ridge and the metallized sealing ring thereon.

FIG. 44 is across-sectional view of an alternative embodiment of a die sandwich structure of the present invention wherein one at least of the TAB interconnection leads extends into the cavity of the insulating plate of FIG. 41.

FIG. 45 is a perspective view of an exemplary stack of integrated circuit die sandwiches built showing an alignment fixture operating in a vacuum.

FIG. 47 is a perspective exploded view of an alternative preferred embodiment of the present invention utilizing an input/output plate for interconnecting the stack with the connector of a conventional card and showing a heat sink connected to the stack.

FIG. 48 is an enlarged perspective view of the interconnection interface between one side of the stack and the input/output plate of FIG. 47.

DETAILED DESCRIPTION OF THE PREFERRED EMBODIMENT

Figure 1:
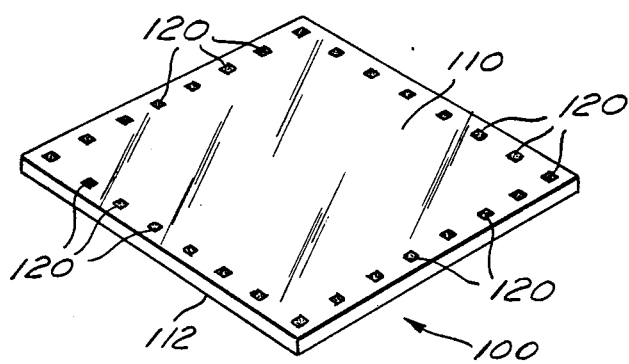
FIG. 1 is a perspective view of an exemplary integrated circuit die.

FIG. 1 illustrates an exemplary integrated circuit die 100, sometimes referred to as an integrated circuit "chip." A typical die 100 is formed during an integrated circuit manufacturing process in which a large number of integrated circuit dies are formed on a wafer of silicon, or other material. Thereafter, the wafer is scribed and cut (or broken) to provide a number of individual dies, such as the die 100, each of which typically has rectangular dimensions. The die 100 has a top planar surface 110 and has a bottom planar surface 112 that is generally parallel to the top planar surface 100. The integrated circuit die 100 has multiple layers of material that form the active components of the circuitry of the die 100. Typically, the top planar surface 110 is a passivation layer over a top metallization layer. The top metallization layer provides the final interconnections between the active portions of the integrated circuit. (As used herein, the "top surface" of the integrated circuit die 100 refers to the passivated metallization surface 110 and the "bottom surface" refers to the opposite parallel surface 112, irrespective of a particular orientation of the integrated circuit die.) At least a portion of the final interconnections connect the active portions of the integrated circuit to a plurality of bonding pads 120. The bonding pads 120 are exposed through the passivation layer and provide a relatively large area of metallization to which external conductors can be connected by ultrasonic welding, compression bonding, or other conventional means, to provide for connection of electrical conductors to the die 100, so that electrical signals and power can be communicated to and from the die 100. The number of bonding pads 120 depends upon the electrical configuration of the circuitry of the die 100, and, typically, a substantial amount of design effort is expended in order to reduce the number of bonding pads 120 required for the circuitry. Thus, although the integrated circuit die 100 is shown with 28 bonding pads 120, one will understand that many integrated circuits have considerably more bonding pads (for example, in excess of 200). Although shown as a single row of bonding pads 120 around the periphery of the integrated circuit die 100, it should be understood that integrated circuits having a large number of bonding pads 120 often have multiple rows of bonding pads 120.

The sizes of integrated circuit dies vary in accordance with the amount of circuitry that the die has and in accordance with the process that produces the integrated circuit. For example, the top surface 110 can be less than 0.1 inch on each side for a small scale integrated circuit, and can be greater than 0.4 inch on each side for a very large scale integrated (VLSI) circuit.

Figure 2:
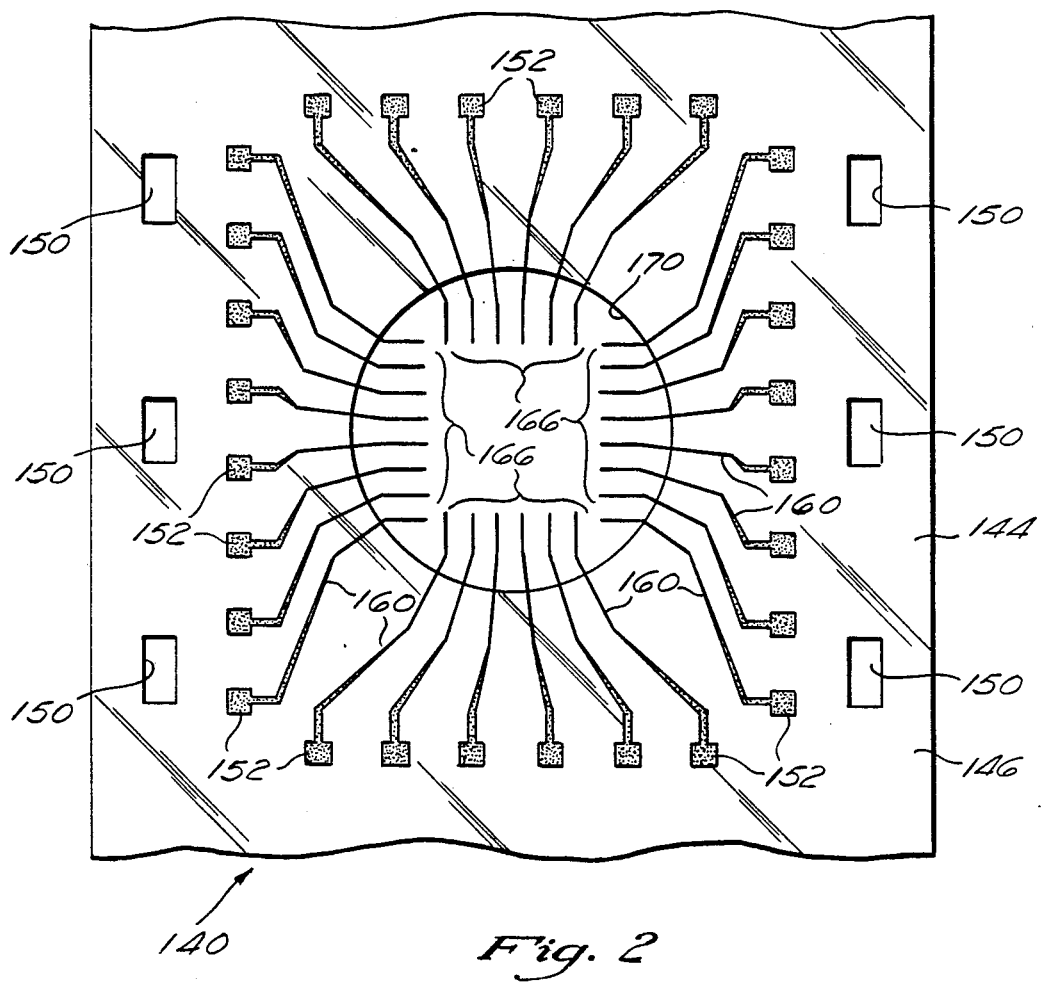
FIG. 2 is a plan view of a frame of an exemplary tape automated bonding (TAB) film having a plurality of metallic conductors thereon that are used to provide electrical interconnection to the integrated circuit die of FIG. 1.

FIG. 2 illustrates an exemplary frame of an exemplary tape automated bonding (TAB) film 140 that is used in the present invention to electrically interconnect the bonding pads 120 of the integrated circuit die 100 of FIG. 1. As illustrated, the TAB film 140 includes an insulating film substrate 144 that has a top surface 146 and a bottom surface 148 (see FIG. 3). For example, the substrate 144 may be a polyimide film, or the like. The substrate 144 includes a plurality of evenly spaced sprocket holes 150 along two edges thereof. The sprocket holes 150 are used to accurately advance and position the film substrate 144 during the production of the TAB tape 140 and when applying the TAB tape 140 to an integrated circuit, as will be described hereinafter. The TAB tape 140 includes an interconnection pattern that is applied to the top surface 146 of the insulating substrate 144. The interconnection pattern comprises a plurality of terminal pads 152 that are connected to a corresponding plurality of circuit paths or interconnection leads 160. The interconnection leads 160 converge towards the center of the frame of the TAB film 140 and are terminated in fingers or ends 166. The fingers 166 are positioned and spaced apart to correspond to the positions and spacing of the bonding pads 120 of the integrated circuit die 100.

Typically, the interconnection pattern, comprising the terminal pads 152, the interconnection leads 160 and the fingers 166, is formed on the insulating substrate by photolithographic techniques that provide for accurate alignment of the fingers 166 with respect to the sprocket holes 150. For example, the interconnection pattern can be formed by bonding a layer of copper, or other conductive material, to the top surface 146 of the insulating substrate 144 and then etching away the conductive material until only the desired pattern remains. Preferably, the portion of the insulating substrate 144 proximate to the fingers 166 is removed after forming the fingers 166 so that the fingers 166 are exposed from both sides of the TAB film 140. The boundary of the removed portion is represented by the phantom lines 170 in FIG. 2. The TAB film 140 comprises a plurality of frames of interconnecting patterns, such as the pattern illustrated in FIG. 2. The interconnection leads 160 and the fingers 166 are precisely located with respect to the locations of the sprocket holes 150 so that when the sprocket holes 150 are positioned in a known position, the locations of the interconnection leads 160 and the fingers 166 are also precisely known.

Figure 3:
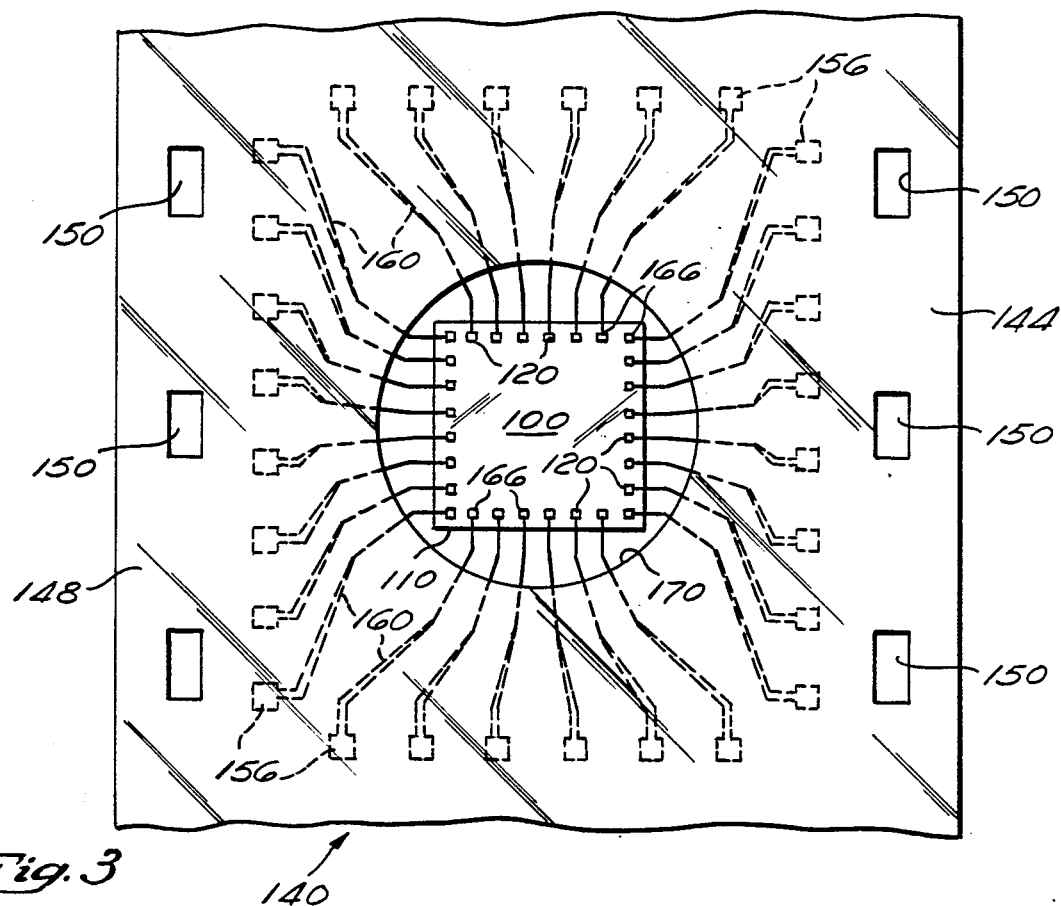
FIG. 3 is a plan view showing the integrated circuit die of FIG. 1 positioned on and electrically connected to the TAB film of FIG. 2.

The number of fingers 166 that comprise the interconnection pattern of the TAB film 140 corresponds to the number of bonding pads of the integrated circuit to which the TAB film 140 is to be applied. For example, if the TAB tape 140 of FIG. 2 is intended for the integrated circuit die 100 of FIG. 1, having 28 bonding pads 120, the interconnection pattern of the TAB tape 140 of FIG. 2 includes 28 interconnection leads or circuit paths 160 that have the fingers 166 spaced in accordance with the spacing of the bonding pads 120. This is illustrated in FIG. 3 wherein the TAB film 140 is shown overlying the top metallization surface 120 of the integrated circuit die 100, with the top surface 146 of the film 140 facing toward the top surface 110 of the integrated circuit die 100. As illustrated, the fingers 166 of the interconnection leads 160 are aligned with the bonding pads 120. The alignment of the bonding pads 120 and the fingers 166 is accomplished by utilizing the sprocket holes 150 of the TAB film 140 to accurately position the TAB film 140 so that the fingers 166 are aligned with the bonding pads 120. The TAB film 140 is available with raised bumps on the fingers 166 to increase the contact between the bonding pads 120 and the fingers 166 for some applications. (See, for example, FIGS. 5 and 6.) After the fingers 166 of the TAB film 140 are properly aligned with the bonding pads 120 of the integrated circuit die 100, the fingers 166 and the bonding pads 120 are permanently electrically interconnected by ultrasonic welding, reflow soldering, compression bonding, or other conventional methods.

TAB film, such as the TAB film 140 described herein, is available from a number of sources, such as Electronics Products Division/3M, Building 502, P.O. Box 2963, Austin, Tex. 78769-2963. Further information regarding TAB film can be obtained from 3M at the above address. The use of TAB film to interconnect integrated circuits is also illustrated in U.S. Pat. No. 4,330,790 to Carmen Burns, issued on May 18, 1982. The equipment required to interconnect the TAB film 140 to the integrated circuit die 100 is commercially available equipment and will not be described herein. Briefly, the TAB film 140 is advanced to known locations in the equipment using the sprocket holes 150 to precisely position the fingers 166 of the TAB film 140 and an integrated circuit die, such as the die 100, is bonded to the fingers 166 in each frame of the TAB film 140.

Although not illustrated herein, TAB film, such as the TAB film 140, is obtainable with two or more electrically isolated layers of interconnection leads to increase the number of interconnections that can be provided in a given area. For example, an integrated circuit die (not shown) may have multiple rows of bonding pads on the metallization surface, for example, an inner row and an outer row. The interconnection leads on one layer of the TAB film may be used to interconnect the outer row of the bonding pads and the interconnection leads on another layer of the TAB film may be used to interconnect the bonding pads on the inner row.

TAB film is also available for interconnecting more than one integrated circuit die and for interconnecting integrated circuits and discrete components, such as resistors, capacitors, and the like. Such TAB film is advantageously used in hybrid packages, for example.

One of the advantages of the present invention is that the bonding pads 120 of the integrated circuit die 100 are bonded to the fingers 166 of the interconnection leads 160 of the TAB film 140 in a conventional manner. Furthermore, there is no need to modify the integrated circuit die 100 in order to incorporate it into the present invention. Thus, standard off-the-shelf integrated circuit dies can be advantageously used as part of the present invention.

Although TAB film has been advantageously used to more fully automate the fabrication of integrated circuits, there are a number of problems associated with the handling of the integrated circuit die/ TAB film combination described above. One such problem is related to the size of the interconnection leads 160 on the TAB film 140. Since the interconnection leads 160 are necessarily very small, the leads 160 are also very fragile. In addition, the bonded interconnection between each interconnection lead 160 and the corresponding bonding pad 120 is relatively weak. Thus, it is not unusual for one of the interconnection leads 160 to break or for one of the bonded interconnections to disconnect during the testing of the integrated circuits or during the installation of the integrated circuit die/ TAB film combination into a larger system, such as a printed circuit board. One aspect of the present invention, described below, is to substantially reduce or eliminate such failures.

As set forth above, the integrated circuit die 100 is originally part of a wafer (not shown) having a large number of dies. The die 100 is separated from the wafer by scribing the wafer and then cutting or breaking the wafer at the scribe lines to separate the dies. The dies formed in this manner tend to be dimensionally inconsistent and thus the edges of the integrated circuit die 100 cannot be readily used as a reference for mounting the integrated circuit die 100 as part of a system of integrated circuits. Another aspect of the present invention is to provide dimensional stability for the integrated circuit die 100.

Figure 4:
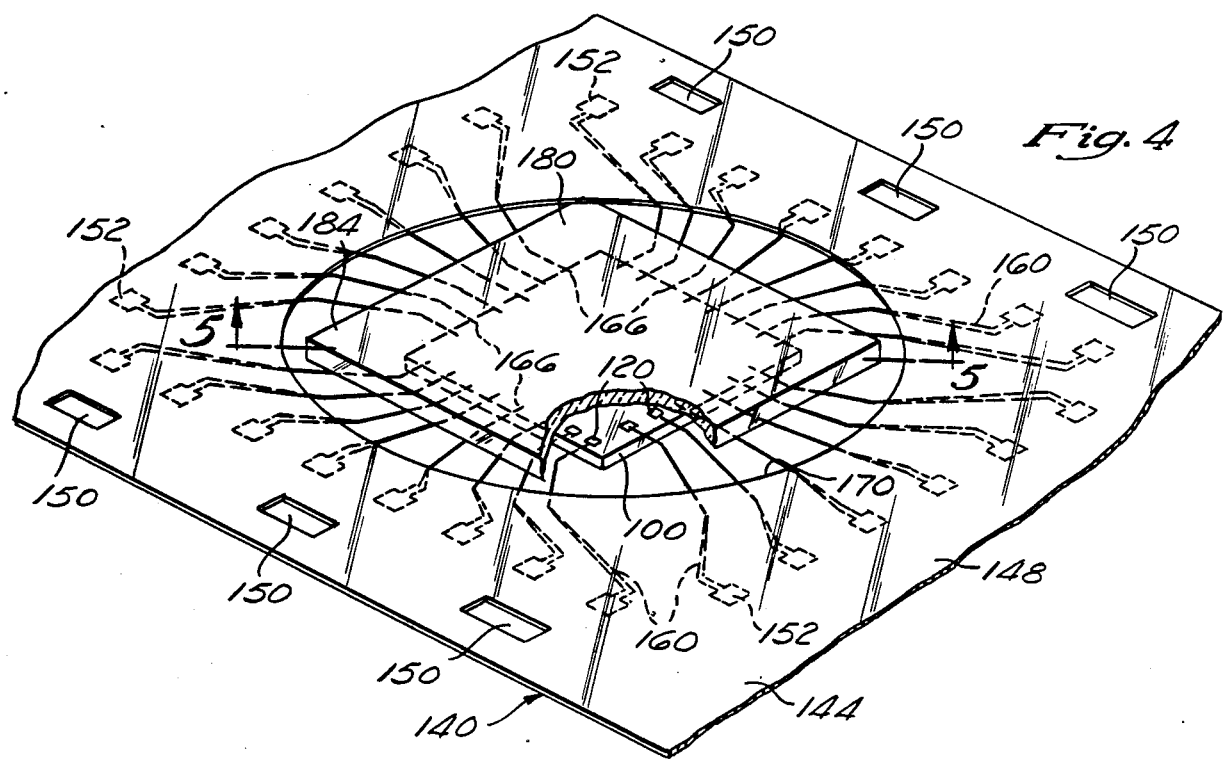
FIG. 4 is a perspective view of the integrated circuit die and TAB film combination of FIG. 3, further including a flat insulating plate bonded to the integrated circuit to sandwich the electrical conductors of the TAB film between the plate and the die.
Figure 5:
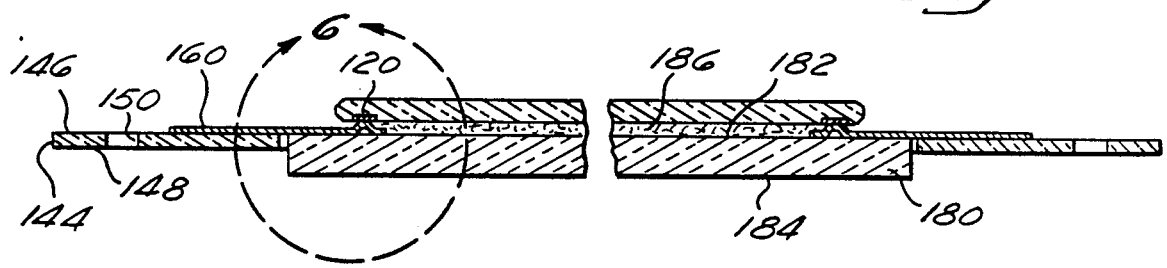
FIG. 5 is a cross-sectional view of the integrated circuit die/ TAB film/ insulating plate sandwich of FIG. 4 taken along the lines 5—5 in FIG. 4.
Figure 6:
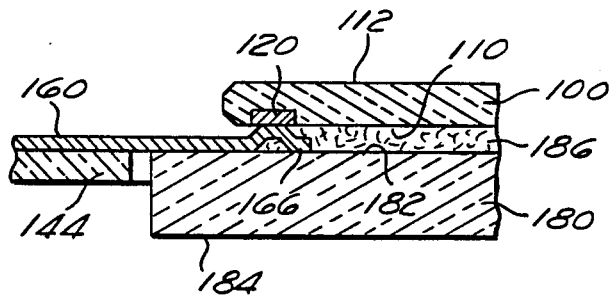
FIG. 6 is an enlarged cross-sectional view of a portion of the integrated circuit die/ TAB film/ insulating plate sandwich of FIGS. 4 and 5 as defined by the dashed line 6 in FIG. 5..

The present invention is illustrated beginning with FIG. 4. As illustrated in FIG. 4, after the fingers 166 of the interconnection pattern on the frame of TAB film 140 are bonded to the bonding pads 120 of the integrated circuit die 100, a flat, electrically insulating, thermally conductive plate 180, having a top surface 182 and a substantially parallel bottom surface 184 is applied to the top metallization surface 110 of the integrated circuit die 100 and to the interconnection leads 160 of the TAB film 140, so that the top surface 182 of the insulating plate 180 is proximate to and substantially parallel with the top surface 110 of the integrated circuit die 100. The insulating plate 180 is positioned so that the interconnection leads 160 and the fingers 166 are sandwiched between the insulating plate 180 and the integrated circuit die 100. The positioning of the insulating plate 180 with respect to the die 100 and the film 140 is illustrated in FIGS. 4, 5 and 6. The insulating plate 180 is positioned so that the center of the plate 180 is substantially centered with respect to the center of the pattern of interconnection leads 160 that are connected to the integrated circuit die 100. This is accomplished by using the sprocket holes 150 as a reference. Since the sprocket holes 150 are precisely located with respect to the pattern of interconnection leads 160, the insulating plate 160 can be positioned with respect to the position of the sprocket holes 150 and will thereby be accurately positioned with respect to the interconnection leads. As further illustrated in FIG. 4, the dimensions of the insulating plate 180 are selected to be greater than the dimensions of the integrated circuit die 100 so that the insulating plate 100 overlaps the integrated circuit die 100 in all directions. Thus, the outer periphery of the insulating plate 180 extends beyond the outer periphery of the integrated circuit die 100. Preferably, the dimensions of the insulating plate 180 are selected to be less than the dimensions of the removed portion of the insulating substrate 144, illustrated by the boundary lines 170 in FIG. 2, so that the insulating plate 180 contacts only the interconnection leads 160 and not the thicker insulating substrate 144. Thus, in this embodiment, the fingers 166 of the interconnection leads 160 are forced into good mechanical contact with the bonding pads 120 of the integrated circuit die 100. As illustrated, a portion of each interconnection leads 160 extends beyond the periphery of the flat insulating plate 180 and is therefore exposed.

Although illustrated as having rectangular dimensions, the flat insulating plate 180 can also be circular, as will be illustrated below for embodiment of FIGS. 9-15. In such cases, the diameter of the circular plate is selected to be greater than the longest diagonal of the integrated circuit die 100 so that the integrated circuit die 100 is entirely covered by the circular plate.

As illustrated above, the inclusion of the insulating plate 180 in combination with the integrated circuit die 100 effectively solves the problems described above. For example, the bonding material 186 and the insulating plate 160 secure the interconnection leads 160 in a fixed, rigid position with respect to the bonding pads 120 of the integrated circuit die 100. Thus, the fingers 166 cannot move with respect to the bonding pads 120 and therefore the possibility of breaking the bonded connection between the bonding pads 120 and the fingers 166 is substantially reduced or eliminated. Furthermore, the dimensions of the insulating plate 180 are advantageously precisely controlled so that the outer periphery of the insulating plate 180 can be used as a precise reference when the integrated circuit die/ TAB film/ insulating plate combination is incorporated into a system.

Preferably, the insulating plate 180 is bonded to the interconnection leads 160 of the TAB film 140 and to the integrated circuit die 100 using a bonding material 186. In the preferred embodiments of the present invention, the bonding material 186 is an ultraviolet light cured epoxy, such as Locktite (TM) Crystal Clear Ultraviolet Curing Adhesive.

Preferably, the insulating plate 180 has a high thermal conductivity and a high electrical resistance. Also preferably, the insulating plate 180 has a low coefficient of expansion that is close to the coefficient of expansion of the integrated circuit die 100. The insulating plate 180 may be, for example, a ceramic material, such as aluminum oxide, silicon carbide or beryllium oxide, a single crystal material, such as sapphire, or a material such as industrial grade diamond, or the like. Each of these materials has its own characteristics with respect to thermal conductivity, electrical insulation, transparency, and cost, and the selection of the material for a particular application will depend upon a number of factors, such as the amount of heat generated by the integrated circuit die 100.

In the present invention, the insulating plate 180 is preferably sapphire. In addition to the thermal and electrical characteristics described above, sapphire is transparent to optical energy, including ultraviolet light. The transparency of the sapphire makes the use of sapphire for the insulating plate 180 particularly advantageous when the bonding material 186 is an ultraviolet light cured adhesive, as used to construct the preferred embodiments of the present invention. Rather than being blocked by the plate 180, the ultraviolet light will pass through the sapphire plate 180 and will interact with the bonding material 186, such as the bonding material 186 between the insulating plate 180 and the integrated circuit die 100, to cause the bonding material 186 to cure.

After the bonding material 186 is cured, the bottom surface 112 of the integrated circuit die 100 is ground so that the distance from the bottom surface 112 of the integrated circuit die 100 to the bottom surface 184 of the insulating plate 180 is substantially constant across the entire bottom surface 112. Thus, the thickness of the sandwich formed by the integrated circuit die 100, the TAB film 140 and the insulating plate 180 is substantially constant. Furthermore, the bottom surface 112 of the integrated circuit die 100 is substantially parallel to the bottom surface 184 of the insulating plate 180. The constant thickness and the parallel surfaces of the sandwich enable the sandwich to be used in a stacked circuit assembly to be described in detail below.

Figure 7A:
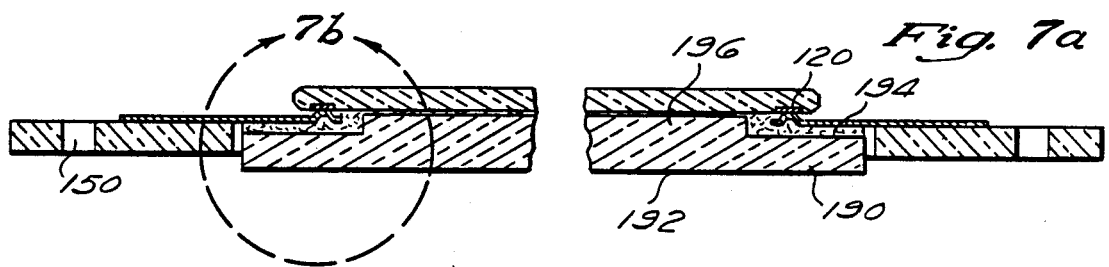
FIG. 7a is a cross-sectional view of an integrated circuit die/ TAB film/ insulating plate sandwich similar to the sandwich of FIGS. 4–6 wherein the flat insulating plate has a raised middle portion to contact the integrated circuit die.
Figure 7B:
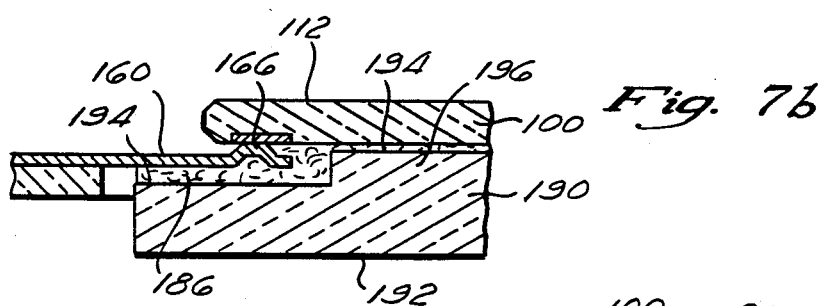

FIGS. 7a and 7b illustrate an alternative embodiment of the present invention in which the insulating plate 180 of FIGS. 5 and 6 is replaced with an insulating plate 190 that has a bottom surface 192 and a top surface 194. The top surface 194 has a raised middle portion 196. The raised middle portion 196 has dimensions that are selected so that the raised middle portion 196 occupies an area inside the area occupied by the fingers 166. Only the middle portion 196 of the insulating plate 190 contacts the top metallization surface of the integrated circuit 100. The height of the middle portion 196 is selected so that the portion of the top surface 194 that surrounds the middle portion 196 does not contact that fingers 166 or the interconnection leads 160. Thus, the distance between the bottom surface 112 of the integrated circuit die 100 and the opposing (bottom) surface 192 of the insulating plate 190 is determined by the thicknesses of the integrated circuit die 100 and the insulating plate 190, and is not dependent upon any irregularities in the thicknesses of the interconnection leads 160 or the fingers 166. Since the thickness of the integrated circuit die 100 and the thickness of the insulating plate 190 can be accurately controlled, the thickness of the overall sandwich formed by the integrated circuit die 100, the TAB film 140 and the insulating plate 190 can be made substantially constant, and the bottom surface 112 of the integrated circuit die 100 and the bottom surface 192 of the insulating plate 190 can therefore be made substantially parallel. For example, the bottom surface 112 of the int(R)grated circuit die 100 can be precisely ground to be parallel to the bottom surface 192 of the insulating plate 190. The integrated circuit die 100, the interconnection leads 160 and the insulating plate 190 are preferably bonded together with the bonding material 186, preferably an ultraviolet cured epoxy, as with the previous embodiment. Thus, the interconnection leads 160 are held in a secure, fixed position with respect to the bonding pads 120 of the integrated circuit die 100.

Although shown as a contiguous part of the insulating plate 190, the raised portion 194 can also be a separate piece of insulating plate (e.g., sapphire) that is bonded to the insulating plate 190 during the manufacturing process. This alternative embodiment (not shown) can be used so that the flat insulating plate 190 does not have to be ground or otherwise modified to form the raised portion 194.

Figure 8:
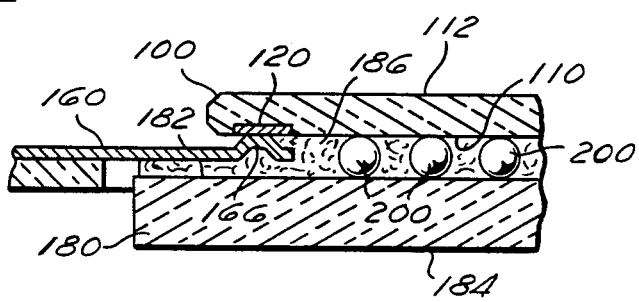
FIG. 8 is an enlarged cross-sectional view of an alternative embodiment of the integrated circuit die/ TAB film/ insulating plate sandwich of FIGS. 7a and 7b, showing a plurality of spacers between the integrated circuit die and the flat insulating plate.

FIG. 8 illustrates a further alternative of the present invention which uses the flat insulating plate 180 of FIGS. 4, 5 and 6. However, rather than mounting the insulating plate 180 directly to the interconnection leads 160 and the fingers 166, a plurality of spacers 200 are positioned between the top surface 182 of the insulating plate 180 and the top surface 110 of the integrated circuit die 100. The integrated circuit die 100, the spacers 200, the TAB film 140 and the insulating plate 180 are bonded together with the bonding material 186 to form a sandwich as before.

The spacers 200 can advantageously be glass microballoons such as are commonly used as additives to potting materials and resins, and are selected to have a uniform diameter throughout so that the overall thickness of the sandwich thus formed is constant, and so that the bottom surface 112 of the integrated circuit die is substantially parallel to the bottom surface 184 of the insulating plate 180. As set forth above, the bottom surface 112 of the integrated circuit die 100 can be precisely ground to be parallel to the bottom surface 184 of the insulating plate 180.

Figure 9:
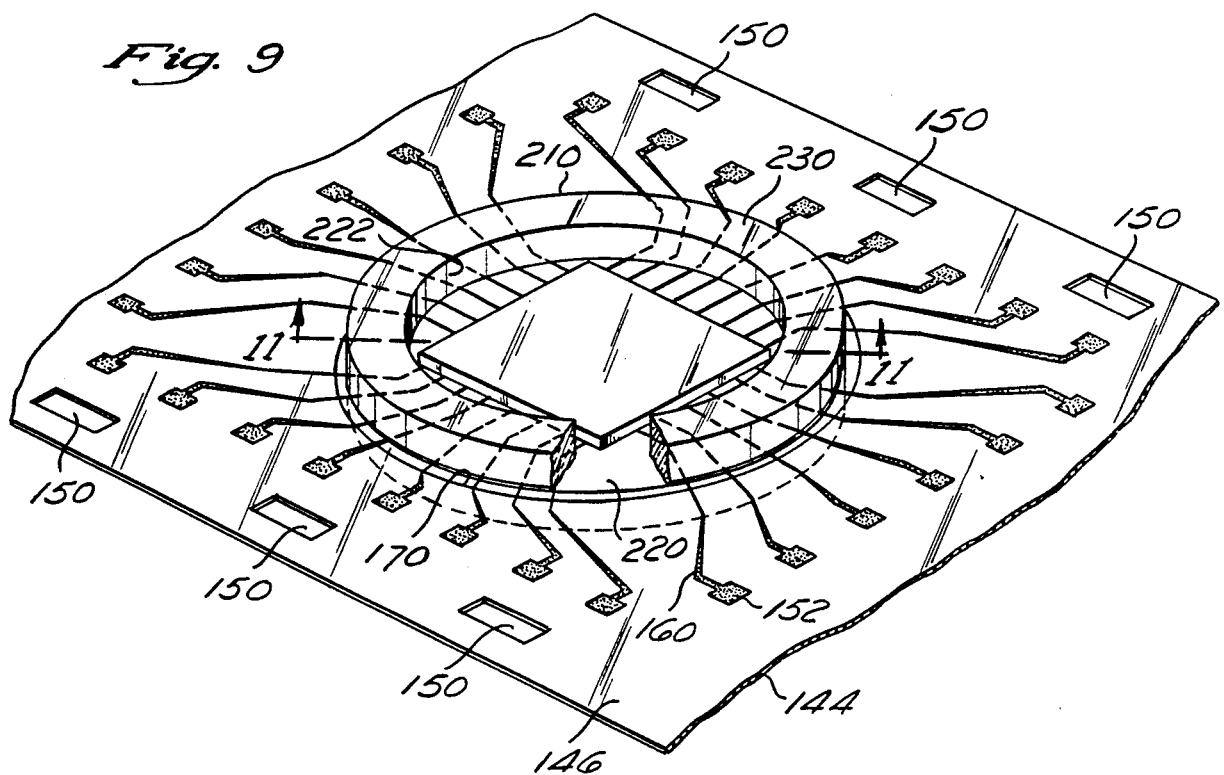
FIG. 9 is a perspective view of a preferred embodiment of the present invention that includes an integrated circuit die, a circular flat insulating plate, a frame of TAB film, and an annular clamping ring to form a sandwich.

FIGS. 9–13 illustrate a particularly preferred embodiment of the present invention that includes a clamping ring 210 of insulating material in addition to a flat insulating plate 220. As shown in FIG. 9, the clamping ring 210 is annular and has a concentric opening therein to define a cavity 222. The cavity 222 in the ring 210 has a diameter selected to be sufficiently large so that the ring 210 can surround the outer periphery of the integrated circuit die 100 without touching the edges of the die 100. Thus, the integrated circuit die 100 fits within the cavity 222. In the embodiment shown in FIGS. 9–13, the flat insulating plate 220 is also circular, and it has an outer diameter selected to be approximately the same as the outer diameter of the ring 210. Thus, the periphery of the flat plate 220 also extends beyond the periphery of the integrated circuit die 100.

Figure 10:
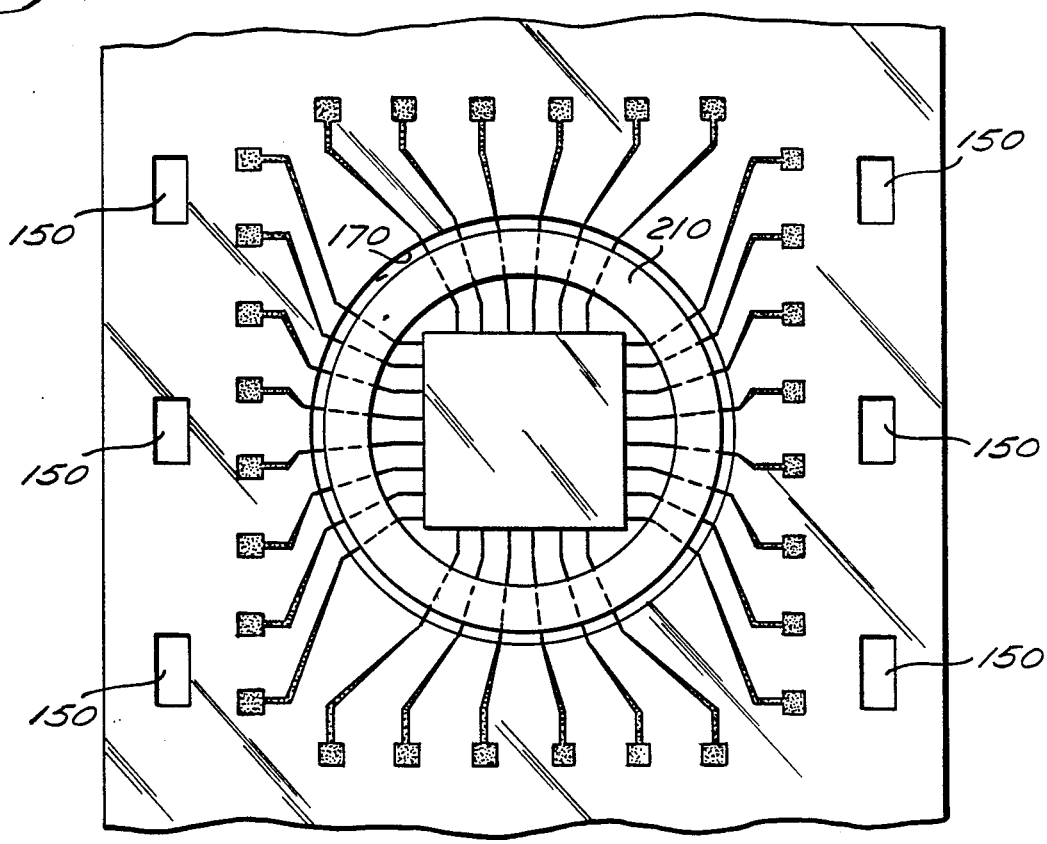
FIG. 10 is a plan view of the integrated circuit die/ TAB film/ insulating plate/ clamping ring sandwich of FIG. 9, more clearly showing the preferred radial disposition of the interconnection leads with respect to the center of the clamping ring.
Figure 11:
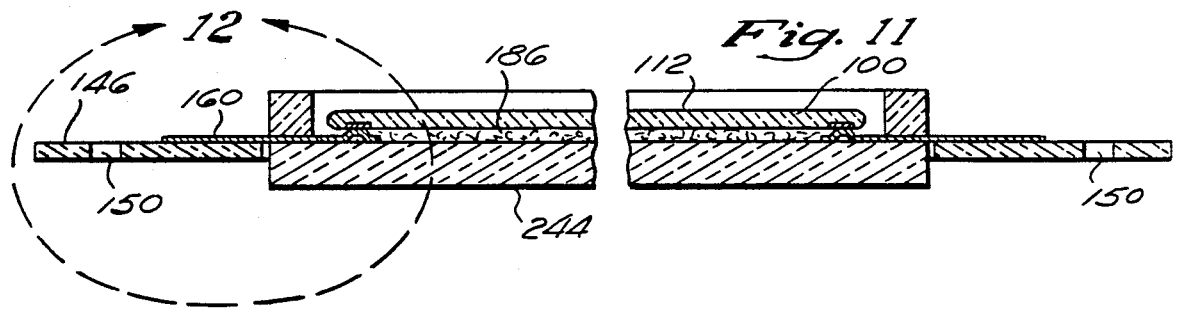
FIG. 11 is a cross-sectional view of the integrated circuit die/ TAB film/ insulating plate/ clamping ring sandwich of FIGS. 9 and 10, taken along the lines 11—11 in FIG. 9.
Figure 12:
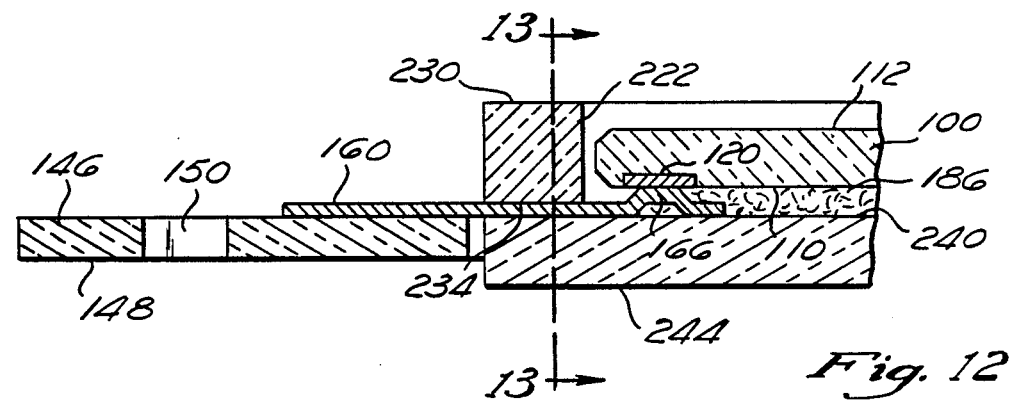
FIG. 12 is an enlarged cross-sectional view of a portion of the integrated circuit die/ TAB film/ insulating plate/ clamping ring sandwich of FIGS. 9, 10 and 11 defined by the dashed line 12 in FIG. 11.

The clamping ring 210 has a top surface 230 and a bottom surface 234. Similarly, the flat plate 220 has a top surface 240 and a bottom surface 244. The clamping ring 210 and the flat plate 220 are positioned so that outer portion of the top surface 240 of the flat plate 220 is juxtaposed with the bottom surface 234 of the ring 210 with the interconnection leads 160 of the TAB film 140 positioned therebetween so that the interconnection leads are clamped between the ring 210 and the flat plate 220. Preferably, as illustrated in FIG. 10, the portions of the interconnection leads 160 proximate to the clamping ring 210 are radially disposed with respect to the centers of the clamping ring 210 and the flat circular plate 220 so that the interconnection leads are substantially normal to the outer circumference of the clamping ring 210. Further, as illustrated, a portion of each of the interconnection leads 160 extends beyond the outer peripheries of the ring 210 and the flat plate 220 so that the portion is exposed.

Figure 13:
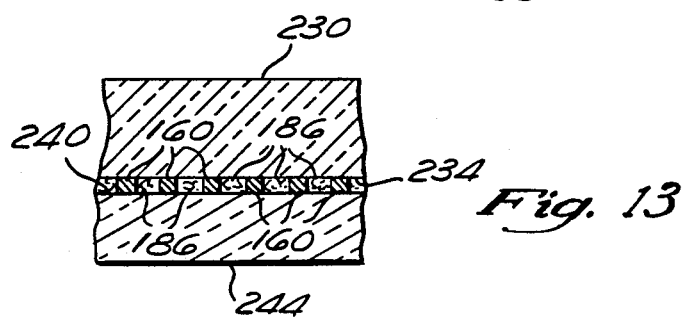
FIG. 13 is a further enlarged cross-sectional view of the integrated circuit die/ TAB film/ insulating plate/ clamping ring sandwich of FIGS. 9–12, taken along the lines 13—13 in FIG. 12 showing additional details of the interconnecting leads clamped between the flat circular plate and the clamping ring.

The clamping ring 210 and the flat plate 220 are bonded to the integrated circuit die 100 and the interconnection leads 160 using the bonding material 186, which is preferably ultraviolet light cured epoxy. The ring 210 and the flat plate 220 are securely clamped together as the bonding material 186 cures so that excess bonding material 186 is squeezed from the sandwich of materials thus formed. Thus, as illustrated in FIG. 13, substantially all of the bonding material 186 lies between the interconnection leads 160. Unlike the fingers 166 which are bonded to the bonding pads 120 and which may not have a uniform thickness, the thickness of the interconnection leads 160 are substantially uniform at the locations where the interconnection leads 160 are clamped between the ring 210 and the flat plate 220. The ring 210 and the flat plate 220 are preferably constructed from sapphire or another dimensionally stable material. Thus, the thickness of the sandwich from the top surface 230 of the ring 210 to the bottom surface 244 of the flat plate 220, including the interconnection leads 160 sandwiched between the ring 210 and the flat plate 220, is substantially constant. Furthermore, the top surface 230 of the ring 210 is substantially parallel to the bottom surface 244 of the flat plate 220. Thus, the top surface 230 of the ring 210 and the bottom surface 244 of the flat plate 220 of the embodiment of FIGS. 9-13 provide dimensionally stable surfaces when a plurality of sandwiches are stacked together, as will be described below.

The thickness of the clamping ring 210 is selected to be greater than the thickness of the integrated circuit die 100 so that the bottom surface 112 of the die 100 does not extend beyond the plane of the top surface 230 of the clamping ring 210. Thus, in this embodiment, all of the integrated circuit 100 is enclosed within the cavity 222, and any irregularities in the bottom surface 112 of the integrated circuit die 100 do not affect the thickness or parallelism of the overall sandwich. It is therefore unnecessary to grind the bottom surface 112 or otherwise modify the integrated circuit die 100 in this embodiment. Furthermore, the integrated circuit die 100 is substantially isolated from stresses that may result from the stacking of a plurality of circuits since no force is applied to the bottom surface 112 of the integrated circuit die 100.

Although the embodiment of FIGS. 9-13 is illustrated with a circular clamping ring 210 and a circular flat plate 220, it should be understood that the embodiment can also be implemented using a rectangular configuration for the clamp and the plate (not shown). For example, a rectangular clamp can be formed by sawing a rectangular opening in the middle of a solid rectangular plate. Alternatively, a rectangular clamp can be formed by juxtaposing two L-shaped sections of insulating material to form a rectangular peripheral wall surrounding a rectangular central cavity. As will be shown below, the circular configuration is particularly advantageous for stacking the integrated circuit/ TAB film/ insulating plate and clamp sandwiches.

Figure 14:
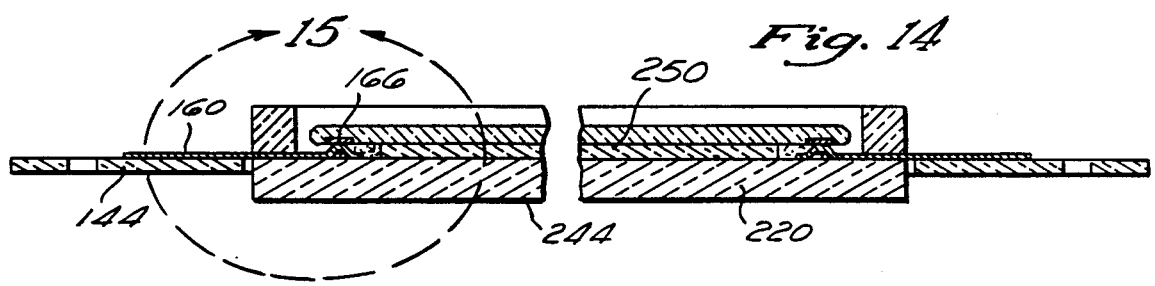
FIG. 14 is a cross-sectional view of an alternative embodiment of the integrated circuit die/ TAB film/ insulating plate/ clamping ring sandwich of FIGS. 9–13 in which the flat insulating plate includes a raised middle portion that contacts the integrated circuit die to provide a thermally conductive path from the integrated circuit die to the insulating plate.
Figure 15:
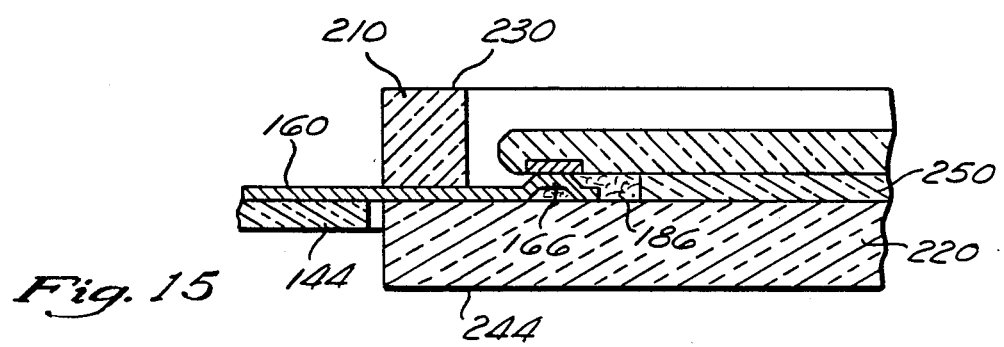
FIG. 15 is an enlarged cross-sectional view of the integrated circuit die/ TAB film/ insulating plate/ clamping plate sandwich of FIG. 14, taken along the lines 15—15 in FIG. 14.

FIGS. 14 and 15 illustrates a further alternative embodiment of the present invention that is a slightly modified version of the embodiment of FIGS. 9-13. Thus, the embodiment of FIGS. 14 and 15 is shown in cross-section only. The embodiment of FIGS. 14 and 15 includes a raised center portion 250 that is positioned on the top surface 240 of the flat plate 220 and is positioned in contact with the top surface 110 of the integrated circuit die 100. As set forth above, the raised center portion 250 may be formed as part of the flat bottom plate 220. Alternatively, as illustrated in FIG. 14 and 15, the raised center portion 250 may be a separate plate having smaller dimensions than the flat bottom plate 220 that is bonded to the top surface 240 of the flat plate 220. The use of the raised center portion 250 is particularly advantageous when the integrated circuit die 100 is a high power circuit that generates a substantial amount of heat during operation. The raised center portion 250 provides a thermally conductive path from the top surface 110 of the integrated circuit die 100 to the flat bottom plate 220 so that the heat generated by the integrated circuit die 100 can be conducted away from the die 100.

FIGS. 16, 17 and 18 illustrate a preferred embodiment of the present invention wherein a plurality of sandwiches 300, 302, 304, 306, 308, 310, etc., constructed in accordance with one of the above-described embodiments, are stacked together to form a system of integrated circuits. The sandwiches 300, 302, 304, 306, 308, 310 illustrated in FIGS. 16 and 17, are constructed in accordance with FIGS. 9-13 and FIGS. 14-15; however, one or more of the other embodiments described above can also be used. For example, the sandwich 300 is constructed in accordance with FIGS. 14-15 and includes the raised center portion 240 to provide good thermal conductivity between the integrated circuit die 100 and the flat plate 220. This construction is used, for example, for integrated circuits, such as input/output buffers/drivers that generate a relatively large amount of heat. The sandwich 302, which may be a memory circuit, or the like, is constructed in accordance with FIGS. 9-13 and does not have a raised middle portion. One or more of the sandwiches can also be constructed in accordance with one of the embodiments of FIGS. 4-9.

The system of FIGS. 16 and 17 further includes a base block 330 that is advantageously constructed from a highly thermally conductive material, such as copper, aluminum, or the like. The base block 330 has a top surface 332 and a bottom surface 334. The bottom surface 334 advantageously includes a threaded hole 336 that receives a removable screw 338. In order to construct the system of the present invention, the base block 330 is temporarily mounted in a hole 340 of a base plate 342 that is part of an alignment fixture 344. The hole 340 has dimensions that are closely matched to the dimensions of the base block 330 so that the base block 330 is precisely located in the base plate 342. The base block 330 is secured within the hole 340 of the base plate 342 by the screw 338 which passes through a smaller hole 346 in the base plate 342.

The alignment fixture 344 further includes a plurality (for example, six) of alignment pins 354 that are sized and positioned to precisely match the size and positions of the sprocket holes in the TAB film 140 of each of the sandwiches 300, 302, 304, 306, 308, 310. As the sandwiches 300, 302, 304, 306, 308, 310 are placed on the alignment fixture 344, the alignment pins 354 pass through the sprocket holes 150 of the sandwiches 300, 302, 304, 306, 308, 310. The alignment pins 354 are precisely positioned with respect to the base block 330 so that when the plurality of sandwiches 300, 302, 304, 306, 308, 310 are positioned on the alignment pins 354, the center of each sandwich (i.e., the center of the integrated circuit die in each sandwich) is substantially aligned with the center of the base block 330. The first sandwich 300 can be positioned directly above the base block 330 with the bottom surface 244 of the flat plate 220 proximate to the top surface 332 of the base block 330. Since the base block 330 may be constructed of a different material than the flat plate 220 of the sandwich 300, the present invention preferably includes a layer 360 of molybdenum that is interposed between the bottom surface 244 of the flat plate 220 and the top surface 332 of the base block 330. The layer 360 of molybdenum is highly thermally conductive so that the heat on the bottom surface 244 of the flat plate 220 when the system is operated will be conducted to the top surface 332 of the base block 330. The molybdenum layer 360 has a low thermal expansion coefficient and serves as an interface between the dissimilar materials of the flat plate 220 and the base block 330 to prevent movement that might otherwise stress and cause damage to the flat plate 220.

As the sandwiches 300, 302, 304, 306, 308, 310 are placed on the alignment fixture 344, a layer of bonding material 370 is placed between the top surface 230 of the clamping ring 210 of one sandwich and the bottom surface 244 of the flat plate 220 of the next higher sandwich. Preferably, the bonding material 370 is an ultraviolet light cured epoxy, such as was described above. After all of the sandwiches 300, 302, 304, 306, 308, 310 have been placed on the alignment fixture 344, a cover plate 380 of sapphire or other suitable material is placed on the top surface 330 of the clamping ring 210 of the uppermost sandwich with a layer of bonding material 370 therebetween. The entire assembly is securely clamped between the cover plate 380 and the bottom of the alignment fixture 344 and pressure is applied as ultraviolet light is applied to the system to cure the bonding material 370. Thereafter, the screw 338 is released and the assembly of the sandwiches 300, 302, 304, 306, 308, 310 and the base block 330 is removed from the alignment fixture 344.

As illustrated in FIG. 17, the perimeter of the flat circular plate 220 of one sandwich layer abuts the clamping ring 210 of the next lower sandwich layer in the stack of sandwiches. Furthermore, the clamping ring 210 and the flat circular plate 220 of each sandwich are thermally interconnected by the interconnection leads 160 and the bonding material 370. Within each sandwich, the integrated circuit die 100 is thermally connected to the flat circular plate 220 and the clamping ring 210 via the bonding material 186. Thus, a continuous thermal conduction path is provided from each integrated circuit die 100 to the base block 330 of the stack. Furthermore, as described above, the thermal conduction path for integrated circuits having relatively high power outputs can be improved by using the embodiment of FIGS. 14–15 to include the raised middle portion 250. Also, the sandwiches having the higher power integrated circuits can advantageously be located closer to the base block 330 to reduce the length of the thermal conduction path from the integrated circuit to the base block 330.

Although described above with respect to the embodiments of FIGS. 9–15, it should be understood that the stack 400 can also be constructed with sandwiches built in accordance with the embodiments of FIGS. 4–8. As set forth above, the bottom surfaces 112 of the integrated circuit dies 100 in each sandwich constructed in accordance with FIGS. 4–8 are ground, if necessary, to assure that the bottom surfaces 112 of the dies 100 are substantially parallel with the corresponding bottom surfaces 184 of the insulating plates 180. Thus, a stack including such embodiments is dimensionally stable. When such embodiments are used, it is preferable that sufficient bonding material 370 be applied between the sandwich layers to provide a continuous, thermally conductive path from one sandwich layer to the next lower sandwich layer. Preferably, the bonding material 370 fills the gap between the periphery of the top surface 182 of one insulating plate 180 and the bottom surface 184 of the next higher insulating plate 180.

After removing the assembly of sandwiches from the alignment fixture 344, the portions of the TAB film 140 extending outside the circular flat plates 220 and the annular rings 210 are removed so that the assembly forms a cylindrical stack 400 of sandwiches as illustrated in FIG. 18. For example, the excess TAB film 140 can be removed with a knife, or the like, to expose the radially disposed interconnection leads 160 proximate to the outer circumference of the clamping ring 210. Thus, the outer circumference of the cylindrical stack 400 comprises a plurality of ends 410 of the metallic interconnection leads 160.

After removing the excess TAB film 140, the base block 330 of the cylindrical stack 400 is preferably mounted in a collet 414 (see FIG. 19) which is in turn mounted in a lathe (not shown), or the like, so that the cylindrical stack 400 can be rotated about an axis of symmetry 420 of the cylindrical stack 400. The base block 330 preferably includes an index slot 416. The collet 414 preferably includes an index pin 418 that is engageable with the index slot 416 to secure the base block 330 within the collet 414. As the cylindrical stack 400 is rotated, the outer circumference of the cylindrical stack 400 is ground and polished to a precise cylindrical dimension using a diamond cutting wheel (not shown), or the like. This is accomplished by moving the cutting wheel axially along the outer circumference of the cylindrical stack 400 as it is rotated. The cylindrical stack 400 is ground to a diameter that is slightly less than the original diameters of the clamping rings 210 and the flat circular plates 220 so that the outer circumferences of all of the sandwiches are substantially identical irrespective of any initial differences in diameter and any small alignment errors. Furthermore, the outer circumference of the cylindrical stack 400 has a smooth, polished finish after the grinding and polishing operation is completed. As illustrated, the grinding and polishing operation does not expose the integrated circuit dies 100 which are enclosed within the outer walls of the cylindrical stack 400. Thus, the integrated circuit die 100 is not directly affected by the grinding and polishing operation.

After grinding and polishing the outer circumference of the cylindrical stack 400, the outer circumference is cleaned to remove any residue from the grinding and polishing operation. Thereafter, the exposed ends 410 of the interconnection leads 160 of the stacked sandwiches are interconnected. For example, the exposed ends 410 can be interconnected by point-to-point wiring wherein one end of an insulated wire is bonded to an exposed end 410 of an interconnection lead 160 by compression or ultrasonic welding, or the like, and the insulated wire is then positioned on and bonded to an exposed end 410 of another interconnection lead 160. The exposed ends 410 can also be interconnected by an electrically conductive thick film, such as a silver-loaded epoxy, that is applied to the cylindrical stack 400 by silk screening, or the like. Alternatively, the exposed ends 410 can be interconnected with a flexible printed circuit board (not shown). For example, the flexible printed circuit board can be constructed in a manner similar to the construction of the TAB film 140, and the flexible printed circuit board can advantageously include multiple interconnection layers.

In one preferred embodiment of the invention, illustrated in FIGS. 18–22, techniques similar to conventional printed circuit board techniques are used to interconnect the exposed ends 410. For example, a thin layer of gold, copper or other suitable electrically conductive material is sputtered onto the outer circumference of the cylindrical stack 400 to form an electrically conductive (e.g., metallic) base layer (not shown). Thereafter, the cylindrical stack 400 is electroplated with additional gold or copper over the base layer to provide a layer 440 of metal (see FIG. 20) having a thickness of 0.0002 to 0.0015 inches. A layer 450 of a photo-resistant coating material is then applied to the cylindrical stack 400 over the metal layer 440. The photo-resistant coating layer 450 is advantageously applied by again rotating the cylindrical stack in a lathe (not shown) and by pressing a foam sponge with the photo-resistant material thereon against the rotating cylindrical stack 400. This procedure causes the layer 450 of the photo-resistant material to be smooth and even. After the photo-resistant layer 450 is applied, the photo-resistant material is allowed to cure.

After the photo-resistant material layer 450 has cured, the cylindrical stack is again placed in the collet 414. The collet 414 is secured within a wiring tool 460 that includes a motor (not shown) for precisely rotating the collet 414 in small angular steps, and includes an controlled light source 470 that is moveable axially with respect to the cylindrical stack 400. The light source 470 produces a light beam (represented by a line 474) that can be switched on an off (e.g., by selectively providing power to the filament of a bulb or by selectively positioning a shutter in the path of the light beam 474). The light source 470 preferably includes a lens assembly 478 having an adjustable focus so that the diameter of the beam 474 can be varied.

As is well known in the art, when the photo-resistant material comprising the layer 450 is exposed to light, the portion exposed hardens so that it is not readily dissolved by a solvent, such as alcohol, xylene, or the like. The unexposed portions of the material are readily dissolved by the solvent. Thus, by selectively exposing portions of the material to light, a pattern of hardened photo-resistant material can be formed that will remain after the unexposed portions are dissolved by the solvent. In accordance with the present invention, the exposure of the photo-resistant material layer 450 is accomplished by selectively positioning the light source 470 over the portions to be exposed. For example, the light source 470 is positioned so that the light beam 474 is directed at one of the exposed ends 410. Thereafter, the light source 470 is moved axially (i.e., vertically in FIG. 18) along the cylinder 400 to expose other portions of the photo-resistant material layer 450, thereby creating a path of hardened photo-resistant material. The paths of hardened photo-resistant material define metallic electrical interconnections as will be discussed below. For example, a line 480 in FIG. 18 represents a path that interconnects two axially adjacent exposed ends 410.

A circumferential (i.e., horizontal) path of hardened photo-resistant material 450 can be formed by rotating the collet 414 while holding the light source 470 in a fixed axial location. Such a path is represented by a line 484 in FIG. 18. A combination of axial movement of the light source 470 and angular (i.e., rotational) movement of the collet 414 can provide a path at an angle with respect to both the axial and circumferential paths. The width of the paths thus created is determined by the diameter of the light beam 474 and can be varied in accordance with the desired width of the metallic interconnection defined by the path. The light source 470 and/or the collet 414 can be moved without creating a hardened path by switching off the light beam 474 prior to movement.

The foregoing description of the operation of the light source is very similar to the operation of a light source in a conventional printed circuit manufacturing system. For example, the axial movement of the light source 470, the angular movement of the collet 414, and the switching and focusing of the light beam 474 are controllable by a program in a computer, a numeric control tape, or the like, in a conventional manner.

Alternative methods (not shown) for exposing the photo-resistant material include contact printing, projection printing, or the like. For example, in the contact printing method, the interconnection pattern is provided as a pattern of transparent and opaque portions of a flexible photographic material that is positioned proximate to the photo-resistant material. Thereafter, the photographic material is exposed to light from a light source. The transparent portions of the film will allow light to pass through and expose the portions of the photo-resistant material lying under the transparent portions, and the opaque portions of the film will block the light and prevent the exposure of the portions of the photo-resistant material lying under the opaque portions.

After all of the desired interconnection paths are defined by exposing the photo-resistant material with the light beam 474 from the light source 470, the photo-resistant material on the cylindrical stack 400 is developed, such as by placing the cylindrical stack in a solvent, such as alcohol or xylene, to remove the unexposed photo-resistant material in the layer 450, thus revealing the portions of the metallic layer 440 thereunder. The exposed portions of the photo-resistant material continue to protect the portions of the metallic layer beneath the exposed portion. The cylindrical stack is then placed in an etching solution (not shown) such as ferric chloride for a copper metallic layer 440 or aqua regia for a gold metallic layer 440. The portions of the metallic layer 440 protected by the hardened photo-resistant material are substantially unaffected by the etching solution while the unprotected portions of the metallic layer 440 are etched away. Thus, metallic interconnection paths defined by the exposed photo-resistant material are produced to interconnect the exposed ends 410 of the interconnection leads 160.

Exemplary interconnection paths 496, produced in accordance with the foregoing description, are illustrated in FIGS. 21 and 22. As illustrated in FIG. 21, in addition to interconnecting the exposed ends 410 of the interconnection leads 160, the interconnection paths provide a plurality of terminal pads 498 along the lower portion of the cylindrical stack 400. As further illustrated in FIG. 21, the base block 330 of the cylindrical stack 400 is positioned in a ceramic base plate 500 that is similar to a conventional ceramic chip carrier. The ceramic base plate 500 has an upper surface 504 and a lower surface 508. The upper surface 504 of the ceramic base plate 500 has a hole 512 in the center thereof that is shaped and sized to receive the base block 330. The lower surface 508 of the ceramic base plate 500 includes a plurality of connector pins 520 similar to those found on a conventional ceramic chip carrier. The connector pins 520 are connectable to a printed circuit board in a conventional manner. Other interconnection methods could also be used. For example, bonding pads (not shown) such as are commonly used with conventional surface mount technology can be disposed along the periphery of the ceramic base plate 500.

The ceramic base plate 500 further includes a plurality of metallic vias 522 that pass through the base plate 500 from the lower surface 508 to the upper surface 504 and electrically interconnect the connector pins 520 with corresponding electrical conductors 524 on the top surface 504. The electrical conductors 524 are terminated on the top surface 504 proximate to the hole 512. The electrical conductors 524 are electrically interconnected to the terminal pads 498 of the electrical interconnection paths 496 with a plurality of interconnection wires 540. The interconnection wires 540 can be connected to the electrical conductors 524 and the terminal pads 498 in accordance with the method illustrated in FIGS. 23-26. As illustrated in FIG. 23, the ceramic plate 500 and the cylindrical stack 400 are positioned in a wire bonding machine (not shown) that includes a conventional wire bonding head 554. For example, the wire bonding head 554 advantageously can be substantially similar to a wire bonding head that is used to interconnect integrated circuit dies and chip carriers in conventional manufacturing processes. The wire bonding head 554 operates to electrically and mechanically interconnect one end of a wire 560 to one of the electrical conductors 524 on the top surface 504 of the ceramic base plate 500. Thereafter, the wire bonding head 554 is moved away from the top surface 504 of the ceramic base plate 500, and the ceramic base plate 500 and cylindrical stack 400 are pivoted so that the terminal pad 498 of one of the interconnection paths 496 is positioned beneath the wire bonding head 554, as illustrated in FIG. 24. Then the wire bonding head 554 is lowered to the terminal pad 498 and the wire 560 is electrically and mechanically connected to the terminal pad 498. Thereafter, the wire bonding head 554 is again lifted and the ceramic base plate 500 and cylindrical stack 400 pivoted to the original position. Also, the cylindrical stack 400 is rotated about its axis of symmetry 420 so that a new electrical conductor 524 is positioned beneath the wire bonding head 554.

The steps illustrated in FIGS. 23-26 are repeated until all the terminal pads 498 are connected to corresponding electrical conductors 524. Thereafter, the connector pins 520 on the bottom surface 508 of the ceramic base plate 500 are connected to a printed circuit board, or the like, (not shown) to provide electrical interconnection to the cylindrical stack 400, and thus to the integrated circuit dies 100 within the cylindrical stack 400.

The ceramic base plate 500 can further include additional interconnection wiring (not shown) and discrete components (not shown) to provide signal and power conditioning for the integrated circuits in the stack 400. For example, decoupling capacitors can be mounted on the base plate 500 to attenuate high frequency noise from the signals and the power inputs.

Preferably, after the stack 400 is mounted to the ceramic base plate 500 and electrically interconnected as described above, the stack 400 is enclosed within a container (not shown) to protect the stack 400 from damage. In addition, the container can advantageously include cooling fins, or the like, to assist in removing thermal energy from the stack 400.

The present invention is particularly advantageous in constructing systems of integrated circuits because the interconnections between the integrated circuit dies 100 within the cylindrical stack 400 are provided by the relatively high density interconnections on the circumference of the stack 400. Although printed circuit boards for interconnecting integrated circuits with such large numbers of leads are extremely difficult to design and build, the present invention substantially reduces the design effort required since a large number of the interconnections are typically bus connections that can accomplished with a short conductive path between two vertically adjacent pins. The signals between the integrated circuit dies 100 can be very short and it is not necessary to route these signals to a printed circuit board as in conventional systems. It is only necessary to connect the input and output signals to the system through the ceramic base plate 500 and to the printed circuit board. For example, the cylindrical stack 400 can advantageously be an entire computer system with a processing unit, memory storage units, and controller units. The various units are preferably connected together with the interconnection paths 496 on the circumference of the cylindrical stack 400. Thus, rather than requiring extensive printed circuit board wiring interconnections as in conventional systems, only those signals necessary to communicate with external devices such as magnetic storage units, displays, keyboards, and the like, need be routed through the ceramic base plate to a printed circuit board. Therefore, there is a considerable saving in both printed circuit board complexity as well as printed circuit board size.

Although described above with respect to an integrated circuit die having 28 interconnection leads, the present invention is suitable for interconnecting integrated circuit dies having large numbers of leads (e.g., in excess of 200 leads). In addition, it is not necessary that each of the integrated circuits in each of the sandwich layers have the same number of interconnection leads 160. So long as the interconnection leads 160 are accurately positioned with respect to a known alignment feature (i.e., the sprocket holes 150 in the TAB film 140), the exposed portions of the interconnection leads 160 are readily connectable, as described above.

Although the present invention can advantageously be used with standard off-the-shelf integrated circuits, the present invention is particularly advantageous when used with integrated circuits designed to provide a large number of signal outputs from each circuit on a "wide" (i.e., many signal leads) bus. Unlike prior systems where considerable effort has been expended to reduce the number of input/output connections of an integrated circuit, for example by multiplexing signals, the present invention is particularly suited to utilize a large number of interconnections. This is feasible since there is no requirement that each of the integrated circuit leads go to printed circuit board. Rather, a large number of interconnections between integrated circuit dies can be accomplished by short point-to-point wiring between adjacent sandwiches. Thus, for example, a common bus structure can be provided similar to the bus structure in a personal computer. Each integrated circuit in the stack of integrated circuits has access to each signal on the bus; however, each integrated circuit only receives signals from or transmits signals to that portion of bus that is relevant to that integrated circuit.

Although described above in connection with the circular embodiments of FIGS. 9-13 and 14-15, it should be understood that the stacked system of the present invention can also be advantageously constructed using the rectangular embodiments of FIGS. 4-8. Such an embodiment is illustrated in FIG. 27 as a stack 600 of rectangular sandwiches having four flat faces. In the embodiment of FIG. 27, the grinding and polishing operation is accomplished by moving the flat faces and a grinding and polishing tool laterally with respect to each other. The interconnections of the exposed ends of the electrical conductors of the TAB film is accomplished by the etching and silk screening techniques described above. Each of the four flat faces of the stack 600 is similar to a conventional planar printed circuit board, and the steps of exposing and etching the photo-resistant material can be accomplished using substantially conventional techniques.

The above-described stacks 400 and 600 are particularly advantageous when constructed with insulating plates, such as sapphire, that are optically transparent. As set forth above, the optically transparent flat plates permit optical energy to pass through the plates to the preferred ultraviolet light curable bonding material. In addition, the optically transparent plates are advantageous after the stacks 400 and 600 are constructed. For example, one or more of the integrated circuit dies 100 in the sandwich layers can advantageously be an erasable programmable read only memory (EPROM), such as are commercially available. Many versions of such EPROM's are erasable by applying ultraviolet light to the integrated circuit die that comprises the EPROM. The transparency of the insulating plates permits the optical energy to pass through the plates to the integrated circuit dies to erase the EPROM's. In such applications, the stacks 400 and 600 are covered with an opaque material other than when it is desired to erase the EPROM's.

The foregoing embodiments have been described with respect to a single integrated circuit per sandwich layer. As set forth above, TAB film is also available that provides interconnecting leads for interconnecting multiple integrated circuit dies and for connecting integrated circuit dies and discrete components in the same film frame. Such interconnected circuits and components can advantageously be included on one or more of the sandwich layers. For example, a sandwich layer can include decoupling capacitors for the interconnection leads that provide power to the integrated circuit die on the layer. Additional sandwich layers can be provided to connect discrete components such as may be used for terminating input and output lines and the like.

Figure 49:
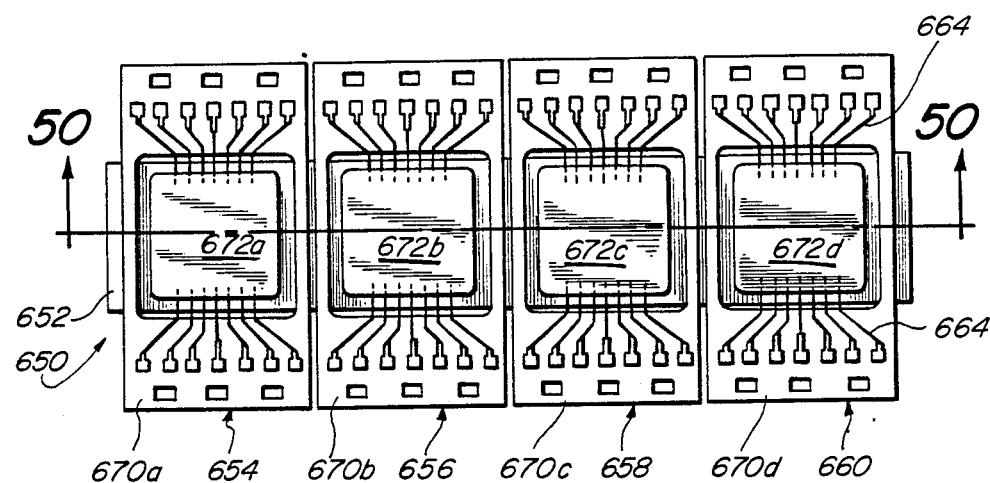
FIG. 49 is a plan view of an alternative embodiment of a sandwich layer in which a plurality of TAB tape frames, each bonded to an integrated circuit die, are provided on a common insulating plate to provide a sandwich layer having multiple integrated circuits.
Figure 50:
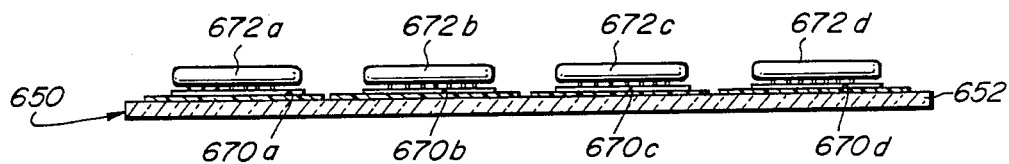
FIG. 50 is an elevation view of the alternative embodiment of FIG. 49 taken along the lines 50—50 in FIG. 49.

FIGS. 49-52 illustrate two alternative embodiments of the present invention in which multiple integrated circuits are included on a single sandwich layer 650. FIGS. 49 and 50 illustrate one such embodiment in which a single rectangular plate 652 is provided. A plurality of TAB tape/integrated circuit assemblies, for example, first, second, third and fourth TAB tape/integrated circuit assemblies 654, 656, 658 and 660, are mounted on the plate 652 in accordance with one of the previously described structures and methods. Each of the TAB tape/ integrated circuit assemblies comprises a frame 670a, 670b, 670c and 670d of TAB tape and an integrated circuit die 672a, 672b, 672c and 672d, which are bonded together as before. The frames 670 of TAB tape may be discrete frames as shown, or, in the alternative, can advantageously be a group of contiguous frames from the same length of TAB tape film. As illustrated, the TAB tape frames 670 have interconnection leads 664 that are disposed in two opposing directions from each of the integrated circuit dies 672. When the integrated circuit sandwich 650 comprising the plate 652, the TAB tape frames 670 and the integrated circuit dies 672 is mounted as part of a stack (not shown) of such sandwiches, the interconnection leads will be exposed on opposing sides of the stack and are thus interconnectable as described above, or as described hereinafter. The stack (not shown) will preferably have a rectangular configuration.

In the illustrated embodiment, the dies 672 have interconnections on only the two opposing sides. For the two inner dies 672b and 672c, the other two sides are not accessible. It should be appreciated that the two outer integrated circuit dies 672a and 672d each have an additional accessible edge which can include additional bonding pads (not shown) to provide additional interconnections. In such an embodiment, the TAB tape frames for the two end dies include corresponding additional interconnections paths (not shown) for completing the interconnections. It should also be appreciated, as set forth above, that discrete components (e.g., resistors, capacitors, transistors, and the like) can also be included as part of a the described multiple circuit sandwich 650 shown in FIGS. 49 and 50.

Figure 51:
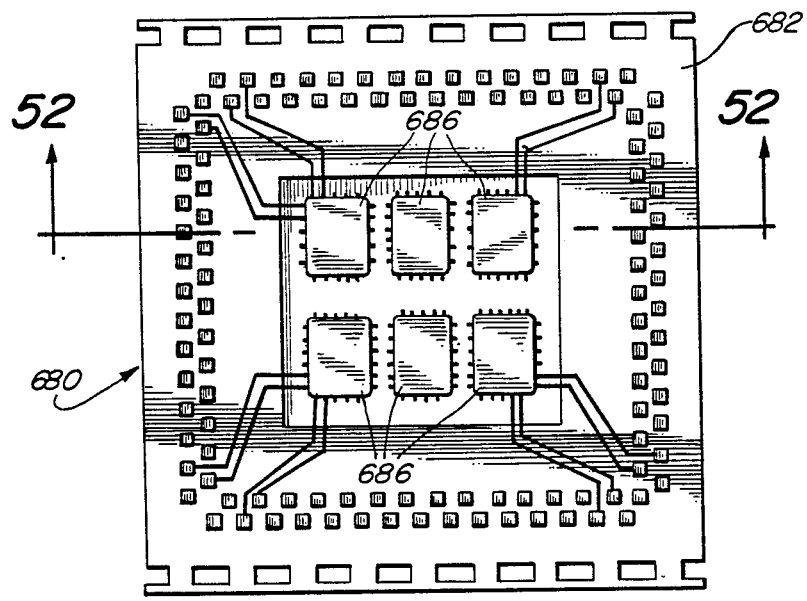
FIG. 51 is a plan view an alternative embodiment of a sandwich layer comprising a single TAB tape frame on an insulating plate, wherein the TAB tape frame provides interconnections for a plurality of integrated circuits.
Figure 52:
FIG. 52 is an elevation view of the alternative embodiment of FIG. 51 taken along the lines 52—52 in FIG. 51.

FIGS. 51 and 52 illustrate an alternative multiple integrated circuit sandwich 680 comprising a single TAB tape frame 682 which is bonded to a plate 682. The TAB tape frame 682 includes an interconnection pattern as before. A plurality of integrated circuit dies 686 are bonded to the TAB tape frame 682. Preferably, the TAB tape frame 682 is bonded to the plate 684 prior to the installation of the integrated circuit dies 686. The plate 694 provides mechanical stability for the TAB tape frame 682 during the integrated circuit bonding process. This is particularly advantageous when the integrated circuits 686 are bonded to the TAB tape frame 682 using re-flow soldering techniques, or the like, wherein the integrated circuits 686 and the TAB tape frame 682 are heated during the bonding process. Such re-flow solder techniques are frequently used during the installation of Gallium Arsenide integrated circuits, for example, because of the high operating temperatures of such circuits.

In the embodiment of FIGS. 51 and 52, the integrated circuit dies 686 can be mutually interconnected in part by the interconnection pattern of the TAB tape frame 682 to thereby reduce the number of interconnections required to connect the outer edges of the sandwich 680. This embodiment is particularly useful for interconnecting a plurality of memory circuits, for example, which have a number of common interconnection leads (e.g., the address lines). By thus including a number of such circuits on one sandwich layer 680, the number of sandwich layers can be reduced.

As with the embodiment of FIGS. 49 and 50, the sandwich 680 can advantageously include discrete components (not shown) as well as the integrated circuit dies 686. In both embodiments, the use of the multiple circuits per sandwich layer has advantages insofar as it is desirable to match the characteristics of certain components (for example, the access times of memory circuits or the thermal characteristics of analog integrated circuits). In addition, in certain high speed circuit applications, it is advantageous to reduce the lead lengths between certain integrated circuits. Also, as set forth above, it is advantageous to include decoupling capacitors, or the like, on the power lines to high speed integrated circuits.

Description of an Alternative Interconnection System

Figure 28:
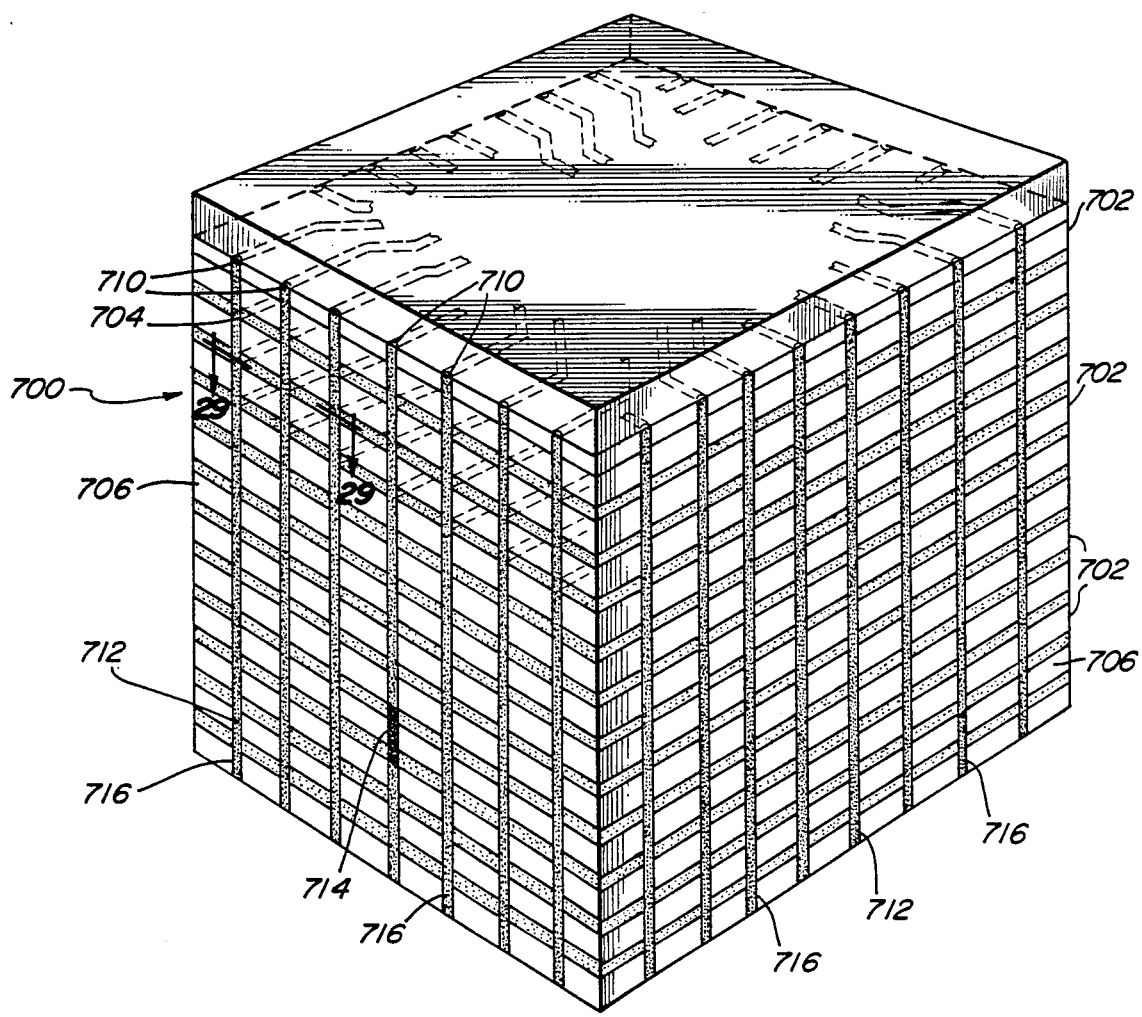
FIG. 28 is a perspective view of an alternative preferred embodiment of a stack of integrated circuit die sandwiches in accordance with the present invention, wherein the interconnections between the exposed ends of the sandwiches are performed by means of grooves.
Figure 29:
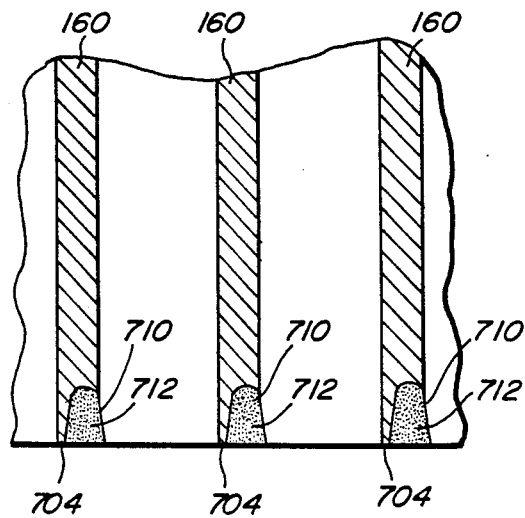
FIG. 29 is an enlarged cross-sectional view of the stack of FIG. 28, taken along the line 29—29 in FIG. 28.

FIGS. 28-29 illustrate an alternative preferred embodiment of the present invention utilizing a different technique for interconnecting the exposed conductor ends of the TAB tape conductor ends between the different layers of the stack. As discussed above, the stacks can have various forms, depending upon the structures of the unitary sandwiches utilized in the stacking process. For example, the stack 400 can be cylindrical as illustrated in FIGS. 16-26 when cylindrical insulating plates are used. The stack can also have a rectangular or a square configuration when the insulating plates have such a format, as illustrated for the stack 600 in FIG. 27. In certain applications of the present invention, plates having a square configuration have been found particularly advantageous and the following descriptions of alternative embodiments refer to the square configuration; however, it should be understood that in most cases, the alternative embodiments can also be constructed in the cylindrical configuration.

FIGS. 28 and 29 illustrate an alternative embodiment of the apparatus of the present invention in which the exposed TAB tape conductor ends are interconnected by an alternative interconnection method, referred to herein as the "grooved interconnect method." A stack 700 of square sandwich layers 702 has a plurality of exposed conductor ends 704 showing on the four side walls 706 of the stack 700. The side walls 706 of the stack 700 are first ground smooth so as to remove any remaining portions of the TAB film conductor ends 704 extending outside the sandwich layers 702, as well as to remove any protruding projections of the sandwich layers 702. Once the side walls 706 of the stack 700 have been ground, polished and generally cleaned to remove any residue from the grinding and polishing operation, a plurality of grooves 710 are formed in the side walls 706 along a corresponding plurality of paths connecting the exposed conductor ends 704. A number of techniques can be used to form the grooves 710. For example, a diamond saw can be adapted to a conventional grinding machine to saw the grooves into the side walls 706.

In the exemplary embodiment illustrated in FIG. 28, the number of grooves 710 sawn between the exposed conductor ends 704 is in conformance with the number of interconnection paths selected for a specific stack. For example, as illustrated, the exposed conductor ends 704 that are in the same vertical column are advantageously interconnected. In the exemplary embodiment, the grooves 710 have a width of approximately 0.1 millimeter and a depth of approximately 0.1 millimeter and are spaced apart from each other by approximately 0.2 millimeters.

After the grooves 710 have been formed in the side walls 706 of the stack 700, they are filled with a conductive medium 712 which is advantageously a conductive adhesive. The conductive adhesive 712 electrically interconnects the exposed conductor ends 704 along conductive paths defined by the grooves 710. The filling operation can be accomplished by a number of different methods. For example, a syringe filled with the conductive adhesive can be used to carefully apply the conductive adhesive 712 in the grooves 710. Alternatively, the conductive adhesive 712 can be applied with a squeegee or a sponge by coating the four side walls with the adhesive to assure that the grooves are filled in their entirety. One skilled in the art will of course understand that other groove filling methods can be used.

In exemplary embodiments of the invention, the conductive adhesive 712 used to fill the grooves 710 is a silver filled epoxy. Alternatively, a ceramic paste or a gold paste can be used as a conductive adhesive 712.

After filling the grooves, the conductive adhesive 712 is allowed to cure. The last step of the interconnecting operation consists in removing the excess conductive adhesive 712 from the sides 706 of the stack 700. For example, the adhesive 712 may be removed by sanding or lapping such that the adhesive which has overflowed a groove 710 onto the surrounding side wall 706 is removed so that only the adhesive 712 within a groove remains. Thus, only the exposed conductor ends 704 within the same linear groove 710 are interconnected by the conductive adhesive 712.

The interconnecting method set forth above is particularly advantageous as it simplifies the interconnection operation. This interconnection method also provides more accuracy in the interconnecting wiring. Groove sawing is typically an operation which does not require sophisticated or specialized tools. On the other hand, the groove sawing operation can be adapted to automatic milling machines since the exposed conductor ends 704 of the TAB tape are spaced apart by known distances. The described interconnect method has the further advantage that the relatively large cross-section of the grooves allows the resistance of the interconnection path to be greatly reduced compared to typical interconnect methods such as silk screening, or the like. It is known that the resistance of an elongated conductor is inversely proportional to the cross section thereof.

Another substantial advantage resides in the quality of the connection between the exposed conductor ends 704 of the stack 700 and the interconnection grooves 710. As the depth of the groove is relatively deep in view of the dimensions of the stack, a good electrical contact is ensured between the exposed conductor end 704 and the conductive adhesive 712 in the interconnection groove 710. As illustrated in FIG. 29 which is an enlarged cross-sectional view of the stack of FIG. 28, taken along the line 29—29 in FIG. 28, for each interconnection, the width of the groove 710 is typically less than the width of the corresponding exposed conductor ends 704. Thus, where a groove 710 intersects an exposed conductor end 704, it defines a trench within the exposed conductor end 704. The trench is filled with the conductive adhesive which provides a large contact area with the exposed conductor end 704 along the sides of the groove 710 as well as the bottom of the groove 710. The electrical interconnection produced by this method is a high quality interconnection because the contact area provides a low resistance connection between the exposed conductor end 704 and the conductive adhesive 710. The quality of this contact substantially reduces parasitic interconnecting resistances and assures high reliability and high yield to the stack.

Although described above, with respect to filling the grooves 710 with a conductive adhesive 712, it should be understood that the grooves 710 can be used in combination with other types of conductors to interconnect the exposed conductor ends 704 within the grooves 710. For example, in one alternative embodiment (not shown) a gold wire or other malleable electrical conductor can be "hammered" into position within the groove to provide the electrical interconnection between the exposed conductor ends 704.

Although the grooves 710 in the exemplary embodiment are shown to run the full vertical length of the stack 700, it should be understood that for some applications, interconnection between all the exposed conductor ends 704 in a single column may not be desirable. For example, it may be desirable to interrupt the vertical interconnection in a particular column between two of the sandwich layers 702, as illustrated in FIG. 28. In order to provide this interruption, or open circuit, an additional step is performed after the longitudinal grooves have been formed and before the conductive adhesive has been applied. In this additional step, a nonconductive medium 714, such as an electrically insulating epoxy, is first placed in the grooves at locations between the exposed conductor ends 704 that are to be insulated from each other. Conventional techniques may be used to place the nonconductive medium 714 into the grooves. For example, a silk screen may be conveniently disposed around the stack 700 to selectively place the nonconductive medium 714 in the grooves 710. Alternatively, a dispenser of this nonconductive medium 714, for example, a syringe, is positioned proximate to the stack 700 and is movable to the selected locations in the grooves 710 where the nonconductive medium 714 is dispensed into the groove 710.

After the nonconductive medium 714 has been placed in the grooves 710, the grooves 710 are uniformly filled with the conductive material 712 in accordance with the method set forth hereinabove. The nonconductive medium 714 advantageously fills the groove 710 at the selected locations and thus blocks the conductive material 712 at those locations to thereby interrupt the electrical interconnection. As before, the side walls 706 of the stack 700 are polished and cleaned to remove any of the conductive adhesive 712 or any of the nonconductive medium 714 that may have overflowed the grooves 710 in either of the two filling processes. The completed interconnection paths formed by the filling and cleaning steps will be referred to as the interconnection paths 716.

This method of interconnecting the exposed conductor ends of the stack to provide the interconnection paths 716 has several advantages. As mentioned above, the grinding operation is greatly simplified. It is well known in this art that accurate grinding of grooves in a substrate along specific paths is a more delicate operation than the mere dispensing of epoxy along predetermined itineraries. A second advantage lies in the reduction or suppression of any potential short circuits associated with the closely-spaced interconnection paths 716. The exposed conductor ends 704 and the interconnection paths 716 are surrounded with the non-conductive plate material of the sandwiches. Thus, the interconnection paths are well insulated from each other.

Description of an Alternative Input/Output Connection System

As discussed above in connection with FIGS. 21 to 26, a completed stack of integrated sandwiches can be interconnected with a printed circuit board by using wire bonding techniques. FIGS. 30 to 34 illustrate an alternative method for interconnecting the interconnection paths (e.g., the grooved interconnection paths 716 of FIG. 28 or the interconnection paths 496 of FIG. 22) to a printed circuit board or to the connector pins of a conventional ceramic chip carrier. The connector pins of the chip carrier, for example, are in turn connectable to a printed circuit board in a conventional manner. A preferred method for connecting the interconnection paths 716 of the stack 700 to an external circuitry will be described hereinbelow in connection with a square sandwich embodiment and the grooved interconnect method; however, it should be understood that the following discussion applies to the previously discussed embodiments.

Figure 30:
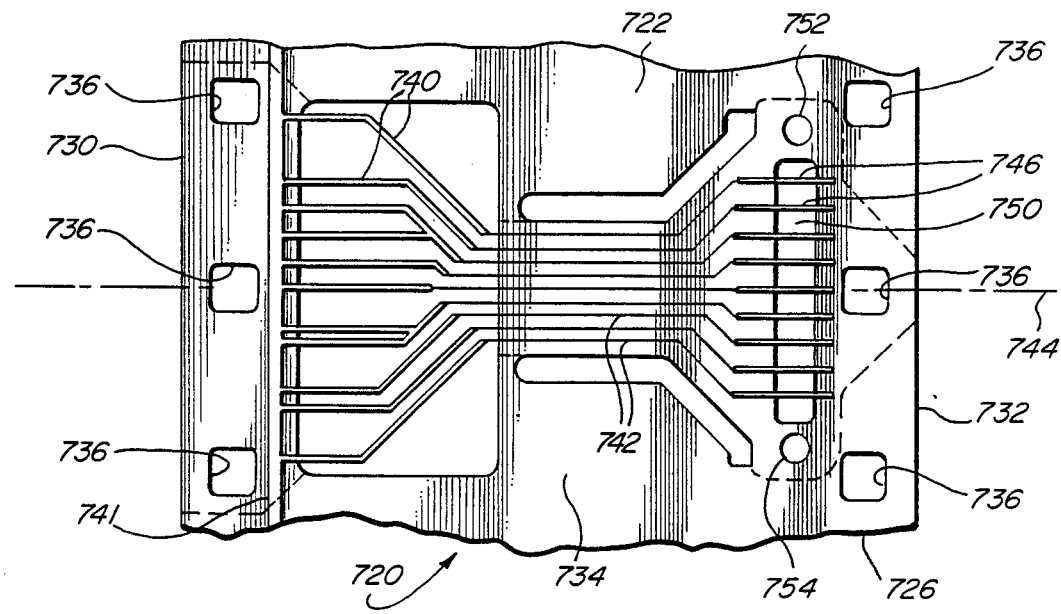
FIG. 30 is a plan view of a frame of an exemplary tape automated bonding (TAB) tape used to provide electrical interconnections between a stack of integrated circuit die sandwiches and an external circuitry.
Figure 31:
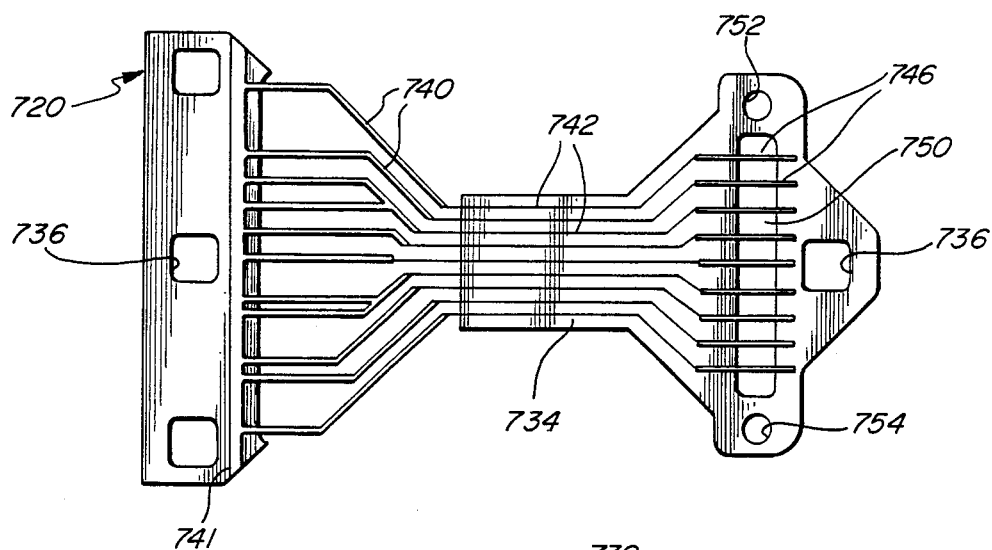
FIG. 31 is a plan view of the TAB tape of FIG. 30 after trimming and removal of TAB film from the TAB tape of FIG. 30.
Figure 32:
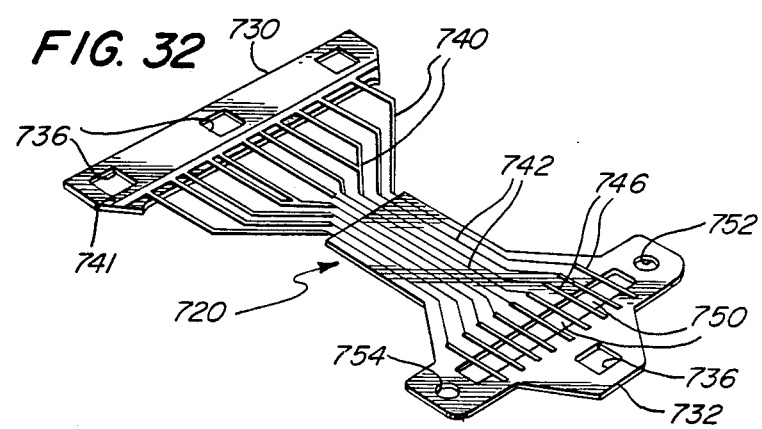
FIG. 32 is a perspective view of the TAB tape of FIG. 31 showing the interconnection leads and the interconnection fingers.

In order to connect the interconnection paths 716 to external bonding pads of an external chip carrier, or the like, a preferred embodiment of the present invention utilizes a special TAB tape 720 that is especially configured for such external interconnection. As illustrated in FIGS. 30-32, the TAB tape 720 includes an insulating film substrate 722 that has a top surface 724 and a bottom surface 726. Furthermore, the TAB tape 720 has a proximal edge 730, a distal edge 732 and a central portion 734 therebetween. The terms proximal edge and distal edge are used herein to distinguish the left edge from the right edge in FIG. 30 and are used hereinafter with reference to the dissimilar features of the two edges.

The substrate 722 is typically a polyimide film and includes a plurality of evenly spaced sprocket holes 736 along the proximal and distal edges 730 and 732. The sprocket holes 736 are used to advance and position the film substrate 722 during the production and the application of the TAB tape 720. The TAB tape 720 further comprises an interconnection pattern that is applied to the top surface 724 of the insulating substrate 722, as previously discussed. The interconnection pattern comprises a set of terminal leads 740 proximate to the proximal edge 730. The terminal leads 740 are connected to one another by an interconnection rim 741 running along the proximal edge 730 of the TAB tape 720. The spacing of the terminal leads 740 with respect to each other corresponds to the spacing of the interconnection paths 716 of the stack 700, or a multiple of the spacing of the interconnection paths. As will be discussed below, the terminal leads 740 are interconnected with the interconnection paths 716 during the final construction of a stack of sandwiches.

The set of terminal leads 740 are connected to a second set of interconnection leads 742 which extend across the central portion 734 of the TAB tape 720. The number of interconnection leads 742 may be different than the number of terminal leads 740. In the exemplary TAB tape 720 described herein, most of the terminal leads 740 have a one-to-one interconnection with corresponding interconnection leads 742. However, as shown in FIG. 30, two, or more, terminal leads 740 may be connected to the same interconnection lead 742. Preferably, the terminal leads 740 converge toward a central longitudinal axis 744 of the TAB tape 720 to intersect the interconnection leads 742 so that the interconnection leads 742 are advantageously more closely spaced than the terminal leads 740, thus enabling the central portion 734 of the TAB tape 720 to have a narrower cross section in the plane of the interconnection leads 742. Proximate to the distal edge 732 of the TAB tape 720, the interconnection leads 742 diverge into a corresponding plurality of evenly spaced interconnection fingers 746. The interconnection fingers 746 are spaced apart to substantially match the spacing of the bonding pads of an exemplary chip carrier or the like, as will be discussed more fully below.

The interconnection pattern comprising the interconnection rim 741, the terminal leads 740, the interconnection leads 744 and the interconnection fingers 746 are preferably formed on the insulated substrate by photolithographic techniques well-known in the art so as to provide accurate alignment of the terminal leads 740 and of the interconnection fingers 746 with respect to the sprocket holes 736.

The TAB tape 720 is further processed in order to be utilized to provide the interconnections to the chip carrier in accordance with the present invention. For example, the polyimide film comprising the substrate 722 is typically trimmed so that only a small boundary portion of the film remains around the interconnection leads 742 and the interconnection fingers 746 to facilitate the handling of the TAB tape 720 during the remaining portions of the installation of the TAB tape 720 described hereinafter. Trim lines are thus advantageously defined by predefined openings around the interconnection pattern when the TAB tape 720 is formed, as shown in FIG. 30. Thus, the amount of additional trimming required is minimized. When trimmed, the TAB tape 720 appears as in FIG. 31 and in FIG. 32 which is a perspective view of the TAB tape 720 of FIG. 31. The terminal leads 740 are held in fixed spaced apart relationship by the interconnection rim 742, and the interconnection leads 742 are held in place by the film of the central portion 734. Advantageously, portion of the substrate 722 proximate to the distal edge 732 includes an elongated window 750 which exposes portions of the interconnection fingers 746 so that the exposed portions of the interconnection fingers 746 do not have any insulating material around them. At the same time, the portion of the substrate 722 between the elongated window 750 and the distal edge 732 holds the interconnection fingers 746 in a predetermined spaced apart relationship. Preferably, the substrate 722 includes a first locating hole 752 proximate to one end (i.e., the upper end as shown in FIGS. 30–31) of the elongated window 750 and a second locating hole 754 proximate to the opposite end (i.e., the lower end in FIGS. 30–31) of the elongated window 750. Also preferably, after trimming the TAB tape 720, at least one sprocket hole 736 remains defined proximate to the distal edge 732 of the substrate 722 between the distal edge 730 and the elongated hole 750. Also preferably, at least one sprocket hole 736 and, more preferably, at least two sprocket holes 736, remain defined proximate to the proximal edge 730 of the substrate 722 between the proximal edge 730 and the interconnection rim 741. As will be discussed below, the sprocket holes 736 are used for alignment of the TAB tape with respect to a sandwich structure.

Figure 33:
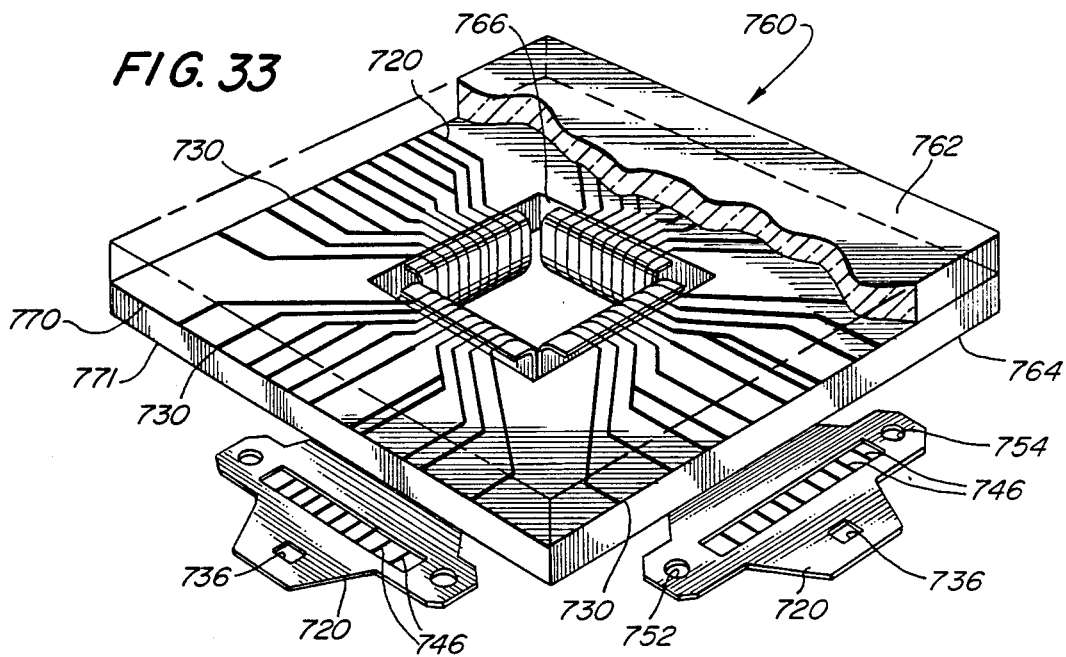
FIG. 33 is a top perspective view of an exemplary interconnection sandwich structure incorporating the interconnection TAB tape of FIG. 31.
Figure 34:
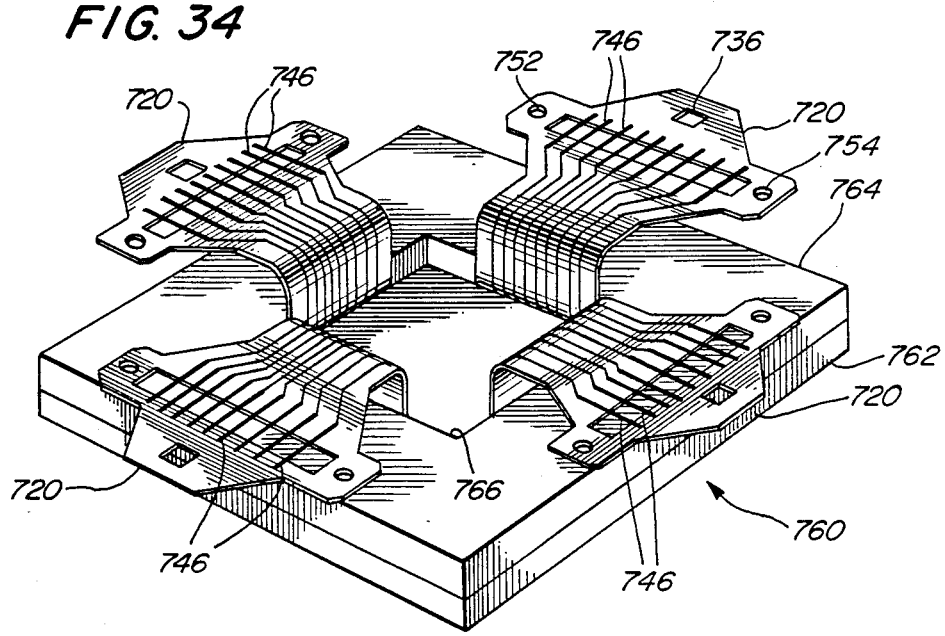
FIG. 34 is a bottom perspective view of the sandwich structure of FIG. 33 showing the interconnection fingers protruding from the aperture provided in the sandwich structure of FIG. 34.

FIGS. 33 and 34 are perspective views respectively showing the top and the bottom of an exemplary sandwich structure 760 that incorporates the above-described interconnection TAB tape 720 of FIGS. 30 to 32. As illustrated, the sandwich structure 760 includes a top (or upper) plate 762 and a bottom (or lower) plate 764 which have a substantially square configurations. The top plate 762 and the bottom plate 764 preferably comprise a suitable insulating material such as ceramic. As illustrated, the top plate 762 is preferably solid. In other words, there are no openings in the top plate. In contrast, the bottom plate 764 includes an opening or aperture 766 at the approximate center of the bottom plate 764. Preferably, as illustrated, the aperture 766 is square, although other configurations of apertures can also be used. The TAB tape 720 is mounted between the top plate 762 and the bottom plate 764 so that the interconnection leads 740 are firmly secured therebetween with the interconnection leads 740 substantially perpendicular to the edges of the two plates 762, 764. As shown in FIGS. 33 and 34, more than one unit of special TAB tape 720, can be positioned between the top plate 762 and the bottom plate 764. In the exemplary embodiment represented in FIGS. 33 and 34, four of the above-described TAB tapes 720 are used.

A suitable fixture (not shown) can be advantageously utilized that has alignment posts for receiving the proximal sprocket holes 736 to provide the proper alignment of the interconnection leads 740 with respect to the edges of the top and bottom plates 762 and 764. The top plate 762 and the bottom plate 764 are held together by a suitable bonding material so as to form one composite sandwich assembly 760 with the TAB tape 720 secured between the top plate 762 and the bottom plate 764. For example, the bonding material can be the ultraviolet light cured epoxy described above. It should be understood that variations of the two plates 762, 764 can be used as long as they conform to the configuration of the stack to which they are to be mounted. For example, if the stack is cylindrical, the plates 762, 764 have the form of a circular disk having a square aperture.

The distal edges 732 of the TAB tapes 720 pass through the aperture 766 so that the interconnection leads 746 and the interconnection fingers 746 extend through the aperture 766. The interconnection leads 742 are folded around the inner edges of the bottom plate 764 that define the aperture 766 so that the interconnection fingers 746 are directed outward towards the outer edge of the bottom plate 764. As will be described in more detail below, the interconnection fingers 746 are used to interconnect the stack 700 to an external circuit, such as a printed circuit board.

During the positioning of the special TAB tape 720 between the top plate 762 and the bottom plate 764, the proximal edge 730 of the special TAB tape 720 is aligned with the outer edge 770 of the top plate 762 so that the terminal leads 740 substantially abut on the outer edge 770 of the top plate 762. The interconnection rim 741 thus protrudes from the outer edge 770 of the top plate 762. The interconnection fingers 746 of the special TAB tape 720 may be thereafter bonded on the bottom surface of the bottom plate 764, or may pass through another plate to be bonded to a external circuitry as will be explained in more detail hereinbelow. The dimensions of the TAB tape 720 and of the plates 762 and 764 have been carefully selected so that the interconnection fingers 746 of the TAB tape 720 folded around the aperture 766 of the bottom plate 764 extend outwardly from the outer edge 771 of the bottom plate 764. Thus, the interconnection fingers 746 protrude from the bottom plate 764 as well as the locating holes 752 and 754, and the sprocket holes 736.

Figure 35:
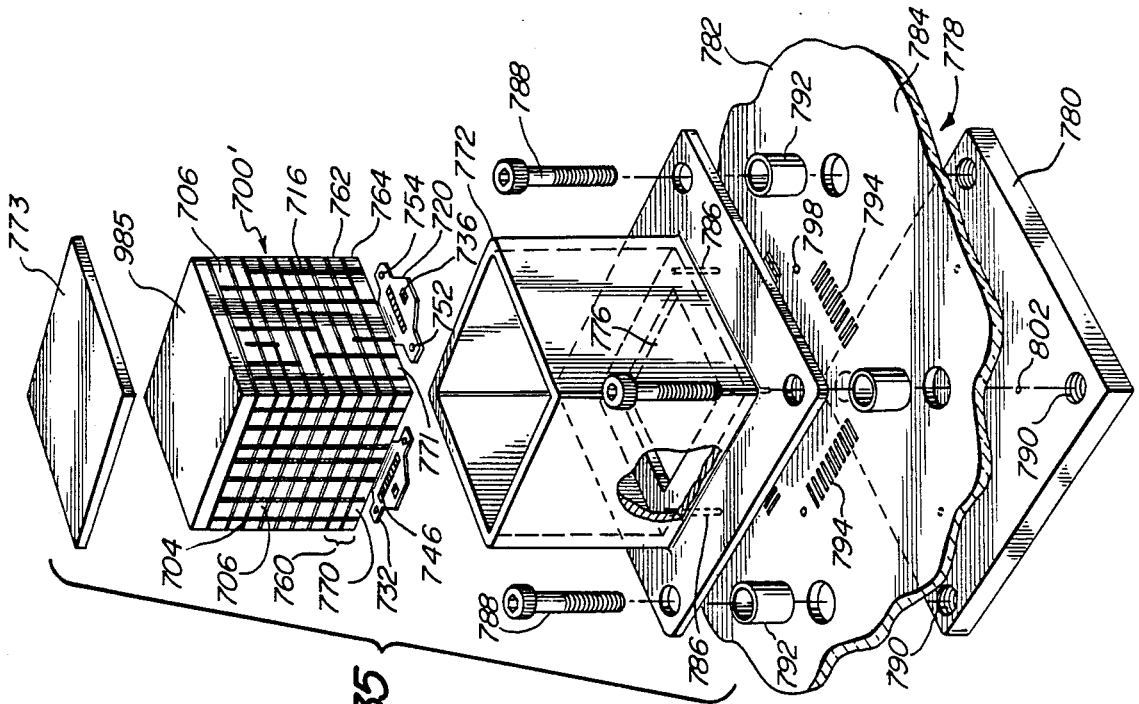
FIG. 35 is an exploded view in perspective of a stack of integrated circuit die sandwiches incorporating the interconnection sandwich structure of FIG. 33 in connection with a conventional circuit board and including a housing.

After the four units of TAB tape 720 have been mounted and bonded into the sandwich assembly 760, the interconnection rim 741, the interconnection fingers 746 and the proximal sprocket holes 736 of each TAB tape 720 protrude from the outer periphery of the plates 762 and 764. In preferred embodiments of the present invention, as illustrated in FIG. 35, the completed sandwich assembly 760 is positioned with respect to the bottom of a stack 700' so that the center of the top plate 762 is centered with respect to the center of the bottom surface of the stack 700'. This is accomplished by using the sprocket holes 736 extending outwardly from the TAB tape portions 720 as a reference. The dimensions of the plates 762 and 764 have been carefully selected to correspond to the dimensions of the cross-section of the stack 700' so that the outer edges 770 and 771 of the sandwich assembly 760 provide extensions of the sidewalls 706 of the stack 700'. The sandwich assembly thus positioned is bonded to the lowermost sandwich in the stack 700'. In exemplary embodiments of this aspect of the invention, the sandwich assembly 760 is added to the stack 700' at the same time as the circuit die sandwiches as part of one stack construction operation. Thus, it can be seen that the sandwich assembly 760 is added to the stack 700' as if it were an additional circuit die sandwich such have been previously described. It should be noted that the bottom plate 762 and the TAB tapes 720 may be bonded directly to the bottom of the lowermost circuit die sandwich in the stack 700', thus omitting the top plate 762.

After completion of the stack 700', the interconnection rims 741 and the excess film and terminal leads 740 of the TAB tapes 720 are removed from the plates 762 and 764 using the grinding and polishing techniques discussed above. The interconnection paths 716 are then formed by the groove and fill method discussed above, or by one of the other interconnection methods. Thus, the terminal leads 740 are interconnected with the exposed conductor ends 704 of the circuit die sandwiches. Preferably, the terminal leads 740 are used for input and output connections so that not all of the interconnection paths 716 are connected to the terminal leads 740. Thus, there may advantageously be less terminal leads than there are interconnection paths 716.

As described above in connection with the previous embodiments, preferably the thermal output of the circuit dies is conducted through the stack to the top and/or bottom of the stack. Preferably, the portion of the TAB tape 720 between the top plate 762 and the bottom plate 764 is devoid of the film substrate 722 so that heat can be directly conducted from the circuit die sandwich immediately above the sandwich assembly 760 in the stack 700' through the top plate 762, the interconnection leads 744 and the bottom plate 764 and thus to a heat sink (not shown) which may be mechanically connected to the bottom plate 764. In an alternative embodiment of the interconnection assembly of the present invention wherein heat dissipation through the bottom plate 764 is not required, the TAB tapes 720 may include the polyimide film around the interconnection leads 742 to facilitate the handling of the small interconnection leads.

The completed stack 700' is electrically connectable to an external circuit via the interconnection fingers 746 which extend through the aperture 766 in the bottom of the stack 700'. The interconnection fingers 746 of the distal portions of the TAB tape portions 720 are connectable to the wires of an external circuitry according to various methods schematically illustrated in FIGS. 35 to 37. In FIG. 35, the stack 700' is placed into a housing 772 having a top 773 and a base 774. The base 774 of the housing 772 is provided with an aperture 776 that is aligned with the aperture 766 and through which the distal interconnection fingers 746 of the TAB tape portions 720 of the interconnection assembly are passed. The dimensions of the aperture 776 of the housing 772 are selected to match the dimensions of the aperture 766 of the bottom plate 764. Thereafter, the housing base 774 is positioned against a circuit board assembly 778.

Figure 36:
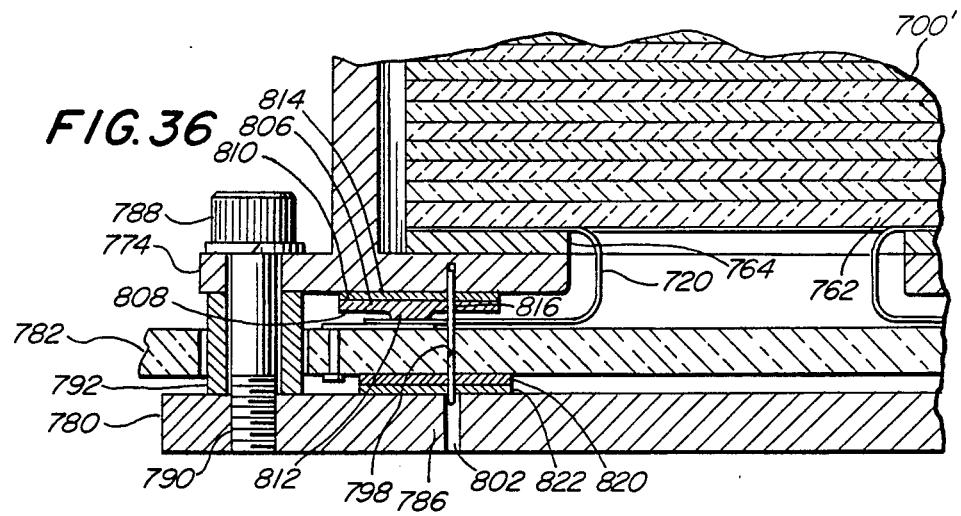
FIG. 36 is a cross-sectional view of the interconnection assembly between the stack of FIG. 35 and a conventional circuit board.

The circuit board assembly 778 preferably comprises a base plate 780 and a circuit board 782 having a top surface 784 secured to the base plate 780. The base 774 of the housing 772 protrudes slightly from the stack so as to define a ledge 786. The entire housing 772 is securely clamped to the base plate 780 of the circuit board 782 assembly by means of a plurality of screws 788, only one of which is illustrated in FIG. 36. The screws 788 are inserted through an a plurality of threaded openings 790 in the ledge 786 and screwed into the base plate 780 of the circuit board assembly 778. As the circuit board 782 is sandwiched between the housing base 774 and the base plate 780, spacers 792 are provided therebetween in order not to damage the circuit board 782 by application of the pressure obtained through the tightening of the screws 788.

The circuit board 782 is typically a conventional multi-layer circuit board comprising on the top surface thereof a plurality of conductors forming a wiring pattern 794. The wiring pattern 794 is positioned in coincidence with the pattern of interconnecting fingers 746 of the TAB tape portions 720. The circuit board conductors of the wiring pattern 794 can take the form of bonding pads or of connector pins. In order to provide the proper electrical interconnection between the pattern of interconnecting fingers 746 and the wiring pattern 794 of the circuit board 782, the interconnecting fingers 746 must be aligned with the wiring pattern 794. Preferably, the alignment of the TAB tape portions 720 with respect to the wiring pattern 794 of the circuit board 782 is accomplished by means of a pair of alignment pins 786 lodged into the circuit board 782 through corresponding orifices 798 in the circuit board 782. In FIG. 36, one of the alignment pins 786 is shown passing through the orifice 798 provided in the circuit board 782 and further extending towards the stack 700' through the locating hole 754 located in the substrate 722 of the TAB tape 720. It should be understood that the other alignment pin 786 will pass through the locating hole 752. As the locating holes 752 and 754 of the TAB tape portions 720 are preferably located proximate to the elongated hole 750 in the substrate 722, the bare portions of the interconnecting fingers are aligned with the wiring pattern 794. Preferably, at least a portion of the substrate 722 between the elongated hole 750 and the distal edge 732 is left on the interconnecting fingers 746 to prevent the interconnecting fingers 746 from moving once aligned with the wiring pattern 794. The distal sprocket hole 736 may be removed. Two orifices 802 matching the orthogonal projections of the locating holes 752, 754 are provided in the base plate 780 of the housing 772 to receive the alignment pins 786. Preferably, the alignment pins 786 are press fit into the housing 772. Other alignment methods can also be contemplated by the skilled person in the art.

Referring now to FIG. 36, a pressure plate 806 (not shown in FIG. 35) is interposed between the base plate 774 of the housing 772 and the circuit board 782 in order to assure a low-resistance electrical connection between the interconnection fingers 746 and the wiring pattern 794. More specifically, the pressure plate 806 is applied against the interconnection fingers 746 so as to force the interconnection fingers 746 against the wiring pattern 794. The pressure plate 806 has a lower surface 808 and an upper surface 810. It is generally flat and comprises a raised middle portion 812 of reduced area on the lower surface 808. This configuration preferably used so as to increase the pressure on the interface 807 between the interconnection fingers 746 and the wiring pattern 794. In order that the pressure be substantially directed to the raised middle portion 812, a plate 814 made of resilient material, preferably an elastomer, is advantageously interposed between the pressure plate 806 and the base 774 of the housing 772. Alignment orifices 816 and 818 are also provided through the pressure plate 806 and the resilient plate 814 to enable passage of the alignment pins 786. In an alternative embodiment of the present invention, the circuit board may also be insulated from the base plate 780 of the circuit board 782 by means of a rigid plate 820 and a plate 822, preferably made of resilient material, such as an elastomer. These plates 820 and 822 are sandwiched between the circuit board 782 and the base plate 780. The use of elastomer in the preferred embodiment allows substantial pressure to be applied without deformation of the interconnection fingers 746 or the wiring pattern 794.

Figure 37:
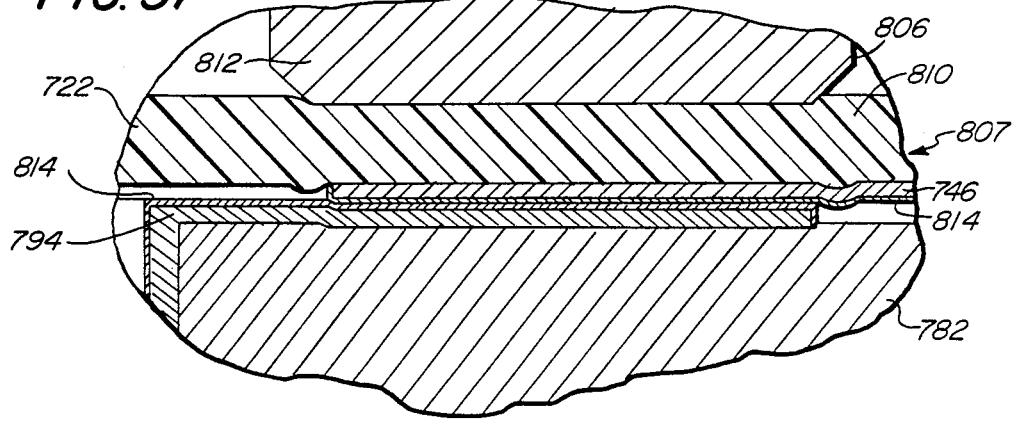
FIG. 37 is an enlarged cross-sectional view of the interconnection interface between the interconnection fingers of the TAB tapes protruding from the stack of integrated circuit die sandwiches of FIG. 35 and the conductors of the circuit board.

Reference is now made to FIG. 37 which is an enlarged cross-sectional view of the interface 807 between the interconnection fingers 746 of the TAB tape portion 720 and the wiring pattern 794 of the circuit board 782. The electrical interface 807 is greatly improved by means of a gold layer 814 plated on both sides of the interconnected elements, namely on the lower surface of the interconnection fingers 746 of the TAB tape portion 720 as well as on the wiring pattern 794 on the circuit board 782. The circuit board 782 is typically composed of a bulk portion made of an electrically non-conductive material. This material may consist of fiberglass-epoxy, polyimide or PTFE. Any conventional non-conductive material can be used. The wiring pattern 794 of the circuit board 782 preferably comprises copper or other highly conductive material. By applying substantial pressure (e.g., up to 1000 pounds per square inch through the raised pressure plate), to force the pressure plate 806 against the interconnection fingers 746 of the TAB tape portions 720, a "gas tight-"electrical connection can be procured. It can be seen in FIG. 37, that there is also a layer of the polyimide TAB film substrate 722 between the pressure plate 806 and the interconnection fingers 746. This layer, comprising a portion of the substrate 722 between the elongated hole 750 and the distal edge 732 is present in the alternative preferred embodiment shown in FIG. 37 to prevent the lateral movement of the interconnection fingers 746 off the wiring pattern 794 when pressure is applied.

Figure 40:
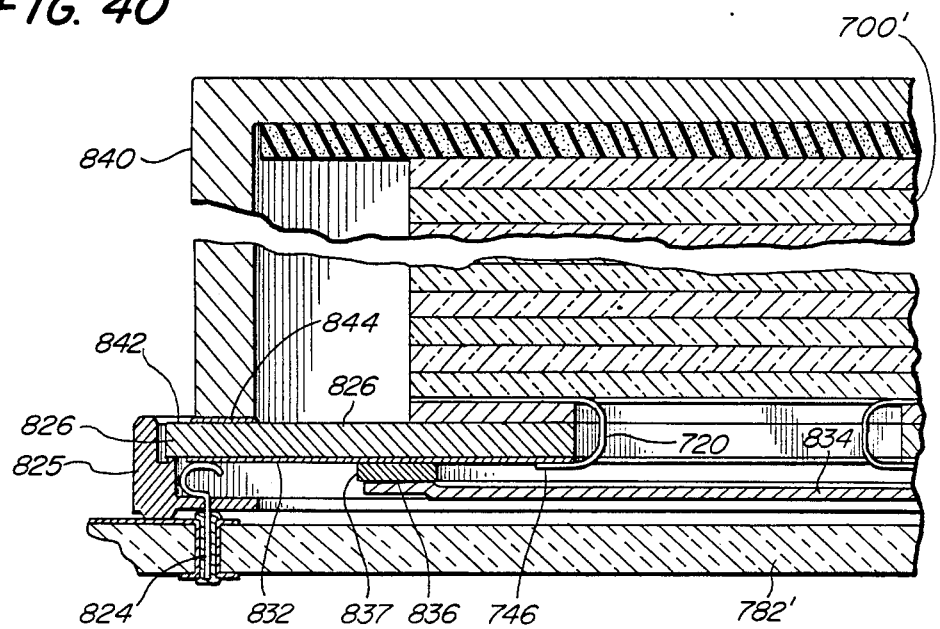
FIG. 40 is a cross-sectional view of the interconnection interface between the interconnection fingers of the TAB tapes protruding from the stack of integrated circuit die sandwiches of FIG. 38 and the connector pins of the external circuit board assembly.

FIGS. 38 to 40 illustrate an alternative embodiment that utilizes an alternative method for interconnecting the interconnection fingers 746 of the TAB tape portions 720 with a plurality of connector pins 824 of a conventional ceramic chip carrier 825 which can be connected to a circuit board 782'. In this embodiment, the base of the stack 700' is first positioned on a flat interconnect plate 826, preferably made of ceramic. The interconnect plate 826 comprises a top surface 828, a bottom surface 830 and a plurality of conductors 832 on the bottom surface 830 thereof. The conductors 832 are preferably made of conductive ceramic that are fired on the bottom surface 830 of the interconnect plate 826 to fuse them to the bottom surface 830. For example, the conductors 832 advantageously comprise gold frit. Other conventional conductors can also be used for this purpose.

The flat ceramic plate 826 further comprises an aperture 834 corresponding to the central aperture 766 of the bottom plate 764. The interconnection fingers 746 of the TAB tape portions 720 extend through the two apertures 766 and 834 and are subsequently bonded to the conductors 832 on the bottom plate 830 of the interconnect plate 826.

The embodiment of FIG. 38 further includes a lower sealing ring 836 mounted on a raised ceramic ridge 837 which is preferably fused to the bottom surface 830 of the interconnect plate 826 as part of the firing step when the conductors 832 are fused to the bottom surface 830. The lower sealing ring 836 is positioned coaxially to the interconnect plate 826 and preferentially comprises a metallized ceramic or other suitable material known to the art. After the interconnection fingers 746 of the TAB tape portion 720 are connected to the conductors 832 of the interconnect plate 826, a lower cover 838, typically made of metal, is secured to the lower sealing ring 836. Numerous methods can be used to attach the lower cover 838 to the lower sealing ring 836. In the preferred embodiment of the present invention, the lower cover 838 is welded to the lower sealing ring 836. It can also be soldered or brazed thereto. The welding of the lower cover 838 to the lower sealing ring 836 provides a gas-tight (i.e., hermetic seal) between the lower cover 838 and the interconnection plate 826.

Thereafter, in order to ensure that the stack assembly is hermetically sealed, a case 840 for enclosing the stack 700' is positioned on the top surface 828 of the interconnect plate 826. The dimensions of the interconnect plate 826 are such that it slightly overlaps the outer periphery of the stack 700' and thereby defines a ledge 842. During the firing of the interconnect plate 826, an upper sealing ring 844, preferably comprising a metal, such as gold, or the like, is fused to the upper surface 728 of the interconnect plate 826. The case 840 is hermetically secured to the upper sealing ring 844 of the interconnect plate 826, typically by welding. By hermetically sealing the case 840 to the upper sealing ring 844 and sealing the lower cover 838 to the lower sealing ring 836, the entire stack assembly 700' is thereby hermetically isolated from the ambient environment. The assembly method illustrated in FIGS. 38 to 40 thus provides a hermetic seal around the stack 700' without depending on any of the stacking joints for the sealing function.

As further illustrated in FIG. 38, the sealed stack assembly can be positioned in the conventional ceramic chip carrier 825 having the plurality of connecting pins 824 therein. The connecting pins 824 contact the portions of the ceramic conductors 832 extending through the seal formed as described above to electrically connect the completed stack assembly to the connecting pins 824. As is known to the art, the connecting pins 824 extend through the bottom of the chip carrier 825 and are connectable to a conventional socket or conventional socket pins in the printed circuit board 782'.

In an alternative sealing method (not shown), a low melting glass (i.e., a glass frit) is used to seal the TAB tape interconnection leads 742 between the upper and lower plates 762 and 764 so that the interconnection leads 742 are surrounded by the glass to provide a gas-tight seal so that the bottom of the stack 700' is sealed. This alternative sealing method can be used in combination with the case 840, described above. As a further alternative, the conductive ends of all the TAB tapes in each layer of the stack 700' can be advantageously sealed using the glass frit to provide a gas-tight seal without an external case or sealing cover.

Description of an Alternative Circuit Bonding System

FIGS. 41 to 44 illustrate alternative embodiments of the integrated circuit die assembly of the present invention wherein the insulating plate 180 of FIGS. 5 and 6, is replaced with an insulating plate 900 that has a top surface 902 and a bottom surface 904. The top surface 902 comprises a central recessed top surface cavity 906. This top surface cavity 906 is formed in accordance with well-known methods. For example, the top surface cavity 906 can be obtained by molding or pressing. Ceramic material can also be formed with the cavity therein before firing the ceramic. The top surface cavity 906 is dimensioned so as to be larger than an integrated circuit die 100', which may be similar to the die 100 of FIG. 1. As illustrated in the embodiment of FIGS. 41 to 44, the shape of the top surface cavity 906 is preferably a square. The top surface cavity 906 has side walls 908 and a bottom surface 910. The walls 908 of the top surface cavity 906 can be flat or may comprise a plurality of steps. In this alternative preferred embodiment, the die 100' is positioned in the top surface cavity 906 with its bonding pads 120' facing the top surface 902 of the insulating plate 900. The depth of the top surface cavity 906 is greater than or equal to the thickness of the die 100' and the bottom surface 910 of the top surface cavity 906 is substantially flat, so that when the die 100' is positioned within the top surface cavity 906, it does not extend therefrom. The integrated circuit die 100' is preferably secured within the cavity of the insulating plate 900 by silicon-gold eutectic brazing. It can also be bonded thereto using a conductive epoxy. The insulating plate 900 has the form of a square in FIGS. 41 to 44, but it should be understood that a circular or a rectangular insulating plate can be utilized without departing from the spirit of the present invention.

Figure 41:
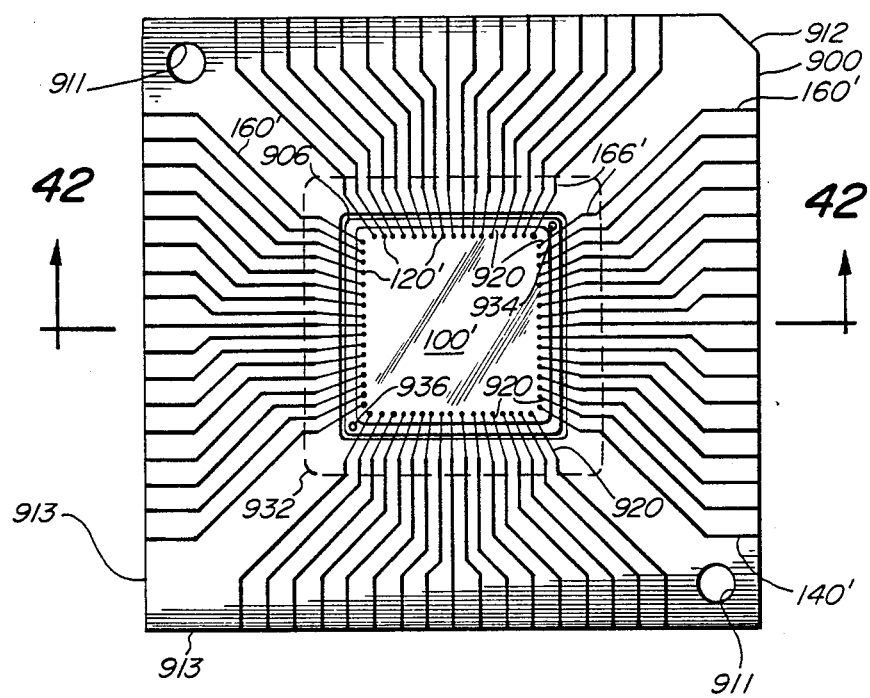
FIG. 41 is a plan view of an alternative embodiment of a die sandwich structure in accordance with the present invention showing an alternative TAB tape having a plurality of interconnection leads and an aperture and further showing an integrated circuit die on a flat insulating plate provided with a cavity.
Figure 42:
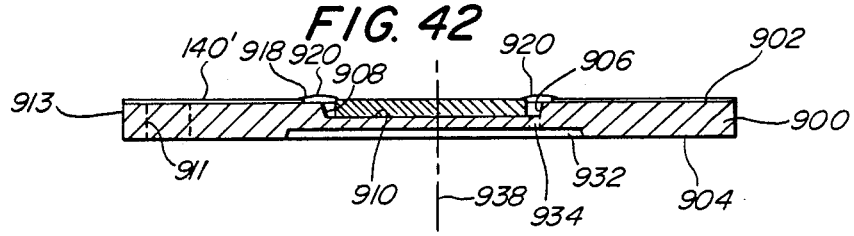
FIG. 42 is a cross-sectional view of the sandwich structure of FIG. 41 along the line 42—42 of FIG. 41.
Figure 43:
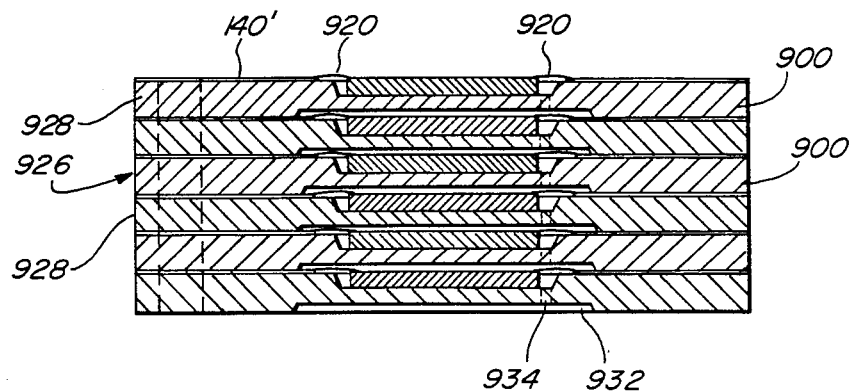
FIG. 43 is a cross-sectional view of an exemplary stack of die sandwiches in accordance with the present invention incorporating the sandwich structure of FIG. 41.

A TAB tape 140', which may be similar to the previously described TAB tape 140, is mounted on the insulating plate 900 in accordance with the methods discussed hereinabove in connection with the description of FIGS. 2-4. Thus, after the die 100' has been positioned in the top surface cavity 906 of the insulating plate 900, the TAB tape 140' is applied against the top surface of the insulating plate as described in the previous embodiments of the present invention. The TAB tape 140' is shown after the removal of the sprocket holes. In the embodiment illustrated in FIGS. 41-44, a pair of positioning holes 911 are formed in the insulating plate 900 to provide alignment. When a plurality of completed plates 900 are combined to form a stack, as illustrated in FIG. 43, the alignment holes 911 are positioned over alignment rods (not shown) to align the plates 900 with respect to each other. Other alignment features can also be used. For example, in some applications of the present invention, it is advantageous to include a modified corner 912 on each plate 900 to properly orient the plates 900 to assure the proper interconnection of the TAB leads 160' on one layer with the TAB leads 160' on adjacent layers having the corresponding signal connections. In FIG. 41, the upper left corner 912 has been beveled. Other positioning indicia can also be used.

The interconnection leads 160' are similar to the previously described interconnection leads 160. In one embodiment of this aspect of the invention, the TAB tape interconnection leads 160' are connected directly to the bonding pads 120' on the die 100', as described with respect to the previous embodiments. In this embodiment (not shown), the TAB tape interconnection leads 160' are bonded to the die 100' before the die 100' is inserted into the upper surface cavity 906. Unlike the previously described embodiments, the die 100' is positioned with its face up (i.e., exposed) rather than face down.

FIGS. 41-44 describe an alternative interconnection system in which the TAB tape interconnection leads 160' are truncated outside the boundary of the upper surface cavity 906 and thus do not extend to the bonding pads 120' of the die 100'. Preferably, the interconnection leads are terminated in fingers or ends 166,. The TAB tape 140' is bonded to the insulating plate 900 as described above in connection with the previously discussed embodiments of the present invention. After bonding the TAB tape 140' to the insulating plate 900, the portions of the TAB tape 140' protruding from the outer periphery 913 of the insulating plate 900 are removed so that only the interconnection leads 160' remain on the insulating plate 900, as illustrated in FIGS. 41-44.

The interconnection operation between the fingers 166' of the truncated interconnection paths 160' of the TAB tape 140' and the bonding pads 120' of the die 100' is accomplished by means of a plurality of bonding wires 920. Conventional techniques for bonding wires from the ends 166' of the truncated interconnection paths 160' of the TAB tape 140' to the bonding pads 120' of the die 100' can be used. Such bonding techniques may be advantageous over the direct TAB film/die connection techniques described above in connection with other preferred embodiments of the present invention when the number of interconnections is sufficiently reduced (generally less than 100) to render the wire bonding technique more convenient and more economical.

Referring again to FIG. 41 the ends 166' of the truncated interconnection paths 160' of the TAB tape 140' are typically larger than the terminal pads of untruncated interconnection paths 160' of the TAB tape 140'. As the interconnection leads 160' of the TAB tape 140' are convergent towards the center of the TAB tape 140', the peripheral paths are substantially larger in area than the central interconnection paths. Typically, the ends 166' of the truncated interconnection paths 160' have a width approximately equal to 0.008 inch (0.2 millimeters), whereas the ends of un-truncated interconnection paths in the central region of the TAB tape are generally 0.002 inch wide (0.05 millimeters). The greater bonding area of the ends 166' of the truncated interconnection paths 160' greatly facilitates the wire bonding operation. The bonding wires 920 are selected so as to be compatible with the TAB interconnection paths 160'. For example, if the TAB interconnection paths 160' are plated with gold, the bonding wires 920 should also be made of gold. Other metals can be employed such as tin plating for the interconnection paths of the TAB tape 140' in connection with aluminum bonding wires.

The perimeter of the top surface cavity 906 is selected to be greater than the perimeter of the die 100' so as to define a channel 922 between the die 100' and the walls 908 of the top surface cavity 906. The bonding wires 920 are therefore bonded between the ends 166' of the truncated interconnection paths 160', which will also hereinafter be referred to as the terminal connectors 166' of the TAB tape 140' and the bonding pads 120' of the die 100' with air being the sole surrounding medium.

The connection between a terminal connector 166' of the TAB tape 140' and a bonding pad 120' of the die 100', hereinafter referred to as a lead-to-lead connection, is characterized by a resistance and a capacitance. In order to minimize the electrical energy consumed in the connections, it is advantageous to reduce the power consumed by capacitances and resistances. In this embodiment of the present invention, the use of air as medium in a capacitance is very advantageous as it greatly decreases the capacitance of the lead-to-lead connection. In the previous embodiments, the lead-to-lead connection is accomplished on the surface of the insulating plate 180', which, as discussed before, preferably comprises sapphire. It is known that the relative permittivity of sapphire is approximately ten times the permittivity of air. By using air as a medium around the lead-to-lead connection, the capacitance of the lead-to-lead connection is approximately reduced by a factor of 10. This improvement in the lead-to-lead connection enables faster signal transmission and a reduction of the power consumption in the order of 20 percent.

FIG. 43 illustrates a cross-sectional representation of the preferred embodiment of the present invention and shows a stack 926 of integrated circuit die assemblies each comprising an insulating plate 900 having a top surface cavity 906, such as was discussed above. A plurality of sandwiches 928 are stacked together to form the stack 926 of integrated circuit dies. The above mentioned alignment features such as the sprocket holes 150' permit accurate stacking of the die sandwiches 928. It is preferable that, in each sandwich 928, the die 100' does not protrude from the top surface cavity 906 as the stacking of these protruding elements would be made very difficult. This problem is reduced in the present invention by providing a cavity 932 in the bottom surface 904 of the insulating plates 900. Preferably, the cavity 932 in the bottom surface 904 of each insulating plate 900 is coaxial with the top surface cavity 906 of the sandwich 928 below it. This bottom surface cavity 932 is dimensioned to substantially overlap the top surface cavity 906 of the adjacent integrated circuit element. Preferably, the bottom surface cavity 932 encompasses the lead-to-lead connection region of the adjacent die assembly and thereby increases the air gap around the lead-to-lead connection. This again reduces the capacitance of the lead-to-lead connection.

Preferably, at least one first vent hole 934 is provided in the insulating plate 900 within the outer periphery 935 of the top surface cavity 906 and proximate thereto. More preferably, a second vent hole 936 is also provided. The first and second vent holes 934 and 936 are pierced through the insulating plate 900 at locations diametrically opposed to one another with respect to the central longitudinal axis 938 of the front cavity 906. These vent holes 934, 936 allow air to communicate between the front cavity 906 and the bottom surface 904 of the insulating plate 900. If the bottom surface 904 of the insulating plate 900 includes a bottom surface cavity 932, the vent holes 934, 936 allow passage of air between the two cavities 906 and 932. The specific function of the vent holes 934, 936 will be described in more detail in connection with the description of a preferred alternative method for assembling the stack 926 of die sandwiches.

Although air has been used in this embodiment to reduce the capacitance of the lead-to-lead connection, it should be appreciated by the skilled person that any other medium with low permittivity can be used. In particular, vacuum can be ideal to substantially decrease the capacitance of the lead-to-lead connection. Another advantage of this embodiment resides in the exposure of the active side of the die 100' in each sandwich 928, namely the side of the die 100' comprising the bonding pads 120'. This arrangement can be advantageous in certain applications wherein the active side of the die needs to be further treated or processed. For example, a sandwich 928 may advantageously include a ultra-violet erasable EPROM which requires exposure to light in order to erase the contents of the EPROM. Such a sandwich 928 can be advantageously positioned near the top of the stack 926 so that the cover of the stack 926 can be removed to expose the EPROM to light.

As one skilled in the art will recognize, certain semiconductor integrated circuit dies require an electrical connection to the bottom side of the die. For example, the bottom side of the die may comprise a substrate connection requiring a bias voltage in order to operate the integrated circuit. Referring now to FIG. 44, there is illustrated another embodiment of the preferred invention for providing an electrical interconnection to the bottom side of an integrated circuit die 100''. The embodiment of FIG. 44 utilizes the insulating plate 900 provided with a the top surface cavity 906. In this embodiment analogous to the embodiment shown in FIGS. 41 to 43, the die 100'' is mounted onto the cavity 906 with its bonding pads 120'' (not shown) facing upward as discussed above. The bonding pads 120'' are advantageously connected to the TAP tape 140'' using the wire bonding method just described or one of the other previously described methods. Rather than terminating all the TAB tape leads outside the perimeter of the top surface cavity 906, as before, at least one of the TAB leads, an extended lead 940, extends over the top surface cavity 906 and is gently bent downward into the top surface cavity 906, as illustrated. The extended lead 940 is preferably electrically bonded to the bottom surface 910 of the top surface cavity 906 by a suitable adhesive, or the like. After the extended TAB tape lead 940 has been bonded to the bottom surface 910 of the top surface cavity 906, the die 100'' is positioned in the top surface cavity 906 and mechanically secured therein so that the bottom surface of the die 100'' is electrically interconnected to the extended TAB tape lead 940. Thereafter, the bonding pads (not shown) are electrically connected to the other TAB tape leads (not shown) by wire bonding as disclosed in FIGS. 41 to 43 or by other suitable means. A second extended lead 946 can be advantageously included to further interconnect the bottom of the integrated circuit die 100'' with the TAB tape 140''.

An alternative embodiment of this feature includes a layer of conductive material (not shown) that is placed in the bottom surface 910 of the top surface cavity 906 and on the walls 908 of the top surface cavity 906 so as to connect the electrically conductive bottom of the integrated circuit die 100'' with the terminal connectors 166'' of the TAB tape 140''. This conductive layer preferably comprises cermet. It can also be a metallic material selectively sputtered onto the bottom surface 910 and the walls 908 of the top surface cavity 906 to form an electrical conductor. As set forth above, this embodiment is particularly advantageous for dies that require electrical connection through the back surface thereof in a stacked chip assembly.

Although the foregoing embodiments utilizing an insulating plate are extremely advantageous when constructed with TAB tape, it should be understood by the skilled person that other interconnecting patterns can be satisfactorily employed. In particular, the interconnecting pattern can be simply sputtered on the insulating plate 900. The interconnecting fingers 166 provided by the TAB tape can also be formed by lithographic etchings of an electrically conductive surface on an insulating substrate. Alternatively, a "frit", preferably made of a mixture of gold and ceramic, can be screened on a 96% alumina insulating substrate and fired according to the well-known cermet process. When such interconnection patterns are used for connecting the bonding pads 120 of the die 100, the positioning of the die assembly during the stacking of each layer can be determined by alignment features such as the holes 911 in the insulating plate.

Description of a VACUUM Assembly Method

Referring now to FIG. 45, an alternative method of assembly has been found to be particularly advantageous. According to this method, a plurality of sandwiches 950, constructed in accordance with one of the above-described embodiments, are stacked together to form a stack 952 of integrated circuits. Although similar to the construction method described above in connection with FIG. 16, the present construction method is performed in a vacuum. As discussed above, a layer of bonding material is preferably placed on the bottom surface of each sandwich 950, for example on the insulating plate of each sandwich 950. In order to construct the system of the present invention, the sandwiches 950 are stacked on the top of one another on an alignment fixture 954 having a base plate 956 and a set of alignment rods 958. In the preferred embodiment, the TAB tape 140 is used as before and the sprocket holes 150 enable accurate positioning of the sandwiches 950. When the sandwiches 950 are positioned on the alignment rods 958, no pressure is applied initially to force the sandwiches 958 together. Preferably, the alignment rods 958 are tight fitting with respect to the sprocket holes 150 and engage the sprocket holes 150 of the individual sandwich layers 950. The tight fit of the alignment rods 958 prevents the weight of the sandwiches 950 from forcing the layers together prematurely. After all the sandwiches 950 have been placed on the alignment fixture 954, a cover plate 960 is placed on the top surface of the uppermost sandwich 950 and also aligned using the alignment rods 958. The cover plate 960 is secured to a pair of compression rods 962 which pass through the base plate 956. The entire assembly is securely clamped between the cover plate 960 and the base plate 956 of the alignment fixture 954 by means of a compression member (not shown) below the base plate 956. For example, the compression member may advantageously be a handle to exert a downward force on the compression rods 962 and thus on the cover plate 960, or, as an alternative, may be an electrically driven device for pulling on the compression rods 962. As the compression rods 962 pass through the base plate 956 of the alignment fixture 954, sealing rings (not shown) are preferably used to provide a gas-tight seal around the compression rods 962. After the sandwiches 952 have been positioned in place on the alignment fixture 954, an outside cover 964 is positioned on the base plate 956 to encase the entire stack assembly 952 including the compression rods 962 and cover plate 960.

The outside cover 964 is sealed to the base plate 954 by conventional means. The base plate 954 is connected to a vacuum source 966 (e.g., a vacuum pump, or the like) by means of a transfer pipe 968. Air is thus removed from the inside of the outside cover 964 to remove any gasses trapped in the bonding material between the sandwiches 950. Each of the sandwiches 950 advantageously includes the vent holes 934 and 936 described above in connection with FIGS. 41 to 44, so that the gas can be more readily removed from the inner portions of each sandwich 950. After the vacuum is drawn and while it is maintained, the clamping operation is initiated by pulling on the handle (not shown) or operating the electrical motor (not shown). The compression rods 962 are thus operated so as to clamp the entire assembly between the cover plate 960 and the base plate 956. The pressure exerted between the cover plate 960 and the base plate 956 forces the sandwiches 950 together and causes the bonding material to be tightly compressed with few, if any, voids therein that would have been caused by trapped air bubbles. After the clamping operation has been performed, air is re-admitted to break the vacuum and the outside cover 964 is removed and the stack assembly 952 is placed in an oven, for example, to cure the bonding material while holding the sandwiches in their compressed positions. Alternatively, an ultraviolet-curing adhesive can be exposed to ultraviolet light to cure it.

The elimination of air bubbles that may remain trapped in the epoxy between the TAB interconnection paths 160 is particularly advantageous with respect to the groove and fill interconnection method described above. These air bubbles create voids between the interconnection leads 160. When the electrically conductive adhesive is applied during the groove and fill operation, the adhesive may enter one of the voids and provide an undesirable electrical interconnection between a pair of interconnection leads 160.

In a stack of layers comprising an insulating plate with a cavity as described in connection with FIGS. 41 to 44, the pressure differential between the top surface cavities 906 at the ambient atmosphere and the vacuum in the clamping fixture 950 during the depressurization step may be detrimental to the die sandwiches 950. Furthermore, when the stack 952 is re-pressurized at the ambient atmosphere, the pressure differential may affect the stack assembly 952 adversely and create a suction effect towards the top surface cavities 906. The bonding adhesive may thus be pushed out of the interface between two adjacent layers into the most proximate top surface cavity 906 and bottom surface cavity 932. As set forth above, the vent holes 934, 936, as shown in FIGS. 41 to 44, allow the outside and the inside pressure to equalize as the vacuum is applied and released.

Description of a Thermally Conductive Top Layer

Returning again to FIG. 38, an additional feature of the present invention is illustrated therein. In this stack assembly, the case 840 houses the entire stack assembly 700 and is sealed to the interconnect plate 826. The case 840 is preferably made of a highly thermally conductive material so as to serve as heat sink to the stack assembly 700. The heat generated by the stack assembly 700 is mostly transferred by conduction through the top end of the case 840. Thus, it is desirable to have a highly thermally conductive path between the stack assembly 700 and the top of the case 840. However, the coefficient of thermal expansion of the stack case 840 is substantially greater than the average coefficient of thermal expansion of the stack assembly 700. Thus, there will be a differential temperature expansion between the case 840 on the one hand and the stack 700 on the other hand which may subject the stack 700 to a stress that may damage it. The stack 700 is essentially made of ceramic and is therefore more fragile than the case 840. It is thus advantageous to interpose between the uppermost layer of the stack 700 and the top of the case 840 a layer 980 of a thermally conductive resilient material susceptible to absorb the stress caused by the different expansion coefficients. This layer 980 is preferably made of silicon rubber, or the like, having highly thermally conductive silver particles, or the like, embedded therein. The layer 980 preferably is in the form of a rubber pad placed inside the case 840 before positioning and sealing the case 840 over the stack assembly 700. Ideally, the rubber pad 980 is compressed by the case 840 during the mounting of the case 840 on the stack assembly 700 at room temperature so as to provide good mechanical contact during normal ambient temperatures. When heat is generated by the stack assembly 700 or generated or removed by an external source, the heat is transferred between the stack assembly 700 and the case 840. The stack assembly 700 will expand or contract at a different rate than the case 840, thereby causing the rubber pad 980 to expand or contract to compensate for the differential expansion of the two types of material (i.e., the ceramic of the stack 700 and the material of the case 840). The dimensions of the rubber pad 968 are selected so that when the case 840 and the base block 330 are fully expanded under rated conditions of operation, the stack assembly 700 remains snugly engaged within the case 840. The rubber pad 980 is also represented in FIG. 35.

Description of an Alternative STITCH Bonded System

Figure 46:
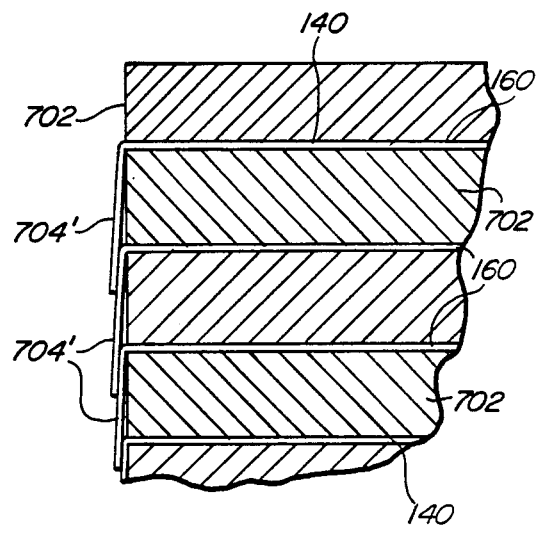
FIG. 46 is a cross-sectional view illustrating an alternative preferred embodiment of the present invention utilizing extensions of the exposed ends for interconnecting the sandwiches of the stack with one another.

FIG. 46 illustrates another preferred embodiment of the stack assembly of the present invention, disclosing another technique for interconnecting the exposed ends 704' of the interconnection leads 160 between the different sandwich layers 702 of the stack 700. In this embodiment, the sandwiches 702 are placed in position using the alignment fixture 344 of FIG. 16 or the alignment fixture 954 of FIG. 45. However, after the layers 702 are bonded, the TAB tape 140 is not trimmed to the surface of the stack as before. Rather, the protruding ends 704' of the TAB tape is removed at a distance slightly greater than the thickness of a sandwich 702. Thus, the outer periphery of the stack 700 comprises a plurality of ends 704' which extend from the periphery of the stack 700. The exposed ends 704, are subsequently bent perpendicular to the radial projection of the ends 704' and are preferably bent towards the base of the stack so as to overlap with the exposed end of 704' of the next lowermost layer. The overlapping ends are bonded together by means of conventional methods For example, they can be ultrasonically bonded together or thermo-compressed.

This method of interconnecting the exposed ends does not require close trimming of the protruding TAB tape portions nor does it require the polishing of the sides of the stack 700. Moreover, the interconnections between the exposed ends have a large cross-section and thus a low electrical resistance. The repair of interconnections in accordance with this embodiment is readily accomplished.

Application of the Present Invention to Superconductors

Although described above in connection with conventional TAB tape materials, it should be understood that the present invention can be constructed with TAB tapes comprising superconducting materials. For example, the TAB tape interconnection pattern can advantageously comprise Niobium metal or another suitable superconductor material. Alternatively, the TAB tape interconnection pattern can comprise a conventional metallic conductor, such as copper, with a layer of superconductive film applied thereto. For example, a layer of ittrium copper oxide can be applied to the copper conductors of the TAB tape interconnection pattern. Such superconductive interconnections are advantageously used with integrated circuits that are constructed in accordance with superconductive techniques.

Use of Metallic Plates with the Present Invention

Although the sandwich layers were described above in the preferred embodiments as being insulating plates such as sapphire, ceramic, or the like, the insulating plates can also be constructed using metallic plates coated with an insulating material. Anodized aluminum plates or copper plates coated with a polyimide coating (e.g., Parylene) can be used. Metallic plates are better heat conductors and in some applications are easier to manufacture and are more economical. They are furthermore particularly advantageous when coining (forming using a die press) the plates is used for mass production.

Description of an Extended Input/Output Plate

Reference is now made to FIGS. 47 and 48 which illustrate an alternative method for interconnecting the stack of integrated circuits to an external circuitry. In the embodiment illustrated in FIG. 47, a stack 1000 of sandwiches 1002 is positioned on a base plate 1004 and is bonded thereto. In this embodiment, the stack 1000 preferably comprises a plurality of sandwiches 1002, each having a square configuration, but other shapes (e.g., rectangular and circular) can also be used. The base plate 1004 is mounted to the bottom of the stack 1000 as if it were an additional sandwich. As illustrated, the base plate 1004 has a first edge 1010, a second edge 1012, a third edge 1014 and a fourth edge 1016. The base plate 1004 has a length defined between the first edge 1010 and the second edge 1012 that is longer than the corresponding dimension of the stack 1000 so that an extended portion 1020 of the base plate 1004 is thus defined. The base plate 1004 has a width defined between the third edge 1014 and the fourth edge 1016 that is less than the length of the base plate 1004. As illustrated, the width of the base plate 1004 is advantageously wider than the corresponding width of the stack 1000. This additional width provides additional area for the electrical interconnections described below. The first edge 1010 of the base plate 1004 is coplanar with one side 1022 of the stack 1000.

The base plate 1004 has a top side 1030 and a bottom side 1031 (FIG. 48) on which are provided a plurality of electrically conductive paths 1032 that extend from the second edge 1012 of the base plate 1004 generally toward the first edge 1010 of the base plate. The electrically conductive paths 1032 can be formed on the top and bottom sides of the base plate 1004 in a conventional manner. For example, in a preferred embodiment, the base plate 1004 is a multi-layer ceramic circuit board with the conductive wiring formed thereon in a known manner. At the second edge 1012 of the base plate 1004, the electrically conductive paths 1032 are terminated in a plurality of interconnection fingers 1036 that are positioned with respect to each other to match the spacing of the interconnection leads in a conventional card edge connector 1040. The card edge connector 1040 is in turn mounted on a printed circuit board 1042, or the like. For example, the printed circuit board 1042 may advantageously be the mother board of a computer. When the second edge 1012 of the base plate 1004 is engaged with the card edge connector 1040, electrical connections are thus provided from the printed circuit board to the interconnection paths 1032 on the top and bottom surfaces of the base plate 1004.

In the preferred embodiment illustrated in FIG. 47, interconnection paths 1032 on the base plate 1004 are electrically interconnected with the sandwiches 1002 of the stack 1000 via the first edge 1010. As illustrated, the interconnection paths 1032 extend towards the first edge 1010 and are terminated at the first edge 1010. The ends of the interconnection paths 1032 are interconnected to the exposed ends 1044 of the sandwiches 1002 using one of the previously described interconnection methods. For example, in the preferred embodiment, the groove and fill interconnect method is used. The grooves are formed after the base plate 1004 is bonded to the stack 1000 and the grooves extend through the ends of the interconnection paths 1032. Thus, when the electrically conductive adhesive, for example, is applied to the grooves, the ends of the interconnection paths 1032 are electrically connected to the ends of the interconnection leads of the sandwiches 1002 via a plurality of interconnection paths 1050 thus formed on the side 1022 of the stack 1000.

The extended portion 1020 of the base plate 1004 can also be used as a means for mounting additional components such as capacitors, resistors or integrated circuits. For example, it is advantageous in some applications to have decoupling capacitors and the like close to the integrated circuits. The techniques used for mounting such additional components are known to the art.

Also represented in FIG. 47 is a heat sink 1060 which is positioned on the top surface 1062 of the stack 1000. The heat sink 1060 comprises a first section 1064 that is bonded to the top surface 1062 of the stack 1000. It also comprises a plurality of fins 1066 that extend longitudinally from the first section 1064. The fins have a large exposure area in order to facilitate the exchange of heat between the fins and the outside. The heat sink is made of thermally conductive material.

Various embodiments of the present invention have been described above. Although the invention has been described with reference to these specific embodiments, the descriptions are intended to be illustrative of the invention and are not intended to be limiting. Various modifications and applications may occur to those skilled in the art without departing from the true spirit and scope of the invention as defined in the appended claims.

What is claimed is:

1. An apparatus for interconnecting a plurality of electrical circuits in a stack having a top surface and a bottom surface, said stack comprising:
    a plurality of sandwiched structures, each sandwiched structure comprising:
    an electrical circuit having a plurality of electrical interconnections on at least a first surface of a substrate, said electrical circuit constrained to an area having an outer periphery;
    a first set of electrical conductors, said first set of electrical conductors electrically connected to said electrical circuit on said first surface of said substrate; and
    a first electrically insulating plate adhesively bonded to said electrical circuit, said first electrical insulating plate having a planar surface and an edge, said edge forming an outer periphery of said first insulating plate with dimensions selected so that said outer periphery of said first electrically insulating plate extends beyond the outer periphery of said area in which said electrical circuit is located, and so that exposed portions of a plurality of conductors of said first set of electrical conductors extends beyond the outer periphery of said first electrically insulating plate, said plurality of sandwiched structures positioned with respect to each other in said stack so that said planar surfaces of said first insulating plates are substantially parallel, with at least one edge of each of said first insulating plates aligned to form a common outer surface of said stack, said plurality of sandwiched structures further oriented so that the first surfaces of the substrates of at least two of said sandwiched structures face in the same direction; and
    a second set of electrical conductors formed on said common outer surface of said stack that electrically interconnects the exposed portions of a plurality of conductors of said first set of electrical conductors of one of said sandwiched structures with exposed portions of a plurality of conductors of said first set of electrical conductors of others of said sandwiched structures, said second set of electrical conductors comprising a plurality of grooves formed in at least a portion of said common outer surface of said stack, said grooves intersecting said exposed portions of said plurality of said sandwiched structures, said grooves comprising a layer of conductive material for selectively electrically interconnecting said exposed portions of said first plurality of said sandwiched structures.

2. The apparatus as defined in claim 1, wherein said layer of conductive material comprises an electrically conductive adhesive in said grooves.

3. The apparatus as defined in claim 1, wherein said layer of conductive material comprises an electrically conductive metal in said grooves.

4. The apparatus as defined in claim 1, wherein said plurality of grooves include a layer of nonconductive material for selectively insulating said exposed portions of selected ones of said plurality of said sandwiched structures.

5. The apparatus as defined in claim 4, wherein said nonconductive material comprises an epoxy.

6. An apparatus for interconnecting a plurality of electrical circuits in a stack having a top surface and a bottom surface, said stack comprising:
    a plurality of sandwiched structures, each sandwiched structure comprising:
    an electrical circuit having a plurality of electrical interconnections on at least a first surface of a substrate, said electrical circuit constrained to an area having an outer periphery;

a first set of electrical conductors, said first set of electrical conductors electrically connected to said electrical circuit on said first surface of said substrate; and a first electrically insulating plate adhesively bonded to said electrical circuit, said first electrical insulating plate having a planar surface and an edge, said edge forming an outer periphery of said first insulating plate with dimensions selected so that said outer periphery of said first electrically insulating plate extends beyond the outer periphery of said area in which said electrical circuit is located, and so that exposed portions of a plurality of conductors of said first set of electrical conductors extends beyond the outer periphery of said first electrically insulating plate, said plurality of sandwiched structures positioned with respect to each other in said stack so that said planar surfaces of said first insulating plates are substantially parallel, with at least one edge of each of said first insulating plates aligned to form a common outer surface of said stack, said plurality of sandwiched structures further oriented so that the first surfaces of the substrates of at least two of said sandwiched structures face in the same direction; and a second set of electrical conductors formed on said common outer surface of said stack that electrically interconnects the exposed portions of a plurality of conductors of said first set of electrical conductors of one of said sandwiched structures with exposed portions of a plurality of conductors of said first set of electrical conductors of others of said sandwiched structures, said exposed portions interconnected by said second set of electrical conductors comprising terminal conductors for interconnection with a connector of an external circuit; and a third set of electrical conductors for electrically interconnecting said terminal conductors with said connector of said external circuitry.

7. The apparatus as defined in claim 6, wherein said third set of electrical conductors comprises a plurality of wires, said wires being bonded to said terminal conductors and said connector of said external circuitry.

8. The apparatus as defined in claim 6, wherein said third plurality of electrical conductors are formed as a pattern on a frame of a TAB tape portion.

9. The apparatus as defined in claim 8, wherein said TAB tape portion comprises a proximal region and a distal region, said proximal region comprising a fourth plurality of electrical conductors and said distal region comprising a fifth plurality of electrical conductors, said fourth and said fifth pluralities of electrical conductors being interconnected on said TAB tape portion, said proximal region being positioned proximate to the bottom surface of said stack so that said fourth plurality of electrical conductors are in electrical contact with said terminal conductors, said fifth plurality of electrical conductors of said distal region further being in electrical contact with said connector of said external circuitry.

10. The apparatus as defined in claim 9, further comprising a third insulating plate having an aperture therein, said aperture having at least an inner edge, said third insulating plate being positioned on said bottom surface of said stack so that said fourth plurality of electrical conductors are positioned between said bottom surface of said stack and said third insulating plate, said distal region being substantially folded around said at least inner edge of said aperture so that said fifth plurality of electrical conductors extend outwardly from said aperture.

11. The apparatus as defined in claim 10, further comprising a fourth insulating plate interposed between said bottom surface of said stack and said third insulating plate so that said fourth plurality of electrical conductors are positioned between said fourth insulating plate and said third insulating plate.

12. The apparatus as defined in claim 9, further comprising a removable pressure plate for establishing electrical connection between said fifth plurality of electrical conductors of said distal region and said connector of said external circuitry.

13. The apparatus as defined in claim 9, further comprising an interconnect plate having electrical conductors that interconnect said fifth plurality of electrical conductors of said distal region with said connector of said external circuitry.

14. The apparatus as defined in claim 1, wherein at least one of said sandwiched structures comprises a plurality of integrated circuit dies.

15. The apparatus as defined in claim 14, wherein said first plurality of electrical conductors in said sandwiched structure are formed as a pattern on a frame of tape automatic bonding (TAB) film, said TAB film being bonded to said plurality of integrated circuit dies.

16. The apparatus as defined in claim 1, further comprising a housing for encasing said stack.

17. The apparatus as defined in claim 16, wherein said housing is made of thermally conductive material.

18. The apparatus as defined in claim 16, wherein said housing comprises a member made of thermally conductive material for compensating for the thermal expansion differential between said housing and said stack, said member being interposed between said housing and said stack.

19. An apparatus for interconnecting a plurality of electrical circuits in a stack having a top surface and a bottom surface, said stack comprising:

a plurality of sandwiched structures, each sandwiched structure comprising:

an electrical circuit having a plurality of electrical interconnections on at least a first surface of a substrate, said electrical circuit constrained to an area having an outer periphery;

a first set of electrical conductors, said first set of electrical conductors electrically connected to said electrical circuit on said first surface of said substrate; and a first electrically insulating plate adhesively bonded to said electrical circuit, said first electrical insulating plate having a planar surface and an edge, said edge forming an outer periphery of said first insulating plate with dimensions selected so that said outer periphery of said first electrically insulating plate extends beyond the outer periphery of said area in which said electrical circuit is located, and so that exposed portions of a plurality of conductors of said first set of electrical conductors extends beyond the outer periphery of said first electrically insulating plate, said plurality of sandwiched structures positioned with respect to each other in said stack so that said planar surfaces of said first insulating plates are substantially parallel, with at least one edge of each of said first insulating plates aligned to form a common outer surface of said stack, said plurality of sandwiched structures further oriented so that the first surfaces of the substrates of at least two of said sandwiched structures face in the same direction; and a second set of electrical conductors formed on said common outer surface of said stack that electrically interconnects the exposed portions of a plurality of conductors of said first set of electrical conductors of one of said sandwiched structures with exposed portions of a plurality of conductors of said first set of electrical conductors of others of said sandwiched structures, said second set of electrical conductors comprising the extremities of said exposed portions of said first set of electrical conductors, said extremities extending outwardly from and beyond at least a portion of said common outer surface of said stack so that said extremities for one of said stacked sandwiched structures can be bent so as to overlap the extremities of an adjacent stacked sandwich structure in said stack, whereby said overlapped extremities establish an electrical connection between said one of said sandwiched structures and said adjacent stacked sandwich structure.

20. The apparatus as defined in claim 1, wherein said first set of electrical conductors of said each sandwich structure is formed as a radial pattern of metallic leads on said first insulating plate.

21. An apparatus for interconnecting a plurality of electrical circuits in a stack, having a top surface and a bottom surface, said stack comprising:
   a plurality of sandwiched structures, each sandwiched structure comprising:
   an electrical circuit having a plurality of electrical interconnections on at least a first surface of a substrate, said electrical circuit constrained to an area having an outer periphery;
   a first set of electrical conductors, said first set of electrical conductors electrically connected to said electrical circuit on said first surface of said substrate; and
   a first electrically insulating plate adhesively bonded to said electrical circuit, said first electrical insulating plate having a planar surface and an edge, said edge forming an outer periphery of said first insulating plate with dimensions selected so that said outer periphery of said first electrically insulating plate extends beyond the outer periphery of said area in which said electrical circuit is located, and so that exposed portions of a plurality of conductors of said first set of electrical conductors extends beyond the outer periphery of said first electrically insulating plate, said plurality of sandwiched structures positioned with respect to each other in said stack so that said planar surfaces of said first insulating plates are substantially parallel, with at least one edge of each of said first insulating plates aligned to form a common outer surface of said stack, said plurality of sandwiched structures further oriented so that the first surfaces of the substrates of at least two of said sandwiched structures face in the same direction; and
   a second set of electrical conductors formed on said common outer surface of said stack that electrically interconnects the exposed portions of a plurality of conductors of said first set of electrical conductors of one of said sandwiched structures with exposed portions of a plurality of conductors of said first set of electrical conductors of others of said sandwiched structures; and
   an extension plate secured to the bottom surface of said stack, said extension plate being dimensioned so as to cover said bottom surface of said stack and to extend outwardly from said stack transversely thereto, said extension plate electrically interconnecting said second set of electrical conductors with a connector of an external circuitry.

22. The apparatus as defined in claim 21, wherein at least a portion of said common outer surface of said stack comprises a plurality of grooves filled with conductive material for connecting said second plurality of electrical conductors with said extension plate.

23. The apparatus as defined in claim 1, wherein at least one of said bottom surface and said top surface of said stack comprises an air passage for allowing communication of air between the stack and the outside.

24. The apparatus as defined in claim 1, further comprising a heat sink mechanically coupled to at least one of said top and bottom surfaces of said stack.

25. The apparatus as defined in claim 24, wherein said heat sink comprises a fifth plate having a plurality of fins and made of thermally conductive material, said fifth plate being mounted on said top surface of said stack.

26. An apparatus for packaging integrated circuits, comprising:
   an integrated circuit die having a plurality of bonding pads on a first die surface thereof;
   a first plurality of electrical conductors electrically bonded to said bonding pads of said integrated circuit die, said first plurality of electrical conductors comprising the electrical conductors of a frame of tape automated bonding (TAB) tape; and
   a metal plate coated with insulating material, and having a first plate surface and a second plate surface, each said surface having an outer periphery, said outer periphery of each said surface encompassing an area greater than the size of said integrated circuit die so that said integrated circuit die does not extend to said outer periphery, said first plate surface positioned proximate to said first die surface of said integrated circuit die so that said first plurality of electrical conductors are disposed between said first die surface and said plate, said first plurality of electrical conductors having lengths selected so that said first plurality of electrical conductors extend to said outer periphery of said first plate surface with at least a portion of each of said first plurality of electrical conductors exposed at said outer periphery of said first plate surface, said plate adhesively bonded to said first die surface and said first plurality of electrical conductors.

27. The apparatus as defined in claim 26, wherein said insulating material is made of polyimide and wherein said metal plate is made of copper or anodized aluminum.

28. The apparatus as defined in claim 26, wherein said plate has a first cavity formed in the first plate surface thereof, said first cavity having a bottom surface and at least one side, said integrated die being positioned within said first cavity of said plate.

29. The apparatus as defined in claim 28, wherein the perimeter of said first cavity is greater than the perimeter of said integrated circuit die, whereby said circuit die defines a channel along said at least one side of said first cavity, said channel comprising a non-conductive medium.

30. The apparatus as defined in claim 29, wherein said first plurality of electrical conductors span said channel and are bonded to said plurality of bonding pads.

31. The apparatus as defined in claim 28, wherein at least one of said first plurality of electrical conductors extends into said cavity and is electrically connected to the bottom surface of said die.

32. The apparatus as defined in claim 28, further comprising a second plurality of electrical conductors for electrically connecting said plurality of bonding pads and said first plurality of electrical conductors.

33. The apparatus as defined in claim 28, wherein said second plurality of electrical conductors comprise wires bridging over said channel.

34. The apparatus as defined in claim 33, wherein said medium has a low permittivity, whereby the capacitance of said lead-to-lead connection between said first plurality of electrical conductors and said plurality of bonding pads in conjunction with said medium is reduced.

35. The apparatus as defined in claim 28, wherein said first plate further comprises a second cavity formed in the second plate surface thereof, said second cavity being substantially centrally positioned with respect to said first plate and coaxial with said first cavity.

36. The apparatus as defined in claim 28, wherein said plate comprises at least one vent hole transversely to said plate for connecting said bottom surface of said first cavity and said second plate surface.

37. An apparatus for packaging integrated circuits, comprising:
    an integrated circuit die having a plurality of bonding pads on a first die surface thereof;
    a plurality of electrical conductors electrically bonded to said bonding pads of said integrated circuit die, said plurality of electrical conductors comprising the electrical conductors of a frame of tape automated bonding (TAB) tape, said TAB tape comprising a plurality of layers, each layer comprising a portion of said plurality of electrical conductors; and
    a plate of thermally conductive, electrically insulating material having a first plate surface and a second plate surface, each said surface having an outer periphery, said outer periphery of each said surface encompassing an area greater than the size of said integrated circuit die so that said integrated circuit die does not extend to said outer periphery, said first plate surface positioned proximate to said first die surface of said integrated circuit die so that said plurality of electrical conductors are disposed between said first die surface and said plate, said plurality of electrical conductors having lengths selected so that said plurality of electrical conductors extend to said outer periphery of said first plate surface with at least a portion of each of said electrical conductors exposed at said outer periphery of said first plate surface, said plate adhesively bonded to said first die surface and said electrical conductors.

38. An apparatus for packaging integrated circuits dies, each integrated circuit die having a plurality of bonding pads on a first die surface thereof, comprising:
    a first plurality of electrical conductors electrically connected to said bonding pads of said integrated circuit die so as to form a lead-to-lead connection, said first plurality of electrical conductors comprising a plurality of ceramic conductors; and
    a first plate of electrically insulating material having a first plate surface and a second plate surface, each said surface having an outer periphery, said first plate surface positioned proximate to said first die surface of said integrated circuit die so that said first plurality of electrical conductors are disposed between said first die surface and said first plate surface, with at least a portion of each of said first plurality of electrical conductors exposed at said outer peripheries of said first and second plate surfaces, said ceramic conductors being securely positioned on said first plate.

39. An apparatus for packaging integrated circuits dies, each integrated circuit die having a plurality of bonding pads on a first die surface thereof, comprising:
    a first plurality of electrical conductors electrically connected to said bonding pads of said integrated circuit die so as to form a lead-to-lead connection, said first plurality of electrical conductors comprising a plurality of metallic conductors; and
    a first plate of electrically insulating material having a first plate surface and a second plate surface, each said surface having an outer periphery, said first plate surface positioned proximate to said first die surface of said integrated circuit die so that said first plurality of electrical conductors are disposed between said first die surface and said first plate surface, with at least a portion of each of said first plurality of electrical conductors exposed at said outer peripheries of said first and second plate surfaces, said metallic conductors being sputtered upon said first plate.

* * * * *